US012796527B2

(12) United States Patent
Chen et al.

(10) Patent No.: US 12,796,527 B2
(45) Date of Patent: Nov. 10, 2026

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Yu-Chang Chen, Kaohsiung (TW); Wei-Tung Chang, Kaohsiung (TW); Jen-Chieh Kao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 505 days.

(21) Appl. No.: 18/099,056

(22) Filed: Jan. 19, 2023

(65) Prior Publication Data

US 2024/0249988 A1 Jul. 25, 2024

(51) Int. Cl.

| | |
|---|---|
| ***H01L 23/31*** | (2006.01) |
| ***H10W 70/60*** | (2026.01) |
| ***H10W 70/65*** | (2026.01) |
| ***H10W 74/01*** | (2026.01) |
| ***H10W 74/10*** | (2026.01) |
| ***H10W 74/15*** | (2026.01) |
| ***H10W 90/00*** | (2026.01) |

(52) U.S. Cl.
CPC ........ *H10W 74/124* (2026.01); *H10W 70/611* (2026.01); *H10W 70/614* (2026.01); *H10W 70/65* (2026.01); *H10W 74/012* (2026.01); *H10W 74/019* (2026.01); *H10W 74/117* (2026.01); *H10W 74/15* (2026.01); *H10W 90/401* (2026.01)

(58) Field of Classification Search
CPC ............. H01L 23/5385; H01L 23/5389; H01L 25/0652; H01L 23/49827; H10W 74/124; H10W 70/611; H10W 70/614; H10W 70/65; H10W 74/012; H10W 74/019; H10W 74/117; H10W 74/15; H10W 90/401
See application file for complete search history.

(56) References Cited

U.S. PATENT DOCUMENTS

| | | | | |
|---|---|---|---|---|
| 7,528,007 | B2 * | 5/2009 | Fee | H10W 74/019 438/106 |
| 9,491,846 | B2 | 11/2016 | Ogawa et al. | |
| 9,527,723 | B2 * | 12/2016 | Lin | B81B 7/007 |
| 9,633,923 | B2 * | 4/2017 | Yoo | H10W 74/114 |
| 10,439,586 | B2 | 10/2019 | Yasuda | |
| 10,820,456 | B2 * | 10/2020 | Jung | H05K 3/28 |
| 11,164,754 | B2 * | 11/2021 | Tsai | H10W 70/093 |
| 11,337,346 | B2 | 5/2022 | Jung | |
| 11,605,877 | B2 * | 3/2023 | Hsieh | H01Q 1/2283 |

(Continued)

*Primary Examiner* — Jarrett J Stark
(74) *Attorney, Agent, or Firm* — Foley & Lardner LLP

(57) ABSTRACT

A semiconductor device package and a method of manufacturing the same are provided. The semiconductor device package includes a substrate, an electronic component, an intermediate structure and a protective layer. The electronic component is disposed over the substrate. The intermediate structure is disposed over the substrate and comprises an interposer and a conductive element on the interposer. The protective layer is disposed over the substrate and has an upper surface covering the electronic component and being substantially level with an upper surface of the conductive element.

20 Claims, 59 Drawing Sheets

(56) References Cited

U.S. PATENT DOCUMENTS

| | | | | |
|---|---|---|---|---|
| 11,769,712 | B2 * | 9/2023 | Lee | H10W 20/20 257/774 |
| 11,887,928 | B2 * | 1/2024 | Chang | H10P 72/74 |
| 2006/0063312 | A1 * | 3/2006 | Kurita | H10W 74/012 257/E23.129 |
| 2008/0142940 | A1 * | 6/2008 | Dunne | H10W 70/614 257/E21.001 |
| 2013/0127025 | A1 * | 5/2013 | Cho | H10W 42/20 257/E23.114 |
| 2013/0249101 | A1 * | 9/2013 | Lin | H10W 74/114 257/773 |
| 2013/0307140 | A1 * | 11/2013 | Huang | H10W 70/40 257/737 |
| 2013/0333934 | A1 * | 12/2013 | Hurwitz | H05K 3/4697 174/262 |
| 2014/0102772 | A1 * | 4/2014 | Chen | H05K 1/113 29/843 |
| 2014/0103527 | A1 * | 4/2014 | Marimuthu | H10W 70/635 257/737 |
| 2014/0133119 | A1 * | 5/2014 | Kariya | H05K 1/0298 361/767 |
| 2015/0325529 | A1 * | 11/2015 | Choi | H05K 1/181 257/723 |
| 2016/0233196 | A1 * | 8/2016 | Kim | H10W 74/117 |
| 2016/0240481 | A1 * | 8/2016 | Chen | H10W 70/614 |
| 2017/0178992 | A1 * | 6/2017 | Jeong | H10W 42/121 |
| 2018/0108542 | A1 * | 4/2018 | Pagaila | H10W 74/01 |
| 2019/0067104 | A1 * | 2/2019 | Huang | H10W 20/023 |
| 2019/0229046 | A1 * | 7/2019 | Tsai | H10P 72/74 |
| 2019/0380234 | A1 * | 12/2019 | Grober | H05K 13/0084 |
| 2020/0235453 | A1 * | 7/2020 | Lang | H05K 1/181 |
| 2022/0045008 | A1 * | 2/2022 | Kang | H10W 70/611 |
| 2022/0415810 | A1 * | 12/2022 | Hsieh | H10W 70/611 |
| 2023/0307380 | A1 * | 9/2023 | Lin | H10P 72/74 |
| 2023/0361060 | A1 * | 11/2023 | Lin | H10W 44/20 |
| 2023/0369188 | A1 * | 11/2023 | Hsieh | H10W 70/685 |
| 2024/0249988 | A1 * | 7/2024 | Chen | H10W 74/019 |

* cited by examiner

SEMICONDUCTOR DEVICE PACKAGE AND METHOD OF MANUFACTURING THE SAME

BACKGROUND

1. Field of the Disclosure

The instant disclosure relates to, amongst other things, a semiconductor device package and method of manufacturing the same, and a semiconductor device package having an intermediate structure.

2. Description of Related Art

Under the trend of miniaturization, in order to reduce the thickness of the semiconductor package, the mounting side of the semiconductor package can be thinned until the die disposed on the mounting side is exposed.

However, thinning the mounting side of the semiconductor package may lead to cracks or delamination between the die and mounding compound at the mounting side of the semiconductor package. Thus, it is an important issue to make a semiconductor with a certain thickness (about 100 um) have fine pitch I/O.

SUMMARY

According to one example embodiment of the instant disclosure, an electronic device includes a substrate, an electronic component, an intermediate structure and a protective layer. The electronic component is disposed over the substrate. The intermediate structure is disposed over the substrate and comprises an interposer and a conductive element on the interposer. The protective layer is disposed over the substrate and has an upper surface covering the electronic component and being substantially level with an upper surface of the conductive element.

According to another example embodiment of the instant disclosure, an electronic device includes a substrate, an electronic component, an interposer and a non-reflowable element. The electronic component and the interposer are disposed over the substrate. The non-reflowable element is disposed over the substrate. The non-reflowable element is configured to be electrically connected to the electronic component via the interposer and the substrate.

According to another example embodiment of the instant disclosure, an electronic device includes a substrate, an electronic device, a package layer and a plurality of I/O elements. The electronic device is disposed on a surface of the substrate. The package layer is disposed on the surface of the substrate and has an upper surface covering the electronic device. The I/O elements are exposed on the upper surface of the package layer and provided with a fine pitch arrangement.

In order to further understanding of the instant disclosure, the following embodiments are provided along with illustrations to facilitate appreciation of the instant disclosure; however, the appended drawings are merely provided for reference and illustration, and do not limit the scope of the instant disclosure.

DETAILED DESCRIPTION

Figure 1:
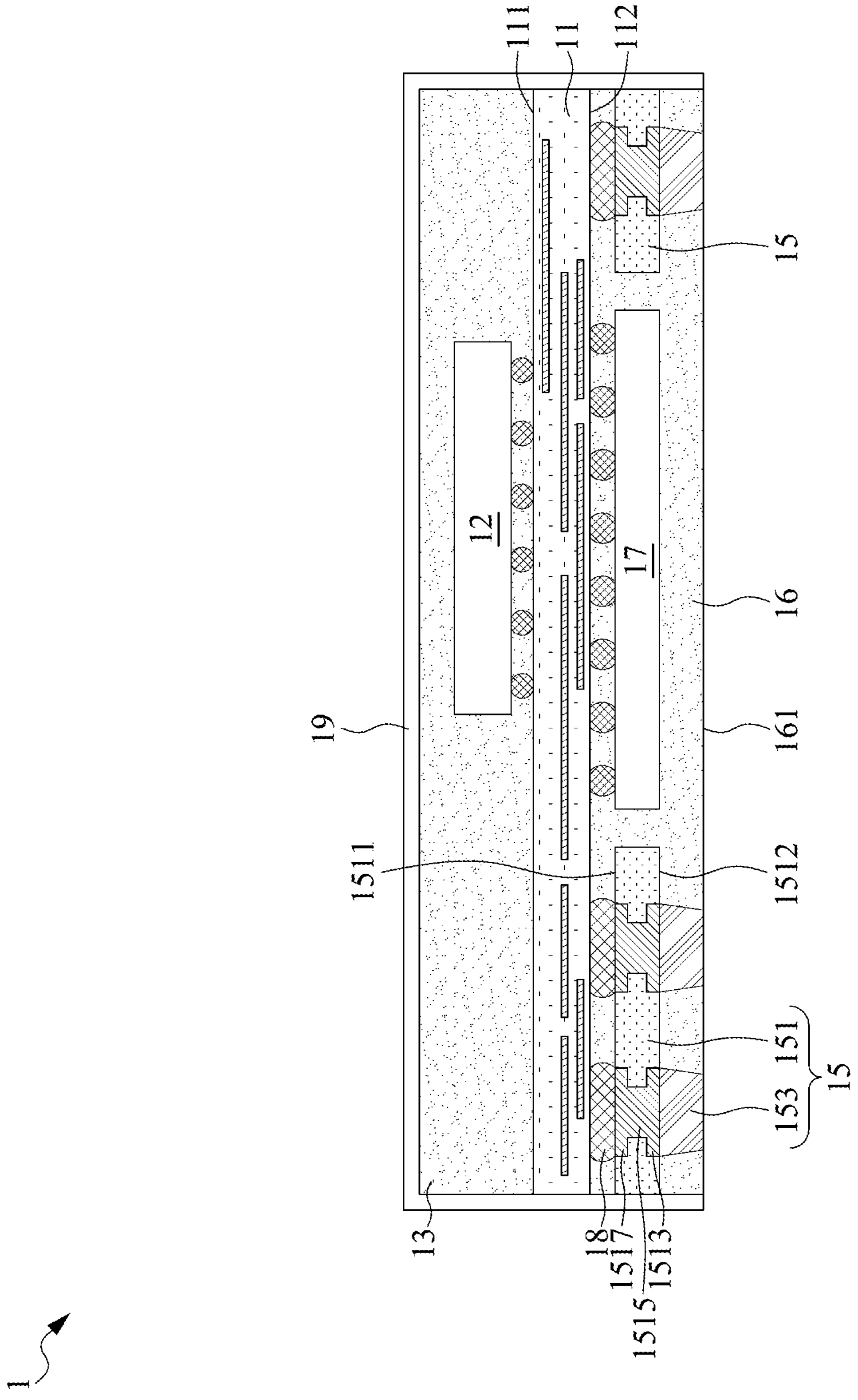
FIG. 1 is a cross-sectional view of a semiconductor device package in accordance with an embodiment of the instant disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath." "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Present disclosure provides a semiconductor device package with an intermediate structure. The intermediate structure may include an interposer and a plurality of pillars. Further, the pillars are configured to be Input/Output elements of the semiconductor device package. Thus, the semiconductor may have fine pitch I/O.

Moreover, the interposer may provide a thickness which could be replaced with a portion of the thickness of the pillars, and thus the technical problem of the limitation of the height of the pillar generated by plating could be solved. However, if all of the pillars are replaced with the interposer, multiple layers of the interposers would be required. In this way, the transmission of the RF signal will be lost due to the discontinuity of the multi-layer interposer.

In addition, the pillar of the semiconductor device package could solve the technical problem of the insufficient height of the solder ball. If the solder ball has a height as the pillar, the semiconductor device package cannot have fine pitch I/O and may have the bridge issue.

FIG. 1 is a cross-sectional view of a semiconductor device package 1 in accordance with some embodiments of the present disclosure. As shown in FIG. 1, the semiconductor device 1 includes a double side module (DSM). The semiconductor device 1 includes a carrier 11, electronic components 12, 17, intermediate structures 15 and encapsulants 13 and 16. In some embodiments of the present disclosure, the carrier 11 includes a substrate, which may be a core substrate or a core-less substrate and may include traces, pads or interconnections for electrical connection. Referring to FIG. 1, the carrier 11 has a surface 111 (e.g., an upper surface) and a surface 112 (e.g., a lower surface). The electronic component 12 may be disposed or mounted on the surface 111 of the carrier 11. The electronic component 12 may be a die, an active device, a passive device, and/or other electronic devices. In some embodiments of the present disclosure, the electronic component 12 electrically connects the carrier 11 via electrical connections. Further, the encapsulant 13 (i.e., a package body, a package layer, a protective layer) is disposed on the surface 111 of the carrier 11. The encapsulant 13 may cover the surface 111 of the carrier 11 and the electronic component 12 disposed on the surface 111 of the carrier 11. The encapsulant 13 may include molding compounds, such as a Novolac-based resin, an epoxy-based resin, a silicone-based resin, or other another suitable encapsulant; fillers such as silicon oxide fillers, may be included in the molding compound. In addition, the encapsulant 13 may include a molding underfill (MUF) or a capillary underfill (CUF).

As shown in FIG. 1, the electronic component 17 may be disposed or mounted on the surface 112 of the carrier 11. Moreover, the electronic component 17 may be an active component, such as an integrated circuit (IC) die or a chip. In some embodiments of the present disclosure, the electronic component 17 has an active side facing the surface 112 and electrically connects the main carrier 11 via electrical connections.

Further, the intermediate structure 15 may be disposed or mounted on the surface 112 of the carrier 11. The intermediate structure 15 may include an interposer 151 and at least one conductive element 153. The interposer 151 has a surface 1511 (e.g., an upper surface) and a surface 1512 (e.g., a lower surface). In some embodiments of the present disclosure, the interposer 151 includes a substrate with an interconnection. In some embodiments of the present disclosure, the interconnection has a conductive pad 1513 adjacent to the surface 1512 of the interposer 151, a conductive pad 1517 adjacent to the surface 1511 of the interposer 151 and an conductive via 1515 configured to electrically connect the conductive pad 1513 and the conductive pad 1517. The conductive element 153 may be disposed or mounted on the surface 1512 of the interposer 151. The conductive element 153 may be electrically connected to the conductive pad 1513. In some embodiments of the present disclosure, the conductive element 153 includes a pillar with non-reflowable material. In some embodiments of the present disclosure, the conductive element 153 includes a cupper (Cu) pillar.

In addition, a plurality of electrical connections 18 may be arranged between the surface 112 of the carrier 11 and the surface 1511 of the interposer 151 of the intermediate structure 15. In some embodiments of the present disclosure, the electrical connection 18 is connected to the conductive pad 1517 of the interposer 151. Thus, the intermediate structure 15 may be electrically to the carrier 11 through the electrical connections 18. In some embodiments of the present disclosure, the electrical connection 18 includes a reflowable material. In some embodiments of the present disclosure, the electrical connection 18 includes solder material. The electrical connection 18 may include a solder ball. In some embodiments of the present disclosure, the electrical connection 18 can be replaced with a conductive adhesive, such as an Ajinomoto buildup film (ABF).

The encapsulant 16 (i.e., a package body, a package layer, a protective layer) is disposed on the surface 112 of the carrier 11. The encapsulant 16 may cover the surface 112 of the carrier 11, the intermediate structure 15 and the electronic component 17 disposed on the surface 112 of the carrier 11. The encapsulant 16 may include molding compounds, such as a Novolac-based resin, an epoxy-based resin, a silicone-based resin, or other another suitable encapsulant; fillers such as silicon oxide fillers, may be included in the molding compound. In addition, the encapsulant 16 may include a molding underfill (MUF) or a capillary underfill (CUF). The encapsulant 16 has a surface 161 (e.g., a lower surface) facing away from the surface 112 of the carrier 11 and covering the electronic component 17. The conductive element 153 may be exposed from the encapsulant 16. The conductive element 153 may have a surface 1531 (e.g., a lower surface) facing away from the surface 1512 of the interposer 151 and exposed from the surface 161 of the encapsulant 16. In some embodiments of the present disclosure, the surface 1531 of the electrical connection 15 is substantially level with the surface 161 of the encapsulant 16. Thus, the electrical connection 15 may be configured to be an I/O element of the semiconductor device package 1.

In some embodiments of the present disclosure, the semiconductor device package 1 includes a shielding layer 19. The shielding layer 19 may cover an upper surface and a lateral surface of the encapsulant 13, a lateral surface of the carrier 11 and a lateral surface of the encapsulant 16.

Referring to FIG. 1, the encapsulant 16 may have a thickness of about 240 μm (micrometer). That is, a distance between the surface 112 of the carrier 11 and the surface 161 of the encapsulant 16 may be about 240 μm. The interposer 151 of the intermediate 15 may have a thickness of about 100 μm. Further, a distance between the surface 1511 of the interposer 151 and the surface 112 of the carrier 11 may be 30-50 μm, and thus a distance between the surface 1512 of the interposer 151 and the surface 161 of the encapsulant 16 may be 70-100 μm. That is, the conductive element 153 may have a height of about 70-100 μm. In some embodiments of the present disclosure, the intermediate structure 15 includes at least two conductive elements 153 and a pitch of the adjacent conductive elements 153 may be about 300 μm. That is, the semiconductor device package 1 may include the I/O elements with a pitch of about 300 μm, and thus may have a fine-pitch I/O.

Figure 2A:
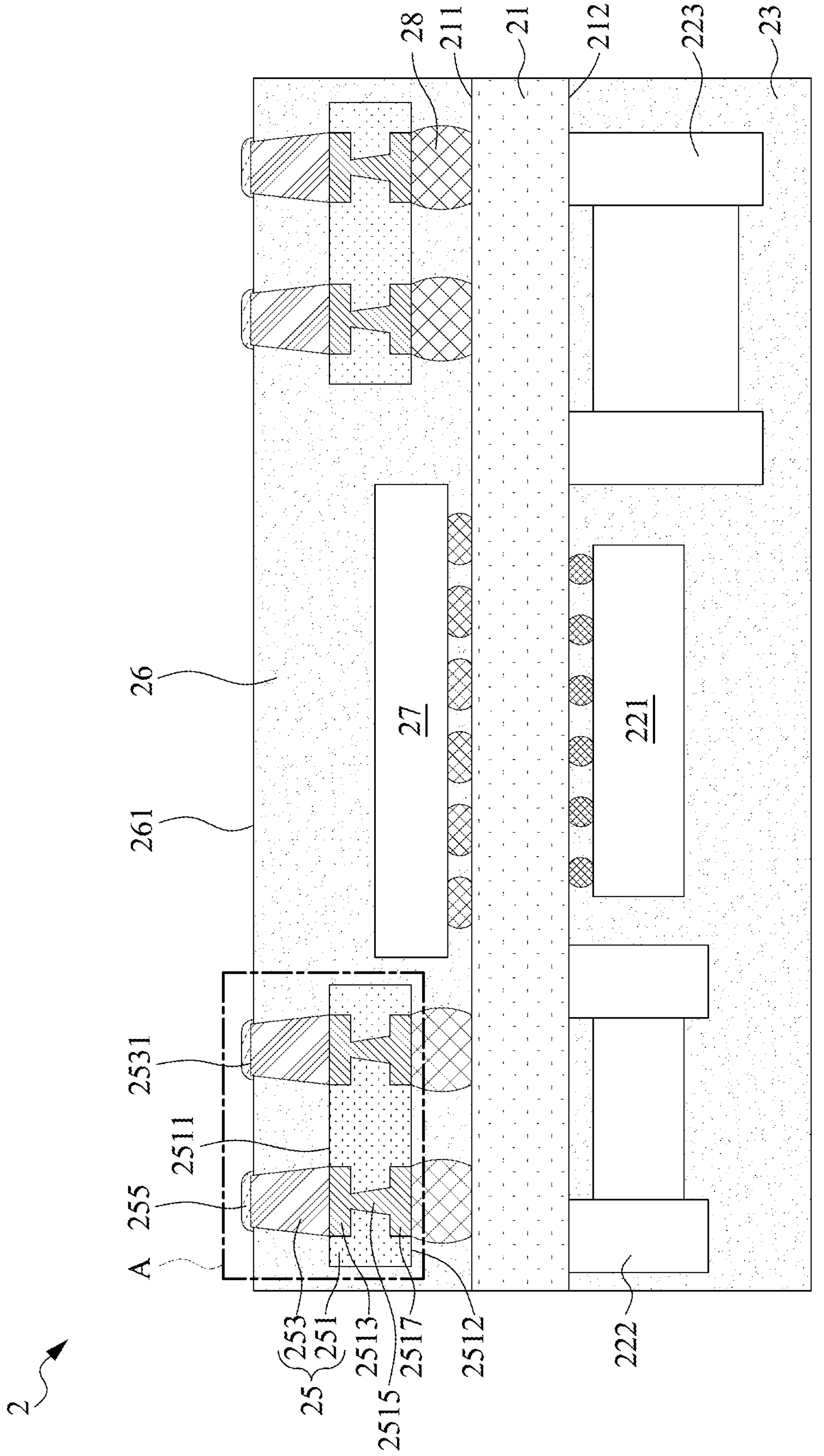
FIG. 2A is a cross-sectional view of a semiconductor device package in accordance with an embodiment of the instant disclosure.

FIG. 2A is a cross-sectional view of a semiconductor device package 2 in accordance with some embodiments of the present disclosure. As shown in FIG. 2A, the semiconductor device 2 includes a double side module (DSM). The semiconductor device 2 includes a carrier 21, electronic components 221, 222, 223 and 27, intermediate structures 25 and encapsulants 23 and 26. In some embodiments of the present disclosure, the carrier 21 includes a substrate, which may be a core substrate or a core-less substrate and may include traces, pads or interconnections for electrical connection. Referring to FIG. 2A, the carrier 21 has a surface 211 (e.g., an upper surface) and a surface 212 (e.g., a lower surface). The electronic components 221, 222 and 223 may be disposed or mounted on the surface 212 of the carrier 21. The electronic component 221 may be a die, an active device, a passive device, and/or other electronic devices. In some embodiments of the present disclosure, the electronic component 221 electrically connects the carrier 21 via electrical connections. The electronic components 222 and 223 may be a passive die such as capacitor. In some embodiments of the present disclosure, the electronic components 222 and 223 electrically connect the carrier 21. Further, the encapsulant 23 (i.e., a package body, a package layer, a protective layer) is disposed on the surface 212 of the carrier 21. The encapsulant 23 may cover the surface 212 of the carrier 21 and the electronic components 221, 222, 223 disposed on the surface 212 of the carrier 21. The encapsulant 23 may include molding compounds, such as a Novolac-based resin, an epoxy-based resin, a silicone-based resin, or other another suitable encapsulant; fillers such as silicon oxide fillers, may be included in the molding compound. In addition, the encapsulant 23 may include a molding underfill (MUF) or a capillary underfill (CUF).

As shown in FIG. 2A, the electronic component 27 may be disposed or mounted on the surface 211 of the carrier 21. Moreover, the electronic component 27 may be an active component, such as an integrated circuit (IC) die or a chip. In some embodiments of the present disclosure, the electronic component 27 has an active side facing the surface 211 and electrically connects the main carrier 21 via electrical connections.

Further, the intermediate structure 25 may be disposed or mounted on the surface 211 of the carrier 21. The intermediate structure 25 may include an interposer 251 and conductive elements 253. The interposer 251 has a surface 2511 (e.g., an upper surface) and a surface 2512 (e.g., a lower surface). In some embodiments of the present disclosure, the interposer 251 includes a substrate with an interconnection. In some embodiments of the present disclosure, the interconnection has a conductive pad 2513 adjacent to the surface 2511 of the interposer 251, a conductive pad 2517 adjacent to the surface 2512 of the interposer 251 and a conductive via 2515 configured to electrically connect the conductive pad 2513 and the conductive pad 2517. The conductive element 253 may be disposed or mounted on the surface 2511 of the interposer 251. The conductive element 253 may be electrically connected to the conductive pad 2513. In some embodiments of the present disclosure, the conductive element 253 includes a pillar with non-reflowable material. In some embodiments of the present disclosure, the conductive element 253 includes a cupper (Cu) pillar. In some embodiments of the present disclosure, the surface 2511 of the interposer 251 is substantially higher than the electronic component 27. That is, a lower surface of the conductive element 253 may be substantially higher than an upper surface of the electronic component 27.

In addition, a plurality of electrical connections 28 may be arranged between the surface 211 of the carrier 21 and the surface 2512 of the interposer 251 of the intermediate structure 25. In some embodiments of the present disclosure, the electrical connection 28 is connected to the conductive pad 2517 of the interposer 251. Thus, the intermediate structure 25 may be electrically to the carrier 21 through the electrical connections 28. In some embodiments of the present disclosure, the electrical connection 28 includes a reflowable material. In some embodiments of the present disclosure, the electrical connection 28 includes solder material. The electrical connection 28 may include a solder ball. In some embodiments of the present disclosure, the electrical connection 28 can be replaced with a conductive adhesive, such as an Ajinomoto buildup film (ABF). In some embodiments of the present disclosure, a height of the conductive element 253 is substantially greater than a height of the electrical connection 28. That is, a distance between the surface 261 of the encapsulant 26 and the surface 2511 of the interposer 251 may be greater than a distance between the surface 211 of the carrier 21 and the surface 2512 of the interposer 251. In some embodiments of the present disclosure, an electrical conductivity of the conductive element 253 is greater than an electrical conductivity of the electrical connection 28.

The encapsulant 26 (i.e., a package body, a package layer, a protective layer) is disposed on the surface 211 of the carrier 21. The encapsulant 26 may cover the surface 211 of the carrier 21, the intermediate structure 25 and the electronic component 27 disposed on the surface 211 of the carrier 21. The encapsulant 26 may include molding compounds, such as a Novolac-based resin, an epoxy-based resin, a silicone-based resin, or other another suitable encapsulant; fillers such as silicon oxide fillers, may be included in the molding compound. In addition, the encapsulant 26 may include a molding underfill (MUF) or a capillary underfill (CUF). The encapsulant 26 has a surface 261 (e.g., an upper surface) facing away from the surface 211 of the carrier 21 and covering the electronic component 27. The conductive element 253 may be exposed from the encapsulant 26. The conductive element 253 may have a surface 2531 (e.g., an upper surface) facing away from the surface 2511 of the interposer 251 and exposed from the surface 261 of the encapsulant 26. In some embodiments of the present disclosure, the surface 2531 of the conductive element 253 is substantially level with the surface 261 of the encapsulant 26. Thus, the conductive element 253 may be configured to be an I/O element of the semiconductor device package 2. Moreover, a finish layer 255 may cover the conductive element 253. In some embodiments of the present disclosure, the finish layer 255 is disposed on the surface 2531 of the conductive element 253.

In some embodiments of the present disclosure, the semiconductor device package 2 includes a shielding layer, which may be the same as, or similar to the shielding layer 19 as shown in FIG. 1.

Figure 2B:
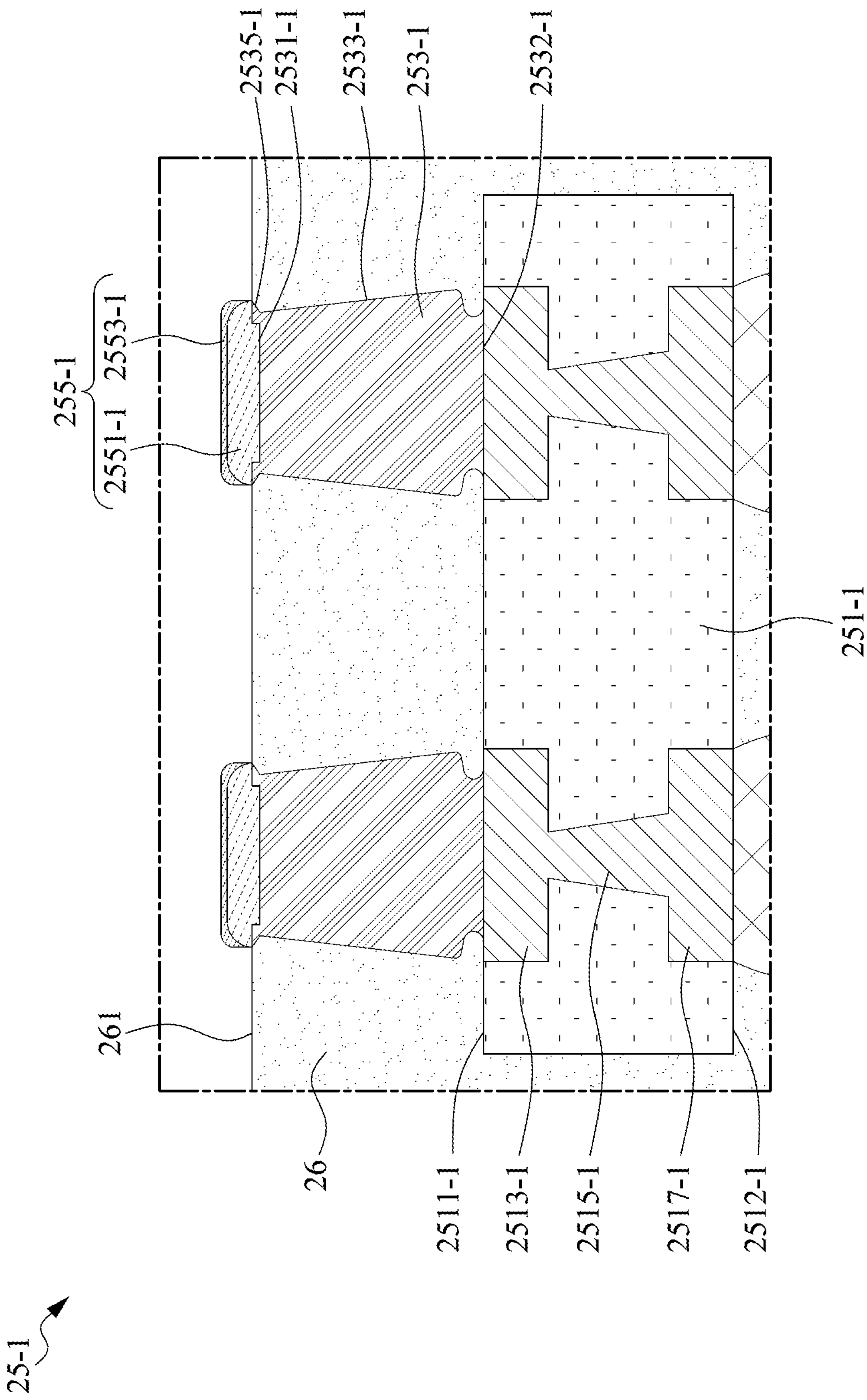
FIG. 2B is an enlarged view of portion "A" illustrated in FIG. 2A, which illustrates an embodiment of an intermediate structure.

FIG. 2B is an enlarged view of portion "A" illustrated in FIG. 2A. Especially it illustrates an embodiment of the intermediate structure 25 as shown in FIG. 2A.

Referring to FIG. 2B, the intermediate structure 25-1 is an embodiment of the intermediate structure 25 shown in FIG. 2A. The intermediate structure 25-1 includes an interposer 251-1 and conductive elements 253-1. The interposer 251-1 has a surface 2511-1 (e.g., an upper surface) and a surface 2512-1 (e.g., a lower surface). In some embodiments of the present disclosure, the interposer 251-1 includes a substrate with an interconnection. In some embodiments of the present disclosure, the interconnection has a conductive pad 2513-1 adjacent to the surface 2511-1 of the interposer 251-1, a conductive pad 2517-1 adjacent to the surface 2512-1 of the interposer 251-1 and a conductive via 2515-1 configured to electrically connect the conductive pad 2513-1 and the conductive pad 2517-1. The conductive element 253-1 may be disposed or mounted on the surface 2511-1 of the interposer 251-1. The conductive element 253-1 may have an upper surface 2531-1 exposed from the (upper) surface 261 of the encapsulant 26 and a lower surface 2532-1 abutting the conductive pad 2513-1 of the interposer 251-1. Thus, the conductive element 253-1 may be electrically connected to the conductive pad 2513-1. In some embodiments of the present disclosure, the conductive element 253-1 includes a pillar with non-reflowable material. In some embodiments of the present disclosure, the conductive element 253-1 includes a cupper (Cu) pillar.

In some embodiments of the present disclosure, a portion 2535-1 of the upper surface 2531-1 of the conductive element 253-1 is adjacent to the surface 261 of the encapsulant 26 and vertically covers the encapsulant 26. The portion 2535-1 of the upper surface 2531-1 of the conductive element 253-1 may produce a mold lock and thus improve the connection strength of the conductive element 253-1 and the encapsulant 26.

As shown in FIG. 2B, the conductive element 253-1 may be tapered from its lower surface 2532-1 toward its upper surface 2531-1. Therefore, a distance between the adjacent conductive elements 253-1 may become greater from the surface 2511-1 of the interposer 251-1 toward the surface 261 of the encapsulant 26. Further, the upper surface 2531-1 of the conductive element 253-1 may have a middle portion which may be slightly lower than the surface 261 of the encapsulant 26. Further, the upper surface 2531-1 of the conductive element 253-1 may have a lateral portion which may be adjacent to the lateral side 2533-1 of the conductive element 253-1 and substantially level with the surface 261 of the encapsulant 26. Further, the lateral portion of the upper surface 2531-1 of the conductive element 253-1 may extend beyond the lateral side 2533-1 of the conductive element 253-1 from a top view perspective.

Referring to FIG. 2B, the finish layer 255-1 covers the conductive element 253-1. In some embodiments of the present disclosure, the finish layer 255-1 is disposed over the upper surface 2531-1 of the conductive element 253-1. In some embodiments of the present disclosure, the finish layer 255-1 includes electroless nickel immersion gold (ENIG). The ENIG may include a nickel material 2551-1 covering and abutting the upper surface 2531-1 of the conductive element 253-1 and a gold material disposed 2553-1 over the nickel material 2551-1. In some embodiments of the present disclosure, the finish layer 255-1 may partially cover the surface 261 of the encapsulant 26. In some embodiments of the present disclosure, the finish layer 255-1 may include a barrier layer.

Figure 2C:
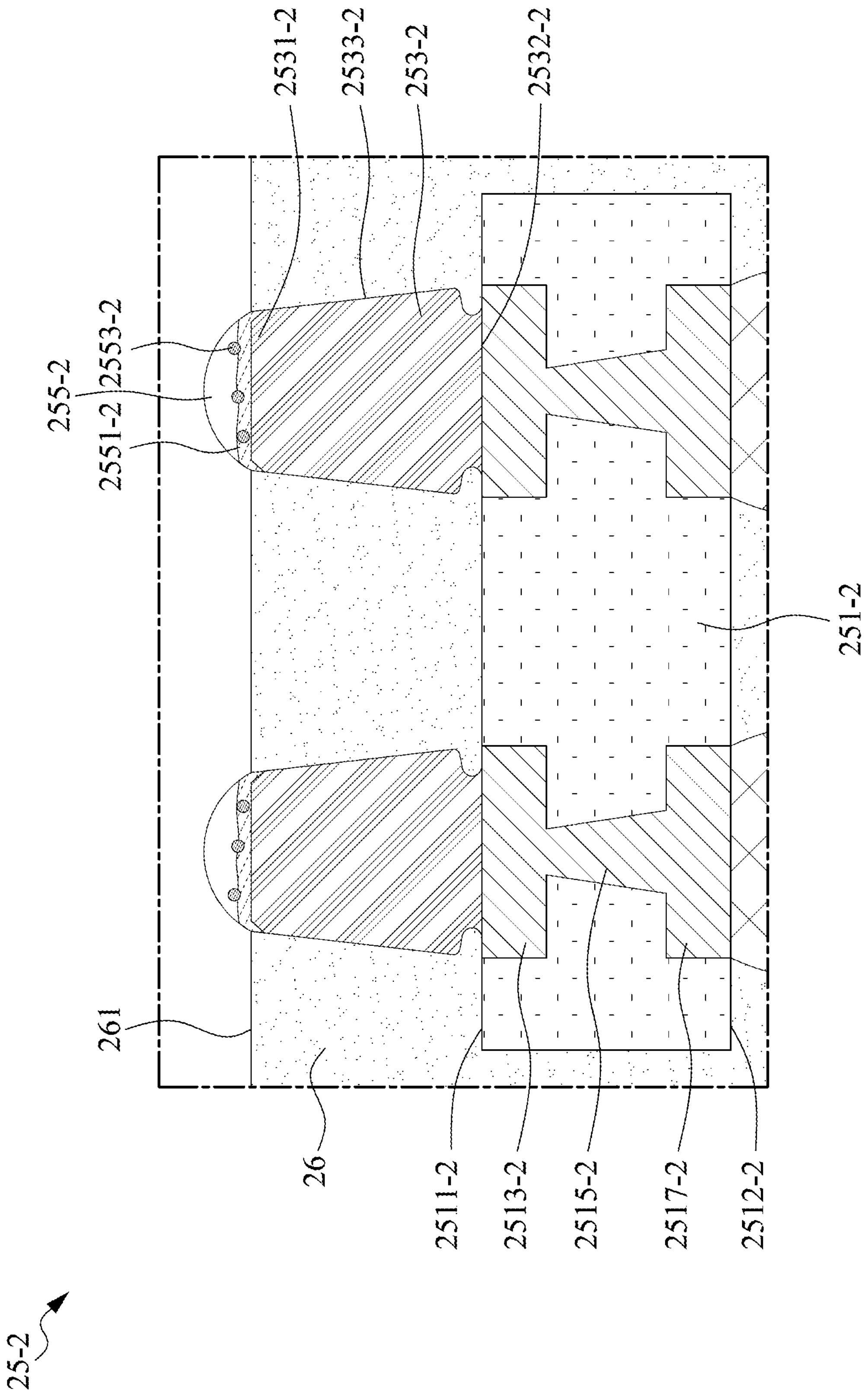
FIG. 2C is an enlarged view of portion "A" illustrated in FIG. 2A, which illustrates another embodiment of an intermediate structure.

FIG. 2C is an enlarged view of portion "A" illustrated in FIG. 2A. Especially it illustrates another embodiment of the intermediate structure 25 as shown in FIG. 2A.

Referring to FIG. 2C, the intermediate structure 25-2 is another embodiment of the intermediate structure 25 shown in FIG. 2A. The intermediate structure 25-2 includes an interposer 251-2 and conductive elements 253-2. The interposer 251-2 has a surface 2511-2 (e.g., an upper surface) and a surface 2512-2 (e.g., a lower surface). In some embodiments of the present disclosure, the interposer 251-2 includes a substrate with an interconnection. In some embodiments of the present disclosure, the interconnection has a conductive pad 2513-2 adjacent to the surface 2511-2 of the interposer 251-2, a conductive pad 2517-2 adjacent to the surface 2512-12 of the interposer 251-2 and a conductive via 2515-2 configured to electrically connect the conductive pad 2513-2 and the conductive pad 2517-2. The conductive element 253-2 may be disposed or mounted on the surface 2511-2 of the interposer 251-2. The conductive element 253-2 may have an upper surface 2531-2 exposed from the (upper) surface 261 of the encapsulant 26 and a lower surface 2532-2 abutting the conductive pad 2513-2 of the interposer 251-2. Thus, the conductive element 253-2 may be electrically connected to the conductive pad 2513-2. In some embodiments of the present disclosure, the conductive element 253-2 includes a pillar with non-reflowable material. In some embodiments of the present disclosure, the conductive element 253-2 includes a cupper (Cu) pillar.

As shown in FIG. 2C, the conductive element 253-2 may be tapered from its lower surface 2532-2 toward its upper surface 2531-2. Therefore, a distance between the adjacent conductive elements 253-2 may become greater from the surface 2511-2 of the interposer 251-2 toward the surface 261 of the encapsulant 26. Further, the upper surface 2531-2 of the conductive element 253-2 may have a middle portion which may be substantially level with the surface 261 of the encapsulant 26. Further, the upper surface 2531-2 of the conductive element 253-2 may have a lateral portion which may be adjacent to the lateral side 2533-2 of the conductive element 253-2 and slightly lower than the surface 261 of the encapsulant 26.

Referring to FIG. 2C, the finish layer 255-2 covers the conductive element 253-2. In some embodiments of the present disclosure, the finish layer 255-2 is disposed over the upper surface 2531-2 of the conductive element 253-2. In some embodiments of the present disclosure, the finish layer 255-2 includes pre-solder. In some embodiments of the present disclosure, the pre-solder includes an intermetallic compound (IMC) 2551-2 adjacent to the upper surface 2531-2 of the conductive element 253-2. Moreover, some voids 2553-2 may be embedded in the pre-solder. The voids 2553-2 may be formed by the vaporization of the flux material in the process of applying the pre-solder.

Figure 3A:
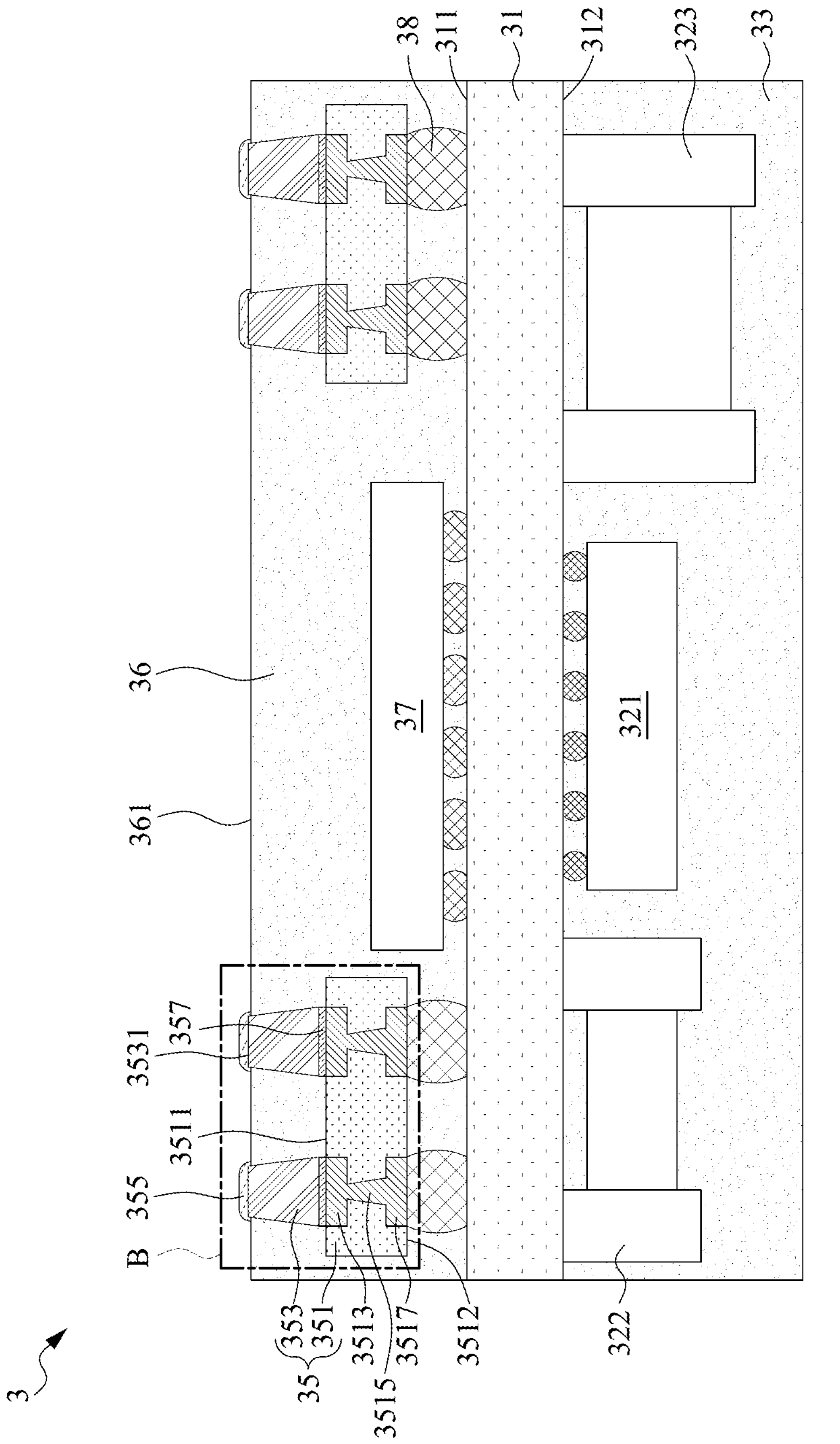
FIG. 3A is a cross-sectional view of a semiconductor device package in accordance with an embodiment of the instant disclosure.

FIG. 3A is a cross-sectional view of a semiconductor device package 3 in accordance with some embodiments of the present disclosure. As shown in FIG. 3A, the semiconductor device 3 includes a double side module (DSM). The semiconductor device 3 includes a carrier 31, electronic components 321, 322, 323 and 37, intermediate structures 35 and encapsulants 33 and 36. In some embodiments of the present disclosure, the carrier 31 includes a substrate, which may be a core substrate or a core-less substrate and may include traces, pads or interconnections for electrical connection. Referring to FIG. 3A, the carrier 31 has a surface 311 (e.g., an upper surface) and a surface 312 (e.g., a lower surface). The electronic components 321, 322 and 323 may be disposed or mounted on the surface 312 of the carrier 31. The electronic component 321 may be a die, an active device, a passive device, and/or other electronic devices. In some embodiments of the present disclosure, the electronic component 321 electrically connects the carrier 31 via electrical connections. The electronic components 322 and 323 may be a passive die such as capacitor. In some embodiments of the present disclosure, the electronic components 322 and 323 electrically connect the carrier 31. Further, the encapsulant 33 (i.e., a package body, a package layer, a protective layer) is disposed on the surface 312 of the carrier 31. The encapsulant 33 may cover the surface 312 of the carrier 31 and the electronic components 321, 322, 323 disposed on the surface 312 of the carrier 31. The encapsulant 33 may include molding compounds, such as a Novolac-based resin, an epoxy-based resin, a silicone-based resin, or other another suitable encapsulant; fillers such as silicon oxide fillers, may be included in the molding compound. In addition, the encapsulant 33 may include a molding underfill (MUF) or a capillary underfill (CUF).

As shown in FIG. 3A, the electronic component 37 may be disposed or mounted on the surface 311 of the carrier 31. Moreover, the electronic component 37 may be an active component, such as an integrated circuit (IC) die or a chip. In some embodiments of the present disclosure, the electronic component 37 has an active side facing the surface 311 and electrically connects the main carrier 31 via electrical connections.

Further, the intermediate structure 35 may be disposed or mounted on the surface 311 of the carrier 31. The intermediate structure 35 may include an interposer 351 and conductive elements 353. The interposer 351 has a surface 3511 (e.g., an upper surface) and a surface 3512 (e.g., a lower surface). In some embodiments of the present disclosure, the interposer 351 includes a substrate with an interconnection. In some embodiments of the present disclosure, the interconnection has a conductive pad 3513 adjacent to the surface 3511 of the interposer 351, a conductive pad 3517 adjacent to the surface 3512 of the interposer 351 and a conductive via 3515 configured to electrically connect the conductive pad 3513 and the conductive pad 3517. The conductive element 353 may be disposed or mounted on the surface 3511 of the interposer 351. The conductive element 353 may be electrically connected to the conductive pad 3513. In some embodiments of the present disclosure, the conductive element 353 includes a pillar with non-reflowable material. In some embodiments of the present disclosure, the conductive element 353 includes a cupper (Cu) pillar. In some embodiments of the present disclosure, a solder material 357 is arranged between the conductive element 353 and the interposer 351. In some embodiments of the present disclosure, the conductive element 353 is connected to the conductive pad 3513 through the solder material 357. In some embodiments of the present disclosure, the surface 3511 of the interposer 351 is substantially higher than the electronic component 37. That is, a lower surface of the conductive element 353 may be substantially higher than an upper surface of the electronic component 37.

In addition, a plurality of electrical connections 38 may be arranged between the surface 311 of the carrier 31 and the surface 3512 of the interposer 351 of the intermediate structure 35. In some embodiments of the present disclosure, the electrical connection 38 is connected to the conductive pad 3517 of the interposer 351. Thus, the intermediate structure 35 may be electrically to the carrier 31 through the electrical connections 38. In some embodiments of the present disclosure, the electrical connection 38 includes a reflowable material. In some embodiments of the present disclosure, the electrical connection 38 includes solder material. The electrical connection 38 may include a solder ball. In some embodiments of the present disclosure, the electrical connection 38 can be replaced with a conductive adhesive, such as an Ajinomoto buildup film (ABF). In some embodiments of the present disclosure, a height of the conductive element 353 is substantially greater than a height of the electrical connection 38. That is, a distance between the surface 361 of the encapsulant 36 and the surface 3511 of the interposer 351 may be greater than a distance between the surface 311 of the carrier 31 and the surface 3512 of the interposer 351. In some embodiments of the present disclosure, an electrical conductivity of the conductive element 353 is greater than an electrical conductivity of the electrical connection 38.

The encapsulant 36 (i.e., a package body, a package layer, a protective layer) is disposed on the surface 311 of the carrier 31. The encapsulant 36 may cover the surface 311 of the carrier 31, the intermediate structure 35 and the electronic component 37 disposed on the surface 311 of the carrier 31. The encapsulant 36 may include molding compounds, such as a Novolac-based resin, an epoxy-based resin, a silicone-based resin, or other another suitable encapsulant; fillers such as silicon oxide fillers, may be included in the molding compound. In addition, the encapsulant 36 may include a molding underfill (MUF) or a capillary underfill (CUF). The encapsulant 36 has a surface 361 (e.g., an upper surface) facing away from the surface 311 of the carrier 31 and covering the electronic component 37. The conductive element 353 may be exposed from the encapsulant 36. The conductive element 353 may have a surface 3531 (e.g., an upper surface) facing away from the surface 3511 of the interposer 351 and exposed from the surface 361 of the encapsulant 36. In some embodiments of the present disclosure, the surface 3531 of the conductive element 353 is substantially level with the surface 361 of the encapsulant 36. Thus, the conductive element 353 may be configured to be an I/O element of the semiconductor device package 3. Moreover, a finish layer 355 may cover the conductive element 353. In some embodiments of the present disclosure, the finish layer 355 is disposed on the surface 3531 of the conductive element 353.

In some embodiments of the present disclosure, the semiconductor device package 3 includes a shielding layer, which may be the same as, or similar to the shielding layer 19 as shown in FIG. 1.

Figure 3B:
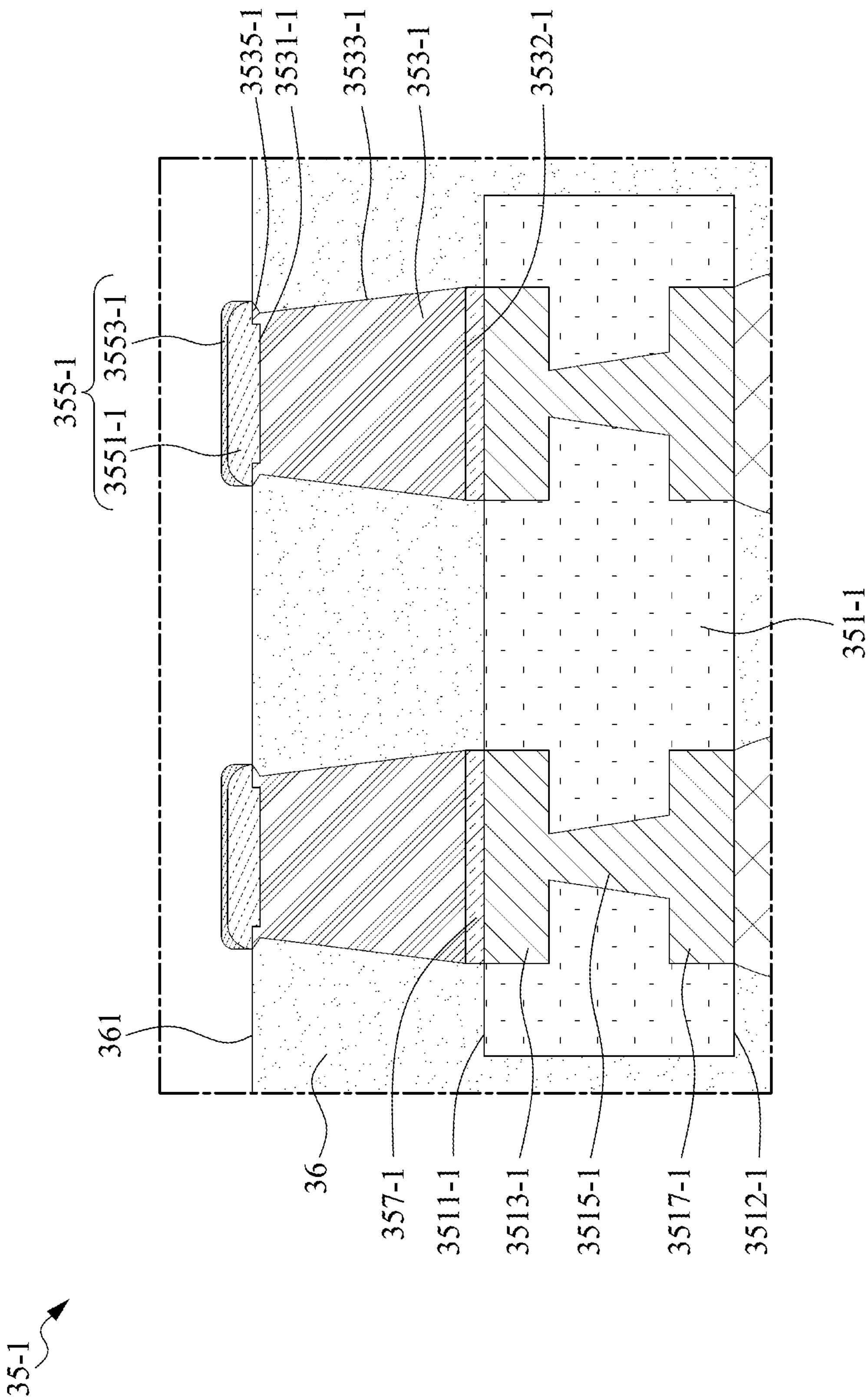
FIG. 3B is an enlarged view of portion "B" illustrated in FIG. 3A, which illustrates an embodiment of an intermediate structure.

FIG. 3B is an enlarged view of portion "B" illustrated in FIG. 3A. Especially it illustrates an embodiment of the intermediate structure 35 as shown in FIG. 3A.

Referring to FIG. 3B, the intermediate structure 35-1 is an embodiment of the intermediate structure 35 shown in FIG. 3A. The intermediate structure 35-1 includes an interposer 351-1 and conductive elements 353-1. The interposer 351-1 has a surface 3511-1 (e.g., an upper surface) and a surface 3512-1 (e.g., a lower surface). In some embodiments of the present disclosure, the interposer 351-1 includes a substrate with an interconnection. In some embodiments of the present disclosure, the interconnection has a conductive pad 3513-1 adjacent to the surface 3511-1 of the interposer 351-1, a conductive pad 3517-1 adjacent to the surface 3512-1 of the interposer 351-1 and a conductive via 3515-1 configured to electrically connect the conductive pad 3513-1 and the conductive pad 3517-1. The conductive element 353-1 may be disposed or mounted on the surface 3511-1 of the interposer 351-1. The conductive element 353-1 may have an upper surface 3531-1 exposed from the (upper) surface 361 of the encapsulant 36 and a lower surface 3532-1 abutting a solder material 357-2 on the conductive pad 3513-1 of the interposer 351-1. Thus, the conductive element 353-1 may be electrically connected to the conductive pad 3513-1 through the solder material 357-2. In some embodiments of the present disclosure, the conductive element 353-1 includes a pillar with non-reflowable material. In some embodiments of the present disclosure, the conductive element 353-1 includes a cupper (Cu) pillar.

In some embodiments of the present disclosure, a portion 3535-1 of the upper surface 3531-1 of the conductive element 353-1 is adjacent to the encapsulant 36 and extends to the encapsulant 36. The portion 3535-1 of the upper surface 3531-1 of the conductive element 353-1 may produce a mold lock and thus increase the connection strength of the conductive element 353-1 and the encapsulant 36.

As shown in FIG. 3B, the conductive element 353-1 may be tapered from its lower surface 3532-1 toward its upper surface 3531-1. Therefore, a distance between the adjacent conductive elements 353-1 may become greater from the surface 3511-1 of the interposer 351-1 toward the surface 361 of the encapsulant 36. Further, the upper surface 3531-1 of the conductive element 353-1 may have a middle portion which may be slightly lower than the surface 361 of the encapsulant 36. Further, the upper surface 3531-1 of the conductive element 353-1 may have a lateral portion which may be adjacent to the lateral side 3533-1 of the conductive element 353-1 and substantially level with the surface 361 of the encapsulant 36. Further, the lateral portion of the upper surface 3531-1 of the conductive element 353-1 may extend beyond the lateral side 3533-1 of the conductive element 353-1 from a top view perspective.

Referring to FIG. 3B, the finish layer 355-1 covers the conductive element 353-1. In some embodiments of the present disclosure, the finish layer 355-1 is disposed over the upper surface 3531-1 of the conductive element 353-1. In some embodiments of the present disclosure, the finish layer 355-1 includes electroless nickel immersion gold (ENIG). The ENIG may include a nickel material 3551-1 covering and abutting the upper surface 3531-1 of the conductive element 353-1 and a gold material disposed 3553-1 over the nickel material 3551-1. In some embodiments of the present disclosure, the finish layer 355-1 may partially cover the surface 361 of the encapsulant 36. In some embodiments of the present disclosure, the finish layer 355-1 may include a barrier layer.

Figure 3C:
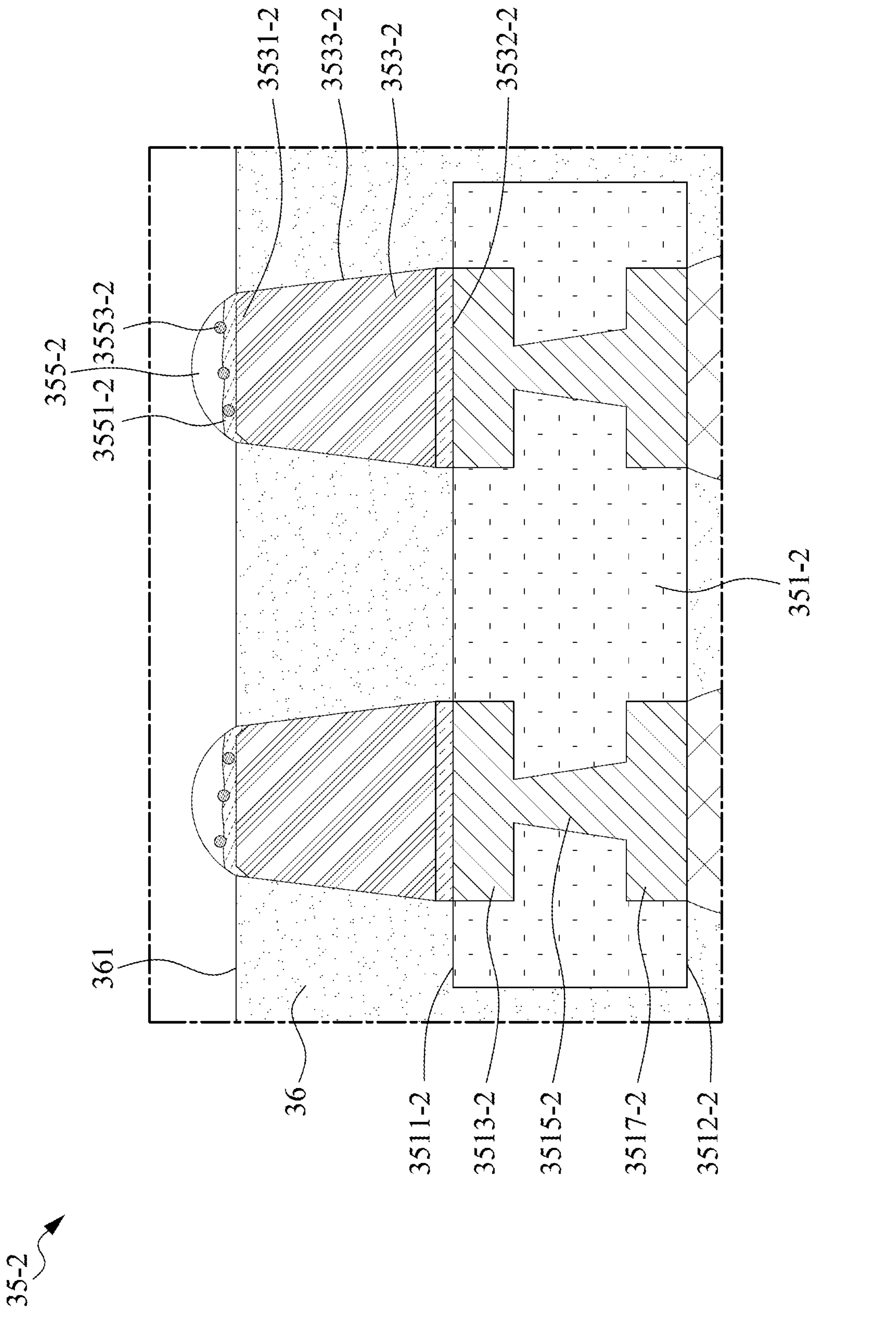
FIG. 3C is an enlarged view of portion "B" illustrated in FIG. 3A, which illustrates another embodiment of an intermediate structure.

FIG. 3C is an enlarged view of portion "B" illustrated in FIG. 3A. Especially it illustrates another embodiment of the intermediate structure 35 as shown in FIG. 3A.

Referring to FIG. 3C, the intermediate structure 35-2 is another embodiment of the intermediate structure 35 shown in FIG. 3A. The intermediate structure 35-2 includes an interposer 351-2 and conductive elements 353-2. The interposer 351-2 has a surface 3511-2 (e.g., an upper surface) and a surface 3512-2 (e.g., a lower surface). In some embodiments of the present disclosure, the interposer 351-2 includes a substrate with an interconnection. In some embodiments of the present disclosure, the interconnection has a conductive pad 3513-2 adjacent to the surface 3511-2 of the interposer 351-2, a conductive pad 3517-2 adjacent to the surface 3512-12 of the interposer 351-2 and a conductive via 3515-2 configured to electrically connect the conductive pad 3513-2 and the conductive pad 3517-2. The conductive element 353-2 may be disposed or mounted on the surface 3511-2 of the interposer 351-2. The conductive element 353-2 may have an upper surface 3531-2 exposed from the (upper) surface 361 of the encapsulant 36 and a lower surface 3532-2 abutting a solder material 357-2 on the conductive pad 3513-2 of the interposer 351-2. Thus, the conductive element 353-2 may be electrically connected to the conductive pad 3513-2 through the solder material 357-2. In some embodiments of the present disclosure, the conductive element 353-2 includes a pillar with non-reflowable material. In some embodiments of the present disclosure, the conductive element 353-2 includes a cupper (Cu) pillar.

As shown in FIG. 3C, the conductive element 353-2 may be tapered from its lower surface 3532-2 toward its upper surface 3531-2. Therefore, a distance between the adjacent conductive elements 353-2 may become greater from the surface 3511-2 of the interposer 351-2 toward the surface 361 of the encapsulant 36. Further, the upper surface 3531-2 of the conductive element 353-2 may have a middle portion which may be substantially level with the surface 361 of the encapsulant 36. Further, the upper surface 3531-2 of the conductive element 353-2 may have a lateral portion which may be adjacent to the lateral side 3533-2 of the conductive element 353-2 and slightly lower than the surface 361 of the encapsulant 36.

Referring to FIG. 3C, the finish layer 355-2 covers the conductive element 353-2. In some embodiments of the present disclosure, the finish layer 355-2 is disposed over the upper surface 3531-2 of the conductive element 353-2. In some embodiments of the present disclosure, the finish layer 355-2 includes pre-solder. In some embodiments of the present disclosure, the pre-solder includes an intermetallic compound (IMC) 3551-2 adjacent to the upper surface 3531-2 of the conductive element 353-2. Moreover, some voids 3553-2 may be embedded in the pre-solder. The voids 3553-2 may be formed by the vaporization of the flux material in the process of applying the pre-solder.

Figure 4A:
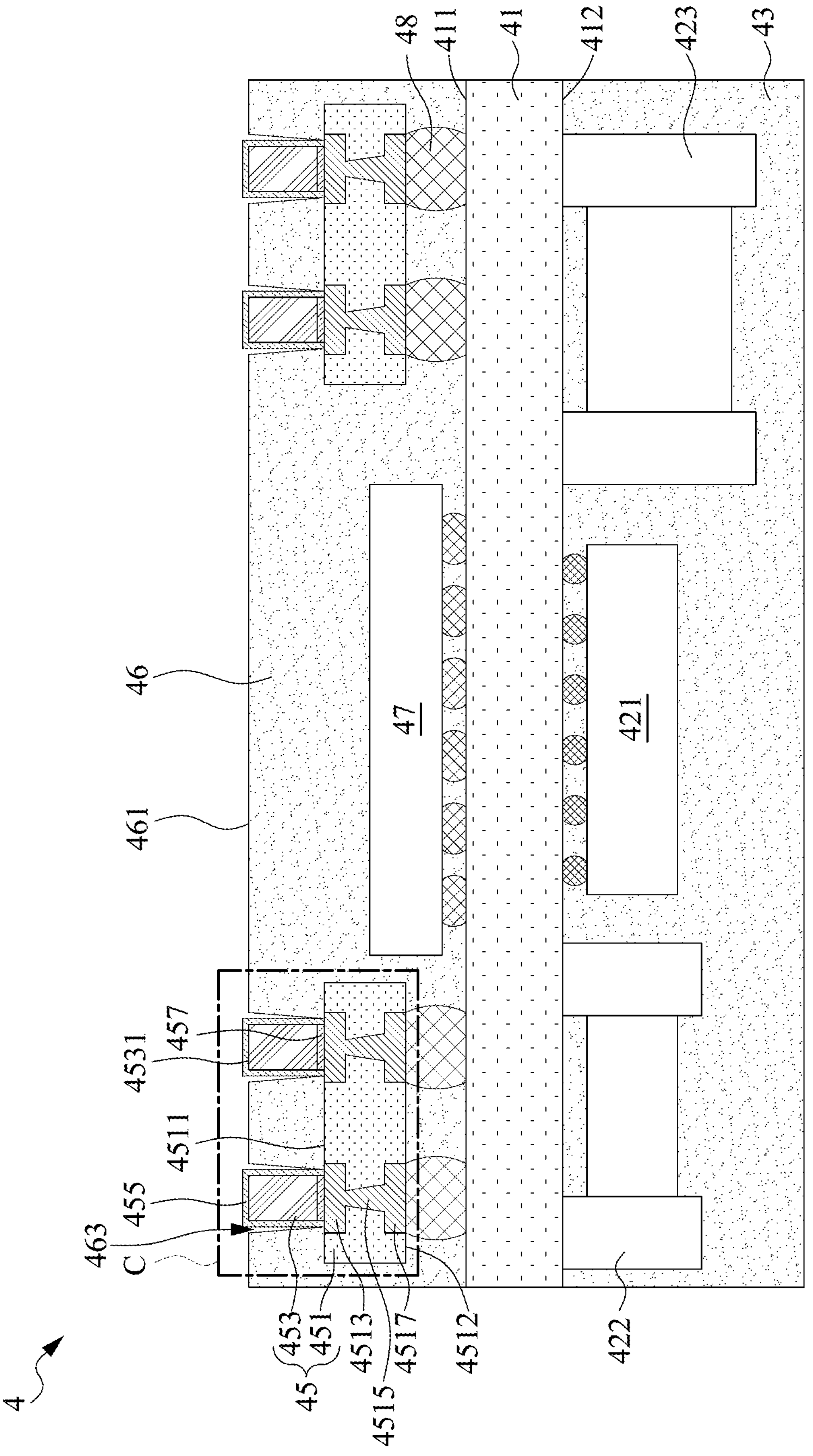
FIG. 4A is a cross-sectional view of a semiconductor device package in accordance with an embodiment of the instant disclosure.

FIG. 4A is a cross-sectional view of a semiconductor device package 4 in accordance with some embodiments of the present disclosure. As shown in FIG. 4A, the semiconductor device 4 includes a double side module (DSM). The semiconductor device 4 includes a carrier 41, electronic components 421, 422, 423 and 47, intermediate structures 45 and encapsulants 43 and 46. In some embodiments of the present disclosure, the carrier 41 includes a substrate, which may be a core substrate or a core-less substrate and may include traces, pads or interconnections for electrical connection. Referring to FIG. 4A, the carrier 41 has a surface 411 (e.g., an upper surface) and a surface 412 (e.g., a lower surface). The electronic components 421, 422 and 423 may be disposed or mounted on the surface 412 of the carrier 41. The electronic component 421 may be a die, an active device, a passive device, and/or other electronic devices. In some embodiments of the present disclosure, the electronic component 421 electrically connects the carrier 41 via electrical connections. The electronic components 422 and 423 may be a passive die such as capacitor. In some embodiments of the present disclosure, the electronic components 422 and 423 electrically connect the carrier 31. Further, the encapsulant 43 (i.e., a package body, a package layer, a protective layer) is disposed on the surface 412 of the carrier 41. The encapsulant 43 may cover the surface 412 of the carrier 41 and the electronic components 421, 422, 423 disposed on the surface 412 of the carrier 41. The encapsulant 43 may include molding compounds, such as a Novolac-based resin, an epoxy-based resin, a silicone-based resin, or other another suitable encapsulant; fillers such as silicon oxide fillers, may be included in the molding compound. In addition, the encapsulant 43 may include a molding underfill (MUF) or a capillary underfill (CUF).

As shown in FIG. 4A, the electronic component 47 may be disposed or mounted on the surface 411 of the carrier 41. Moreover, the electronic component 47 may be an active component, such as an integrated circuit (IC) die or a chip. In some embodiments of the present disclosure, the electronic component 47 has an active side facing the surface 311 and electrically connects the main carrier 41 via electrical connections.

Further, the intermediate structure 45 may be disposed or mounted on the surface 411 of the carrier 41. The intermediate structure 45 may include an interposer 451 and conductive elements 453. The interposer 451 has a surface 4511 (e.g., an upper surface) and a surface 4512 (e.g., a lower surface). In some embodiments of the present disclosure, the interposer 451 includes a substrate with an interconnection. In some embodiments of the present disclosure, the interconnection has a conductive pad 4513 adjacent to the surface 4511 of the interposer 451, a conductive pad 4517 adjacent to the surface 4512 of the interposer 451 and a conductive via 4515 configured to electrically connect the conductive pad 4513 and the conductive pad 4517. The conductive element 453 may be disposed or mounted on the surface 4511 of the interposer 451. The conductive element 453 may be electrically connected to the conductive pad 4513. In some embodiments of the present disclosure, the conductive element 453 includes a pillar with non-reflowable material. In some embodiments of the present disclosure, the conductive element 453 includes a cupper (Cu) pillar. In some embodiments of the present disclosure, a solder material 457 is arranged between the conductive element 453 and the interposer 451. In some embodiments of the present disclosure, the conductive element 453 is connected to the conductive pad 4513 through the solder material 457. In some embodiments of the present disclosure, the surface 4511 of the interposer 451 is substantially higher than the electronic component 47. That is, a lower surface of the conductive element 453 may be substantially higher than an upper surface of the electronic component 47.

In addition, a plurality of electrical connections 48 may be arranged between the surface 411 of the carrier 41 and the surface 4512 of the interposer 451 of the intermediate structure 45. In some embodiments of the present disclosure, the electrical connection 48 is connected to the conductive pad 4517 of the interposer 451. Thus, the intermediate structure 45 may be electrically to the carrier 41 through the electrical connections 48. In some embodiments of the present disclosure, the electrical connection 48 includes a reflowable material. In some embodiments of the present disclosure, the electrical connection 48 includes solder material. The electrical connection 48 may include a solder ball. In some embodiments of the present disclosure, the electrical connection 48 can be replaced with a conductive adhesive, such as an Ajinomoto buildup film (ABF). In some embodiments of the present disclosure, a height of the conductive element 453 is substantially greater than a height of the electrical connection 48. That is, a distance between the surface 461 of the encapsulant 46 and the surface 4511 of the interposer 451 may be greater than a distance between the surface 411 of the carrier 41 and the surface 4512 of the interposer 451. In some embodiments of the present disclosure, an electrical conductivity of the conductive element 453 is greater than an electrical conductivity of the electrical connection 48.

The encapsulant 46 (i.e., a package body, a package layer, a protective layer) is disposed on the surface 411 of the carrier 41. The encapsulant 46 may cover the surface 411 of the carrier 41, the intermediate structure 45 and the electronic component 47 disposed on the surface 411 of the carrier 41. The encapsulant 46 may include molding compounds, such as a Novolac-based resin, an epoxy-based resin, a silicone-based resin, or other another suitable encapsulant; fillers such as silicon oxide fillers, may be included in the molding compound. In addition, the encapsulant 46 may include a molding underfill (MUF) or a capillary underfill (CUF). The encapsulant 46 has a surface 461 (e.g., an upper surface) facing away from the surface 411 of the carrier 41 and covering the electronic component 47. The encapsulant 46 has an opening 463 configured to received the conductive element 453. In other words, the conductive element 453 is disposed within the opening 463 of the encapsulant. That is, the conductive element 453 may be exposed from the encapsulant 46. Especially, the conductive element 453 may have a surface 4531 (e.g., an upper surface) facing away from the surface 4511 of the interposer 451 and be not covered by the encapsulant 46. In some embodiments of the present disclosure, the surface 4531 of the conductive element 453 is substantially level with the surface 461 of the encapsulant 46. Thus, the conductive element 453 may be configured to be an I/O element of the semiconductor device package 4.

Moreover, a finish layer 455 may cover the conductive element 453. In some embodiments of the present disclosure, the finish layer 455 surround the conductive element 453. In some embodiments of the present disclosure, the finish layer 455 is arranged within the opening 463 of the encapsulant and has at least a portion spaced apart from a lateral surface of the opening 463. In some embodiments of the present disclosure, the finish layer 455 is filled with a space between the opening 463 and the conductive element 453.

In some embodiments of the present disclosure, the semiconductor device package 4 includes a shielding layer, which may be the same as, or similar to the shielding layer 19 as shown in FIG. 1.

Figure 4B:
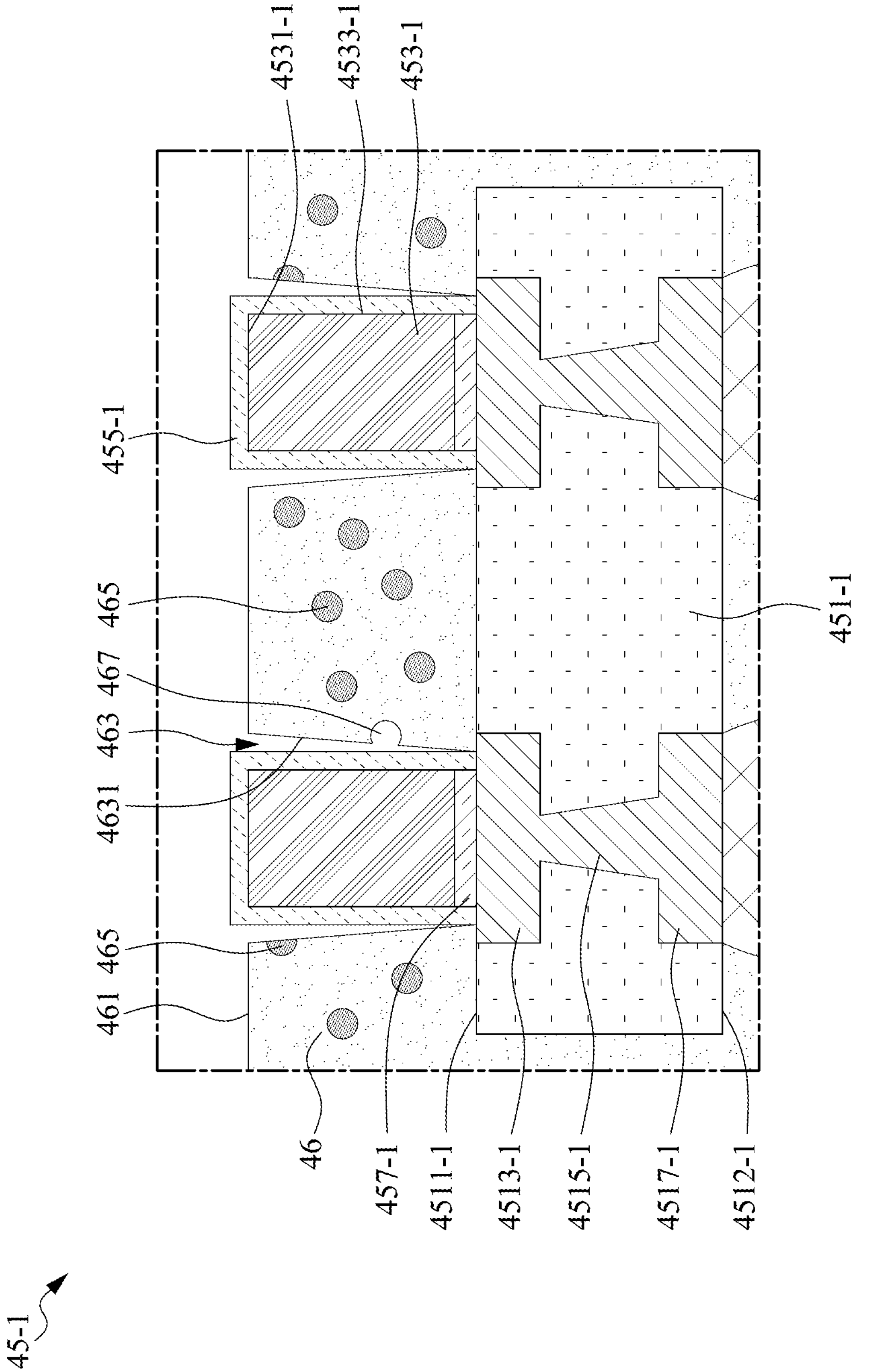
FIG. 4B is an enlarged view of portion "C" illustrated in FIG. 4A, which illustrates an embodiment of an intermediate structure.

FIG. 4B is an enlarged view of portion "C" illustrated in FIG. 4A. Especially, it illustrates an embodiment of the intermediate structure 45 as shown in FIG. 4A.

Referring to FIG. 4B, the intermediate structure 45-1 is an embodiment of the intermediate structure 45 shown in FIG. 4A. The intermediate structure 45-1 includes an interposer 451-1 and conductive elements 453-1. The interposer 451-1 has a surface 4511-1 (e.g., an upper surface) and a surface 4512-1 (e.g., a lower surface). In some embodiments of the present disclosure, the interposer 451-1 includes a substrate with an interconnection. In some embodiments of the present disclosure, the interconnection has a conductive pad 4513-1 adjacent to the surface 4511-1 of the interposer 451-1, a conductive pad 4517-1 adjacent to the surface 4512-1 of the interposer 451-1 and a conductive via 4515-1 configured to electrically connect the conductive pad 4513-1 and the conductive pad 4517-1. The conductive element 453-1 may be disposed or mounted on the surface 4511-1 of the interposer 451-1. The conductive element 453-1 may have an upper surface 4531-1 not covered by the encapsulant 46 and a lower surface 4532-1 abutting a solder material 457-1 on the conductive pad 4513-1 of the interposer 451-1. Thus, the conductive element 453-1 may be electrically connected to the conductive pad 4513-1 through the solder material 457-1. In some embodiments of the present disclosure, the conductive element 453-1 includes a pillar with non-reflowable material. In some embodiments of the present disclosure, the conductive element 453-1 includes a cupper (Cu) pillar.

As shown in FIG. 4B, the encapsulant 46 has an opening 463 and the conductive element 453-1 is arranged within the opening 463. In some embodiments of the present disclosure, the opening 463 is tapered from the surface 461 of the encapsulant 46 toward the surface 4511-1 of the interposer 451-1. Therefore, a distance between the adjacent openings 46 may become greater from the surface 461 of the encapsulant 46 toward the surface 4511-1 of the interposer 451-1. The conductive element 453-1 has a lateral surface 4533-1 spaced apart from a lateral surface 4631 of the opening 463. In some embodiments of the present disclosure, the encapsulant 46 includes a plurality of fillers 465. Further, the fillers 465 may include a truncated filler adjacent to or abutting the lateral surface 4631 of the opening 463.

In some embodiments of the present disclosure, the encapsulant 46 includes a cavity 467 abutting the lateral surface 4631 of the opening 463. When forming the opening 463, a truncated filler adjacent to or abutting the lateral surface 4631 of the opening 463 may be melt by heat, and thus the cavity 467 may be formed on the lateral surface 4631 of the opening 463.

Referring to FIG. 4B, the finish layer 455-1 covers the conductive element 453-1. In some embodiments of the present disclosure, the finish layer 455-1 includes electroless nickel immersion gold (ENIG). In some embodiments of the present disclosure, the finish layer 455-1 surrounds the conductive element 453-1. In some embodiments of the present disclosure, the finish layer 455-1 covers the surface 4531-1 and the lateral surface 4533-1 of the conductive element 453-1 and the solder material 457-1. In some embodiments of the present disclosure, the finish layer 455-1 has a portion spaced apart from the lateral surface 4631 of the opening 463. That is, the portion of the finish layer is not in contact with the lateral surface 4631 of the opening 463. Thus, a gap may be formed between the lateral surface 4631 of the opening 463 and the lateral surface 4533-1 of the conductive element 453-1.

Figure 4C:
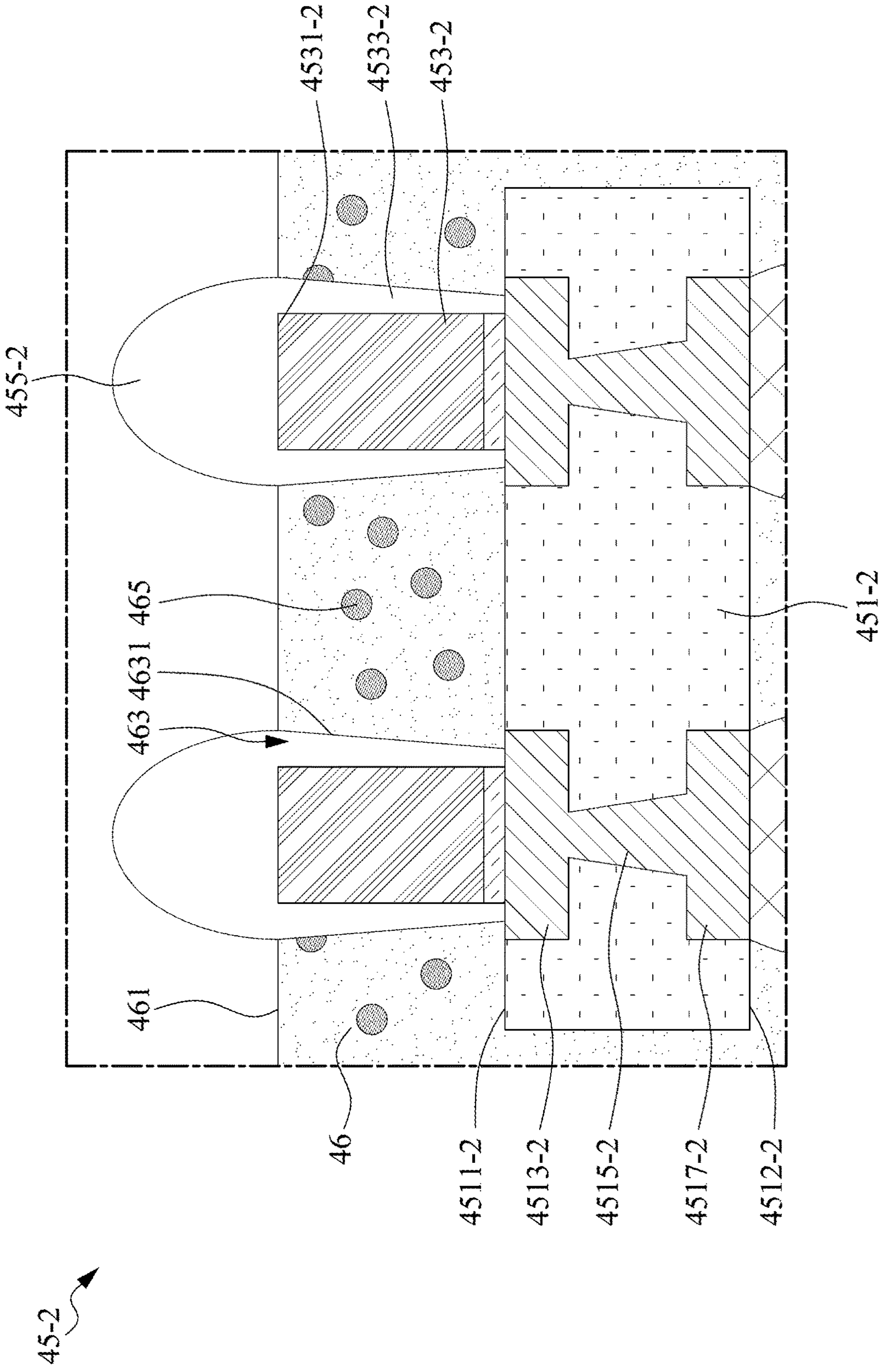
FIG. 4C is an enlarged view of portion "C" illustrated in FIG. 4A, which illustrates another embodiment of an intermediate structure.

FIG. 4C is an enlarged view of portion "C" illustrated in FIG. 4A. Especially, it illustrates an embodiment of the intermediate structure 45 as shown in FIG. 4A.

Referring to FIG. 4C, the intermediate structure 45-2 is an embodiment of the intermediate structure 45 shown in FIG. 4A. The intermediate structure 45-2 includes an interposer 451-2 and conductive elements 453-2. The interposer 451-2 has a surface 4511-2 (e.g., an upper surface) and a surface 4512-2 (e.g., a lower surface). In some embodiments of the present disclosure, the interposer 451-2 includes a substrate with an interconnection. In some embodiments of the present disclosure, the interconnection has a conductive pad 4513-2 adjacent to the surface 4511-2 of the interposer 451-2, a conductive pad 4517-2 adjacent to the surface 4512-2 of the interposer 451-2 and a conductive via 4515-2 configured to electrically connect the conductive pad 4513-2 and the conductive pad 4517-2. The conductive element 453-2 may be disposed or mounted on the surface 4511-2 of the interposer 451-2. The conductive element 453-2 may have an upper surface 4531-2 not covered by the encapsulant 46 and a lower surface 4532-2 abutting a solder material 457-2 on the conductive pad 4513-2 of the interposer 451-2. Thus, the conductive element 453-2 may be electrically connected to the conductive pad 4513-2 through the solder material 457-2. In some embodiments of the present disclosure, the conductive element 453-2 includes a pillar with non-reflowable material. In some embodiments of the present disclosure, the conductive element 453-2 includes a cupper (Cu) pillar.

As shown in FIG. 4C, the encapsulant 46 has an opening 463 and the conductive element 453-2 is arranged within the opening 463. In some embodiments of the present disclosure, the opening 463 is tapered from the surface 461 of the encapsulant 46 toward the surface 4511-2 of the interposer 451-2. Therefore, a distance between the adjacent openings 46 may become greater from the surface 461 of the encapsulant 46 toward the surface 4512-1 of the interposer 451-2. The conductive element 453-2 has a lateral surface 4533-2 spaced apart from a lateral surface 4631 of the opening 463. In some embodiments of the present disclosure, the encapsulant 46 includes a plurality of fillers 465. Further, the fillers 465 may include a truncated filler adjacent to or abutting the lateral surface 4631 of the opening 463.

Referring to FIG. 4C, the finish layer 455-2 covers the conductive element 453-2. In some embodiments of the present disclosure, the finish layer 455-2 includes solder material. In some embodiments of the present disclosure, the finish layer 455-2 surrounds the conductive element 453-2. In some embodiments of the present disclosure, the finish layer 455-2 covers the surface 4531-2 and the lateral surface 4533-2 of the conductive element 453-2 and the solder material 457-2. In some embodiments of the present disclosure, the finish layer 455-2 is filled with a space between the conductive element 453-2 and the opening 463.

In some embodiments of the present disclosure, the encapsulant 46 includes a cavity, which is the same as, or similar to the cavity 467 as shown in FIG. 4B. Thus, the finish layer 455-2 may be filled with the cavity, and such configuration may improve the adhesion between the encapsulant 46 and the finish layer 455-2.

Figure 5A:
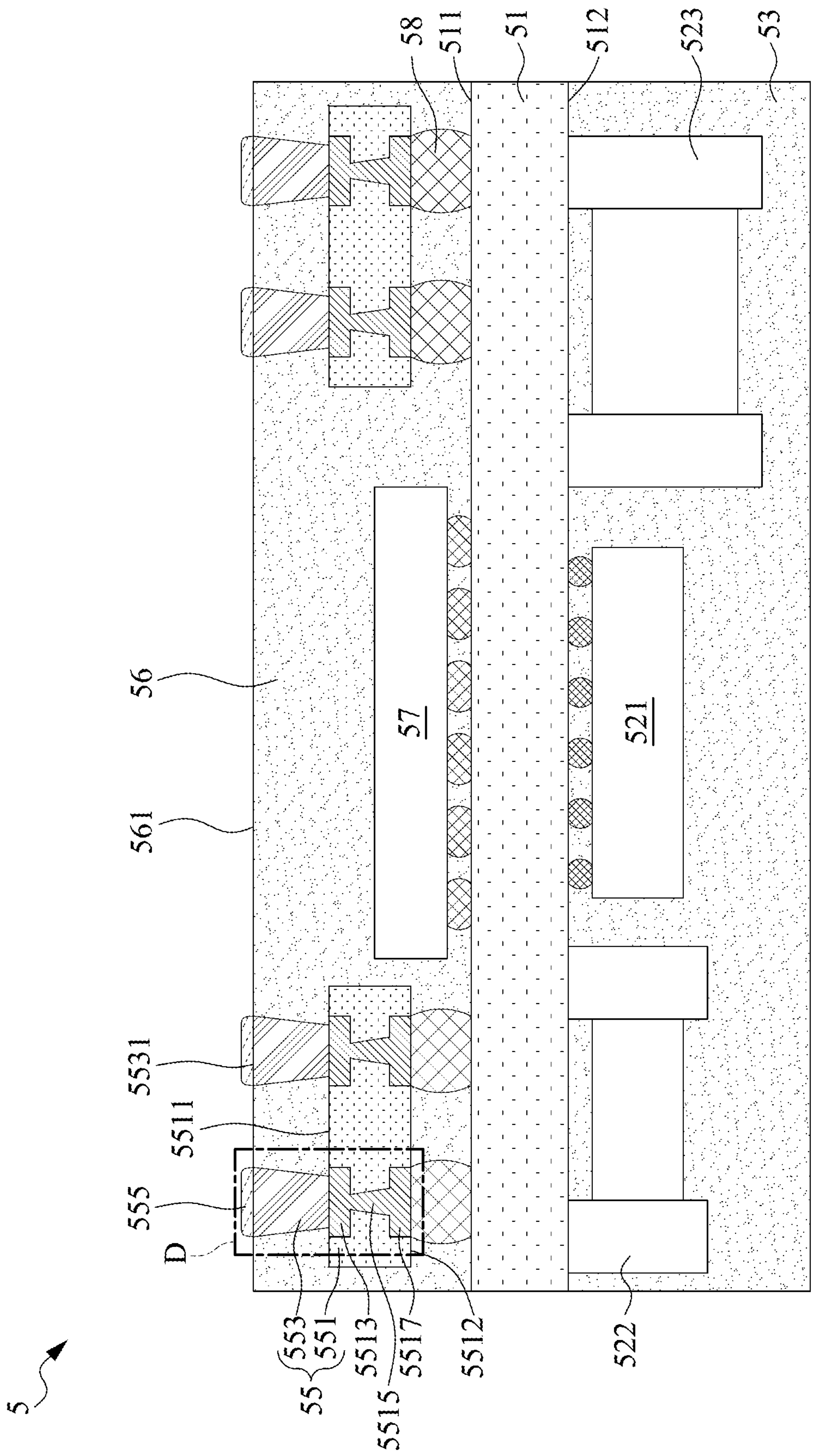
FIG. 5A is a cross-sectional view of a semiconductor device package in accordance with an embodiment of the instant disclosure.

FIG. 5A is a cross-sectional view of a semiconductor device package 5 in accordance with some embodiments of the present disclosure. As shown in FIG. 5A, the semiconductor device 5 includes a double side module (DSM). The semiconductor device 5 includes a carrier 51, electronic components 521, 522, 523 and 57, intermediate structures 55 and encapsulants 53 and 56. In some embodiments of the present disclosure, the carrier 51 includes a substrate, which may be a core substrate or a core-less substrate and may include traces, pads or interconnections for electrical connection. Referring to FIG. 5A, the carrier 51 has a surface 511 (e.g., an upper surface) and a surface 512 (e.g., a lower surface). The electronic components 521, 522 and 523 may be disposed or mounted on the surface 512 of the carrier 51. The electronic component 521 may be a die, an active device, a passive device, and/or other electronic devices. In some embodiments of the present disclosure, the electronic component 521 electrically connects the carrier 51 via electrical connections. The electronic components 522 and 523 may be a passive die such as capacitor. In some embodiments of the present disclosure, the electronic components 522 and 523 electrically connect the carrier 51. Further, the encapsulant 53 (i.e., a package body, a package layer, a protective layer) is disposed on the surface 512 of the carrier 51. The encapsulant 53 may cover the surface 512 of the carrier 51 and the electronic components 521, 522, 523 disposed on the surface 512 of the carrier 51. The encapsulant 53 may include molding compounds, such as a Novolac-based resin, an epoxy-based resin, a silicone-based resin, or other another suitable encapsulant; fillers such as silicon oxide fillers, may be included in the molding compound. In addition, the encapsulant 53 may include a molding underfill (MUF) or a capillary underfill (CUF).

As shown in FIG. 5A, the electronic component 57 may be disposed or mounted on the surface 511 of the carrier 51. Moreover, the electronic component 57 may be an active component, such as an integrated circuit (IC) die or a chip. In some embodiments of the present disclosure, the electronic component 57 has an active side facing the surface 511 and electrically connects the main carrier 51 via electrical connections.

Further, the intermediate structure 55 may be disposed or mounted on the surface 511 of the carrier 51. The intermediate structure 55 may include an interposer 551 and conductive elements 553. The interposer 551 has a surface 5511 (e.g., an upper surface) and a surface 5512 (e.g., a lower surface). In some embodiments of the present disclosure, the interposer 551 includes a substrate with an interconnection. In some embodiments of the present disclosure, the interconnection has a conductive pad 5513 adjacent to the surface 5511 of the interposer 551, a conductive pad 5517 adjacent to the surface 5512 of the interposer 551 and a conductive via 5515 configured to electrically connect the conductive pad 5513 and the conductive pad 5517. The conductive element 553 may be disposed or mounted on the surface 5511 of the interposer 551. The conductive element 553 may be electrically connected to the conductive pad 5513. In some embodiments of the present disclosure, the conductive element 553 includes a pillar with non-reflowable material. In some embodiments of the present disclosure, the conductive element 553 includes a cupper (Cu) pillar. In some embodiments of the present disclosure, the surface 5511 of the interposer 551 is substantially higher than the electronic component 57. That is, a lower surface of the conductive element 553 may be substantially higher than an upper surface of the electronic component 57.

In addition, a plurality of electrical connections 58 may be arranged between the surface 511 of the carrier 51 and the surface 5512 of the interposer 551 of the intermediate structure 55. In some embodiments of the present disclosure, the electrical connection 58 is connected to the conductive pad 5517 of the interposer 551. Thus, the intermediate structure 55 may be electrically to the carrier 51 through the electrical connections 58. In some embodiments of the present disclosure, the electrical connection 58 includes a reflowable material. In some embodiments of the present disclosure, the electrical connection 58 includes solder material. The electrical connection 58 may include a solder ball. In some embodiments of the present disclosure, the electrical connection 58 can be replaced with a conductive adhesive, such as an Ajinomoto buildup film (ABF). In some embodiments of the present disclosure, a height of the conductive element 553 is substantially greater than a height of the electrical connection 58. That is, a distance between the surface 561 of the encapsulant 56 and the surface 5511 of the interposer 551 may be greater than a distance between the surface 511 of the carrier 51 and the surface 5512 of the interposer 551. In some embodiments of the present disclosure, an electrical conductivity of the conductive element 553 is greater than an electrical conductivity of the electrical connection 58.

The encapsulant 56 (i.e., a package body, a package layer, a protective layer) is disposed on the surface 511 of the carrier 51. The encapsulant 56 may cover the surface 511 of the carrier 51, the intermediate structure 55 and the electronic component 57 disposed on the surface 511 of the carrier 51. The encapsulant 56 may include molding compounds, such as a Novolac-based resin, an epoxy-based resin, a silicone-based resin, or other another suitable encapsulant; fillers such as silicon oxide fillers, may be included in the molding compound. In addition, the encapsulant 56 may include a molding underfill (MUF) or a capillary underfill (CUF). The encapsulant 56 has a surface 561 (e.g., an upper surface) facing away from the surface 511 of the carrier 51 and covering the electronic component 57. The conductive element 553 may be exposed from the encapsulant 56. The conductive element 553 may have a surface 5531 (e.g., an upper surface) facing away from the surface 5511 of the interposer 551 and exposed from the surface 561 of the encapsulant 56. In some embodiments of the present disclosure, the surface 5531 of the conductive element 553 is substantially level with the surface 561 of the encapsulant 56. Thus, the conductive element 553 may be configured to be an I/O element of the semiconductor device package 5. Moreover, a finish layer 555 may cover the conductive element 553. In some embodiments of the present disclosure, the finish layer 555 is disposed on the surface 5531 of the conductive element 553. In some embodiments of the present disclosure, the finish layer 555 includes electroless nickel immersion gold (ENIG). In some embodiments of the present disclosure, the finish layer 555 includes pre-solder.

In some embodiments of the present disclosure, the semiconductor device package 5 includes a shielding layer, which may be the same as, or similar to the shielding layer 19 as shown in FIG. 1.

Figure 5B:
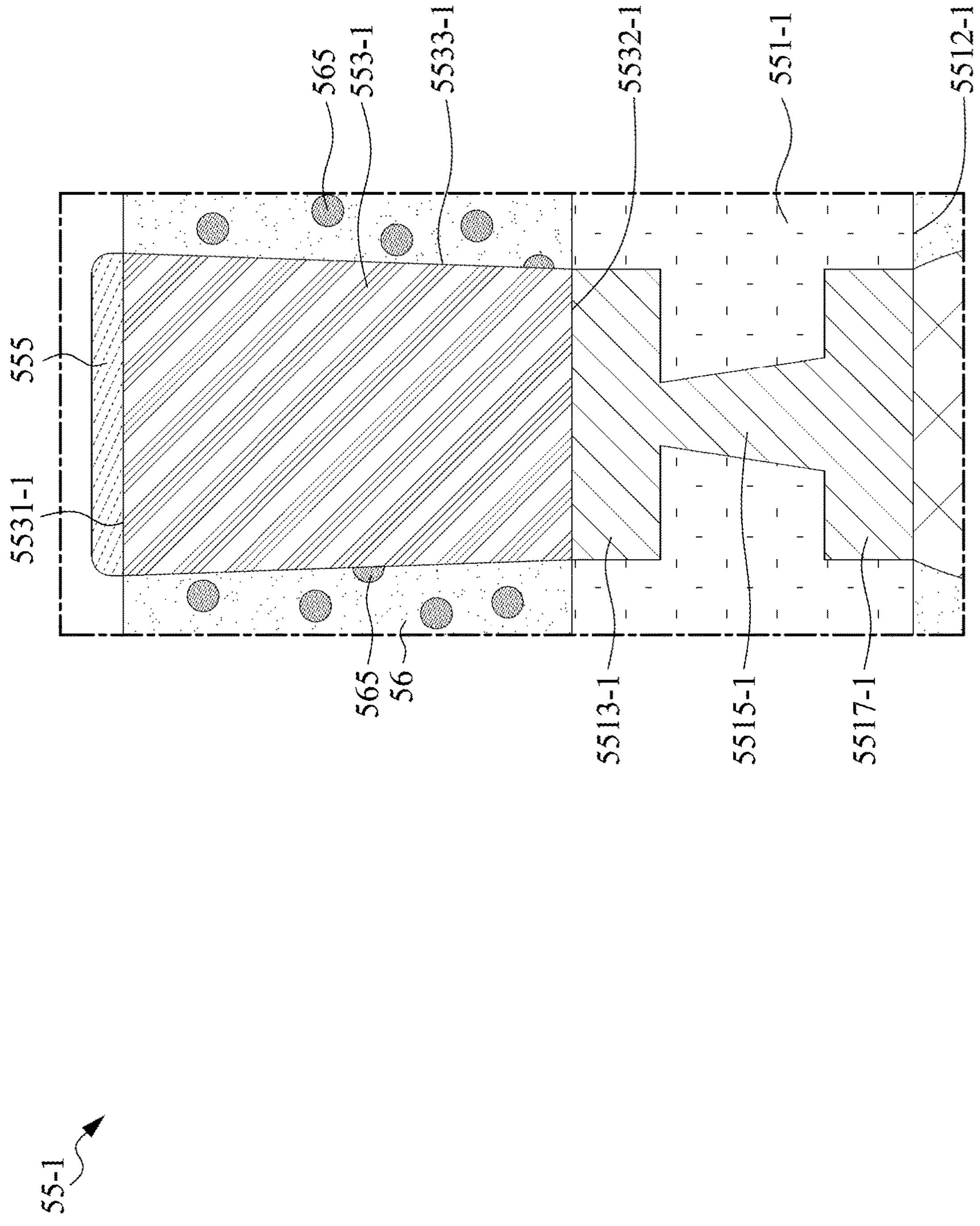
FIG. 5B is an enlarged view of portion "D" illustrated in FIG. 5A, which illustrates an embodiment of an intermediate structure.

FIG. 5B is an enlarged view of portion "D" illustrated in FIG. 5A. Especially, it illustrates an embodiment of the intermediate structure 55 as shown in FIG. 5A.

Referring to FIG. 5B, the intermediate structure 55-1 is an embodiment of the intermediate structure 55 shown in FIG. 5A. The intermediate structure 55-1 includes an interposer 551-1 and an conductive element 553-1. The interposer 551-1 has a surface 5511-1 (e.g., an upper surface) and a surface 5512-1 (e.g., a lower surface). In some embodiments of the present disclosure, the interposer 551-1 includes a substrate with an interconnection. In some embodiments of the present disclosure, the interconnection has a conductive pad 5513-1 adjacent to the surface 5511-1 of the interposer 551-1, a conductive pad 5517-1 adjacent to the surface 5512-1 of the interposer 551-1 and a conductive via 5515-1 configured to electrically connect the conductive pad 5513-1 and the conductive pad 5517-1. The conductive element 553-1 may be disposed or mounted on the surface 5511-1 of the interposer 551-1. The conductive element 553-1 may have an upper surface 5531-1 exposed from the (upper) surface 561 of the encapsulant 56 and a lower surface 5532-1 abutting the conductive pad 5513-1 of the interposer 551-1. Thus, the conductive element 553-1 may be electrically connected to the conductive pad 5513-1. In some embodiments of the present disclosure, the conductive element 553-1 includes a pillar with non-reflowable material. In some embodiments of the present disclosure, the conductive element 553-1 includes a cupper (Cu) pillar. In some embodiments of the present disclosure, the conductive pad 5513-1 electrically connected to the conductive element 553-1 includes a copper (Cu) material.

As shown in FIG. 5B, the conductive element 553-1 may be tapered from its lower surface 5532-1 toward its upper surface 5531-1. Further, the encapsulant 56 may include a plurality of fillers 565. Further, the fillers 565 may include a truncated filler adjacent to or abutting the lateral surface 5532-1 of the conductive element 553-1.

Figure 5C:
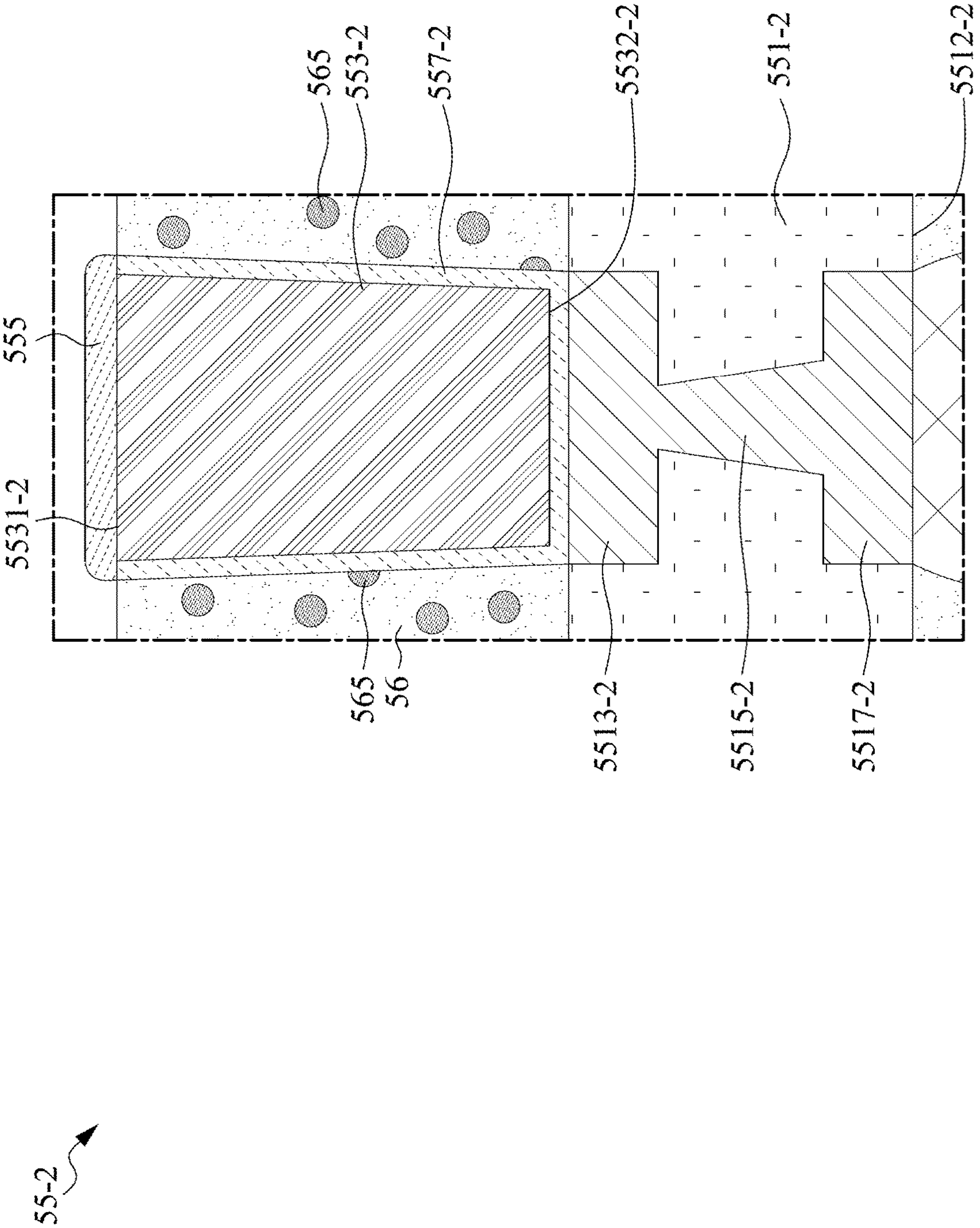
FIG. 5C is an enlarged view of portion "D" illustrated in FIG. 5A, which illustrates another embodiment of an intermediate structure.

FIG. 5C is an enlarged view of portion "D" illustrated in FIG. 5A. Especially, it illustrates an embodiment of the intermediate structure 55 as shown in FIG. 5A.

Referring to FIG. 5C, the intermediate structure 55-2 is an embodiment of the intermediate structure 55 shown in FIG. 5A. The intermediate structure 55-2 includes an interposer 551-2 and an conductive element 553-2. The interposer 551-2 has a surface 5511-2 (e.g., an upper surface) and a surface 5512-2 (e.g., a lower surface). In some embodiments of the present disclosure, the interposer 551-2 includes a substrate with an interconnection. In some embodiments of the present disclosure, the interconnection has a conductive pad 5513-2 adjacent to the surface 5511-2 of the interposer 551-2, a conductive pad 5517-2 adjacent to the surface 5512-2 of the interposer 551-2 and a conductive via 5515-2 configured to electrically connect the conductive pad 5513-2 and the conductive pad 5517-2. The conductive element 553-2 may be disposed or mounted on the surface 5511-2 of the interposer 551-2. The conductive element 553-2 may have an upper surface 5531-2 exposed from the (upper) surface 561 of the encapsulant 56 and a lower surface 5532-2 adjacent to the conductive pad 5513-2 of the interposer 551-2. The conductive element 553-2 may be electrically connected to the conductive pad 5513-2. In some embodiments of the present disclosure, the conductive element 553-2 includes a pillar with non-reflowable material. In some embodiments of the present disclosure, the conductive element 553-2 includes a cupper (Cu) pillar. In some embodiments of the present disclosure, the conductive pad 5513-2 electrically connected to the conductive element 553-2 includes a gold (Au) material, a titanium (Ti) material, an aluminum (Al) material or a tantalum (Ta) material. Referring to FIG. 5C, a seed layer 557-2 formed between the conductive element 553-2 and the conducive pad 5513-2 and between the conductive element 553-2 and the encapsulant 56. The seed layer 557-2 may surround or be arranged around the conductive element 553-2.

As shown in FIG. 5C, the conductive element 553-2 may be tapered from its lower surface 5532-2 toward its upper surface 5531-2. Further, the encapsulant 56 may include a plurality of fillers 565. Further, the fillers 565 may include a truncated filler adjacent to or abutting the seed layer 557-2.

FIG. 6A, FIG. 6B, FIG. 6C, FIG. 6D, FIG. 6E, FIG. 6F, FIG. 6G, FIG. 6H, FIG. 6I and FIG. 6J illustrate a method of manufacturing a semiconductor device package in accordance with another embodiment of the instant disclosure.

Figure 6A:
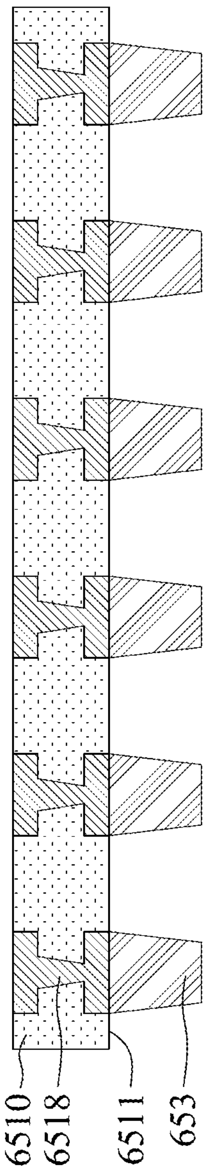
FIG. 6A, FIG. 6B, FIG. 6C, FIG. 6D, FIG. 6E, FIG. 6F, FIG. 6G, FIG. 6H, FIG. 6I and FIG. 6J illustrate a method of manufacturing a semiconductor device package in accordance with another embodiment of the instant disclosure.

Referring to FIG. 6A, a substrate 6510 with a plurality of conductive elements 653 is provided. The substrate 6510 may include an interconnection 6518. The conductive elements 653 may be disposed or mounted on a surface 6511 of the substrate 6510 and electrically connected to the interconnection 6518 of the substrate 6510. In some embodiments of the present disclosure, the conductive element 653 includes a copper pillar.

Figure 6B:
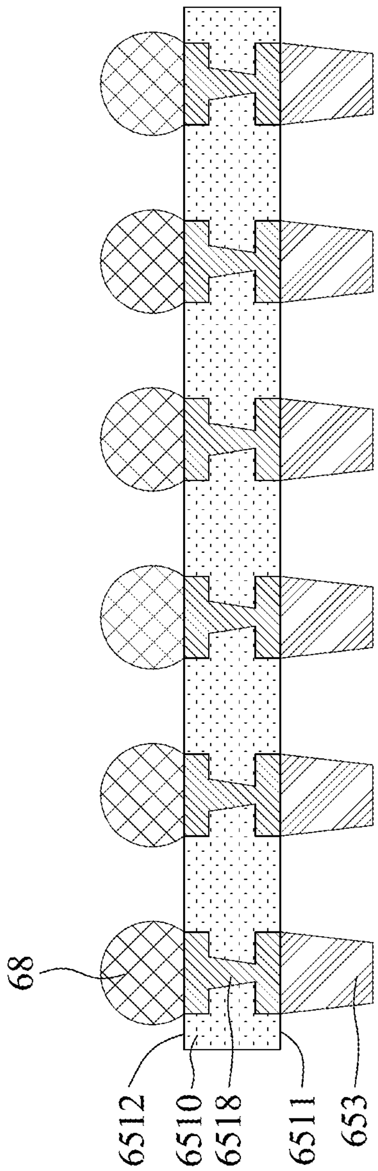

Referring to FIG. 6B, a plurality of electrical connections 68 are disposed or mounted on a surface 6512 of the substrate 6510. The electrical connections 68 may be electrically connected to the interconnection 6518 of the substrate 6510. In some embodiments of the present disclosure, the electrical connection 68 includes a solder ball.

Figure 6C:
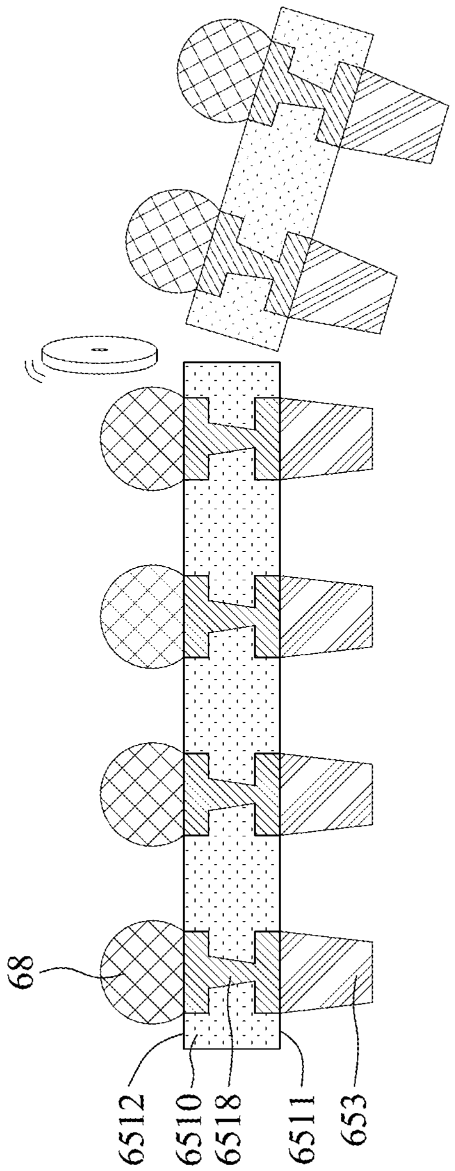

Referring to FIG. 6C, the substrate 6510 is cut, by e.g., laser or blade sawing technology to form an interposer 651 with the conductive elements 653 and the electrical connections 68.

Figure 6D:
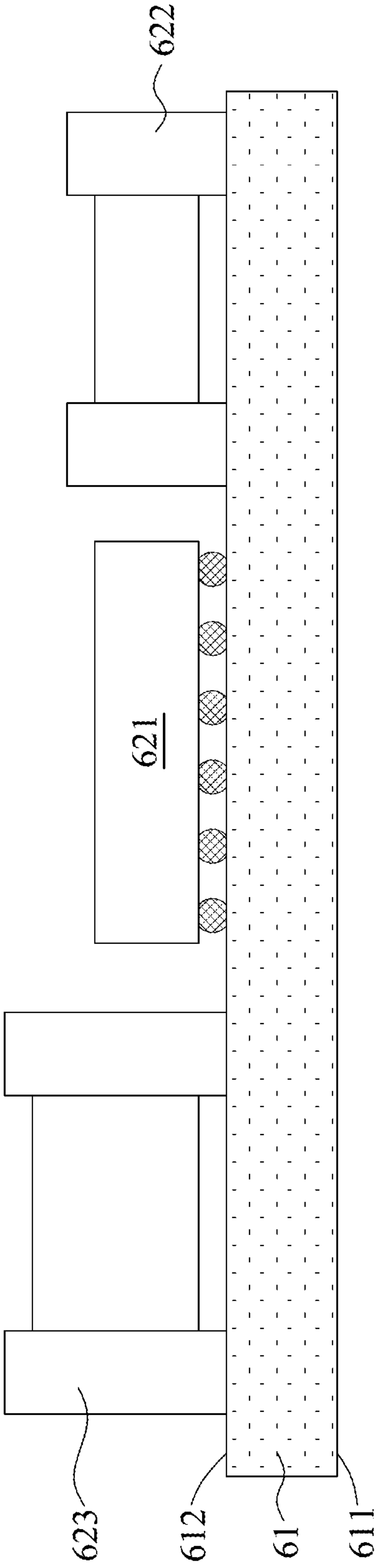

Referring to FIG. 6D, a carrier 61 and electronic components 621, 622 and 623 are provided. The electronic components 621, 622 and 623 are disposed or mounted on a surface 612 of the carrier 61. In some embodiments of the present disclosure, the carrier 61 includes a substrate. In some embodiments of the present disclosure, the electronic components 621, 622 and 623 include a die, an active device, a passive device, and/or other electronic devices. In some embodiments of the present disclosure, the electronic components 621, 622 and 623 electrically connects the carrier 61 via electrical connections.

Figure 6E:
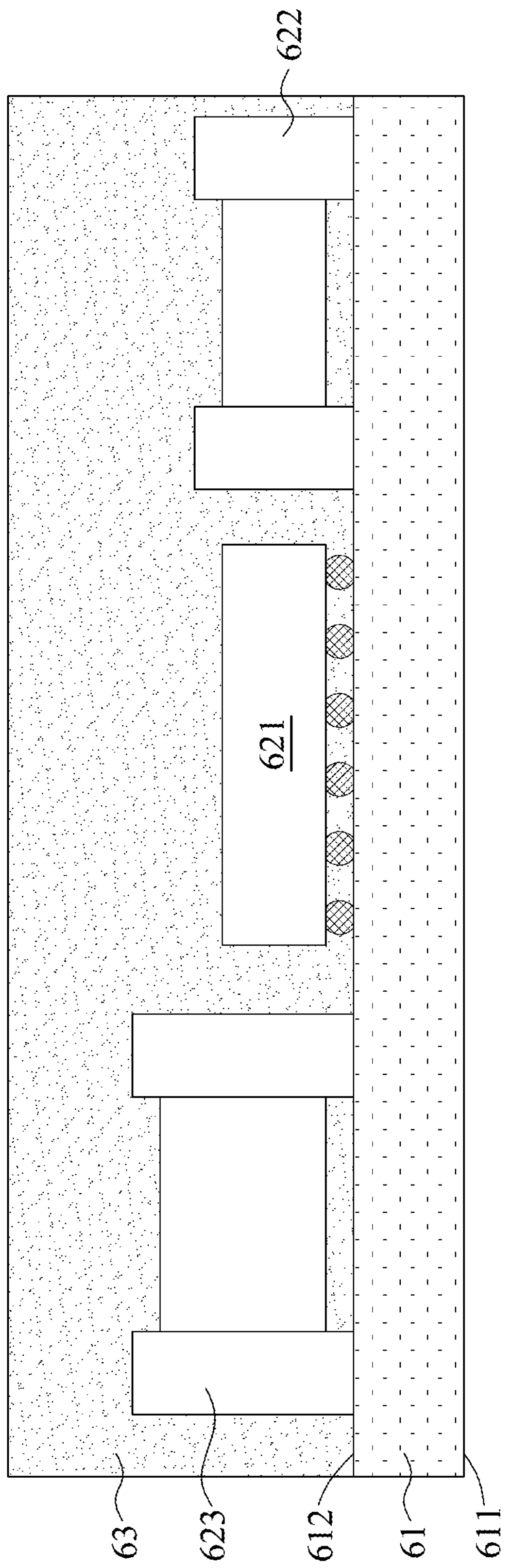

Referring to FIG. 6E, an encapsulant 63 is formed on the surface 612 of the carrier 61. The encapsulant 63 may cover the surface 612 and the electronic components 621, 622 and 623.

Figure 6F:
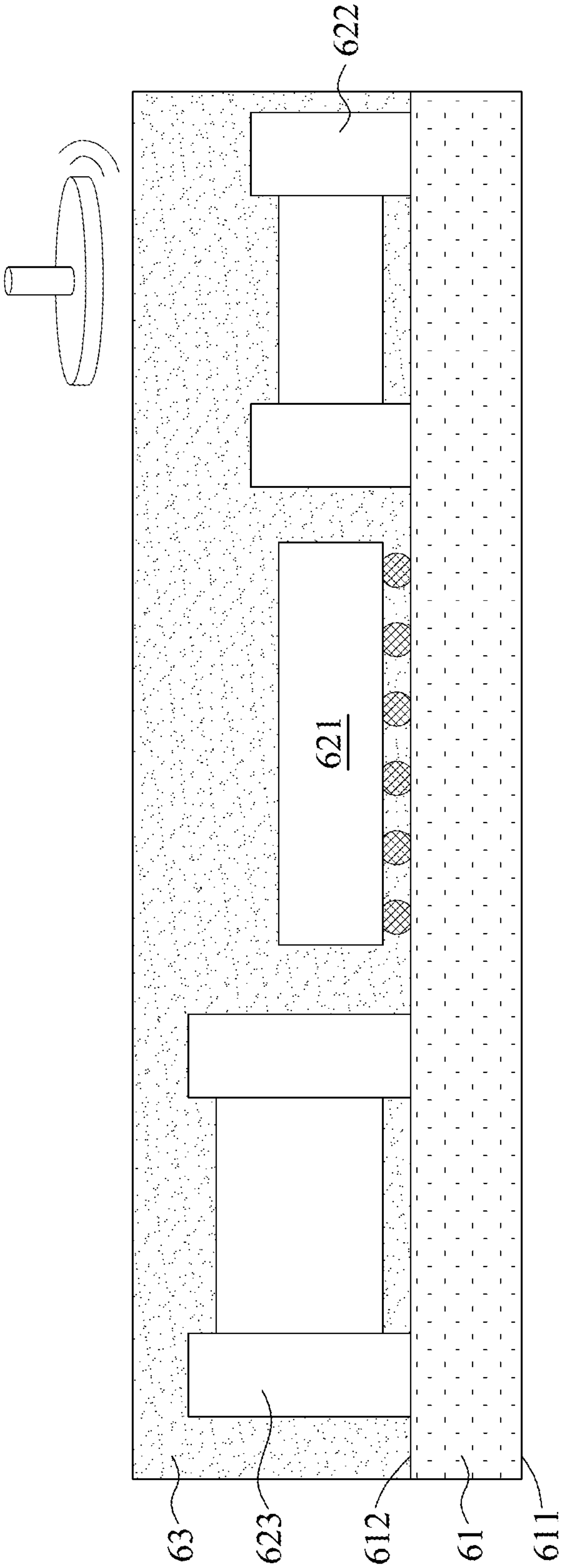

Referring to FIG. 6F, a (upper) portion of the encapsulant 63 is removed by, for example, a grinding operation, so that the upper surface of the encapsulant 63 could be planarized.

Figure 6G:
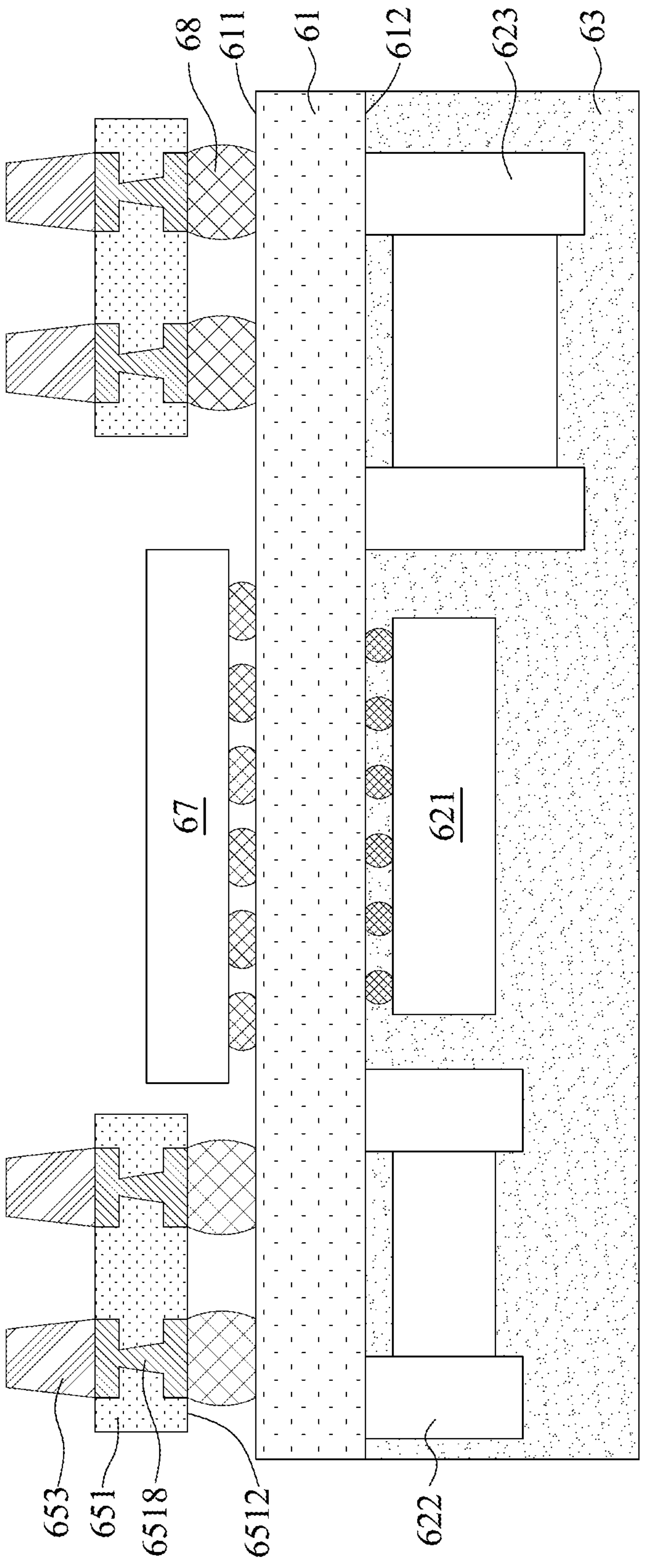

Referring to FIG. 6G, the interposers 651 and the conductive elements 653 and the electrical connections 68, which may be formed in the process as illustrated in FIGS. 6A, 6B and 6C, are disposed or mounted on a surface 611 of the carrier 61. The interposers 651 and the conductive elements 653 may be electrically connected to the carrier 61 via the electrical connections 68. Further, a electronic component 67 is disposed or mounted on a surface 611 of the carrier 61. The electronic component 67 may be an active component, such as an integrated circuit (IC) die or a chip. In some embodiments of the present disclosure, the electronic component 67 has an active side facing the surface 611 and electrically connects the main carrier 61 via electrical connections.

Figure 6H:
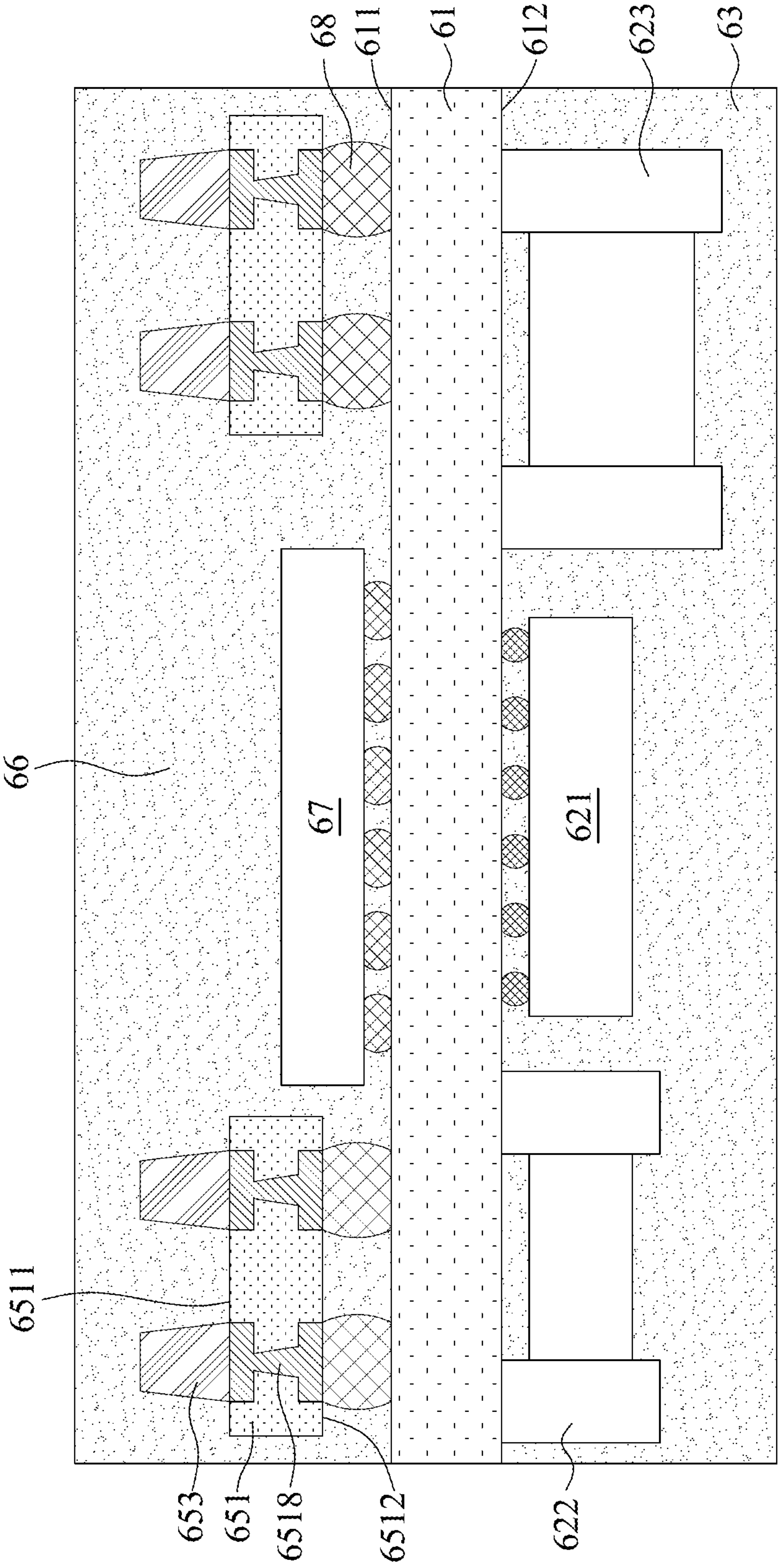

Referring to FIG. 6H, an encapsulant 66 is formed on the surface 611 of the carrier 61. The encapsulant 66 may cover the surface 611 and the interposer 651, the conductive elements 653 and the electrical connections 68 and the electronic component 67.

Figure 6I:
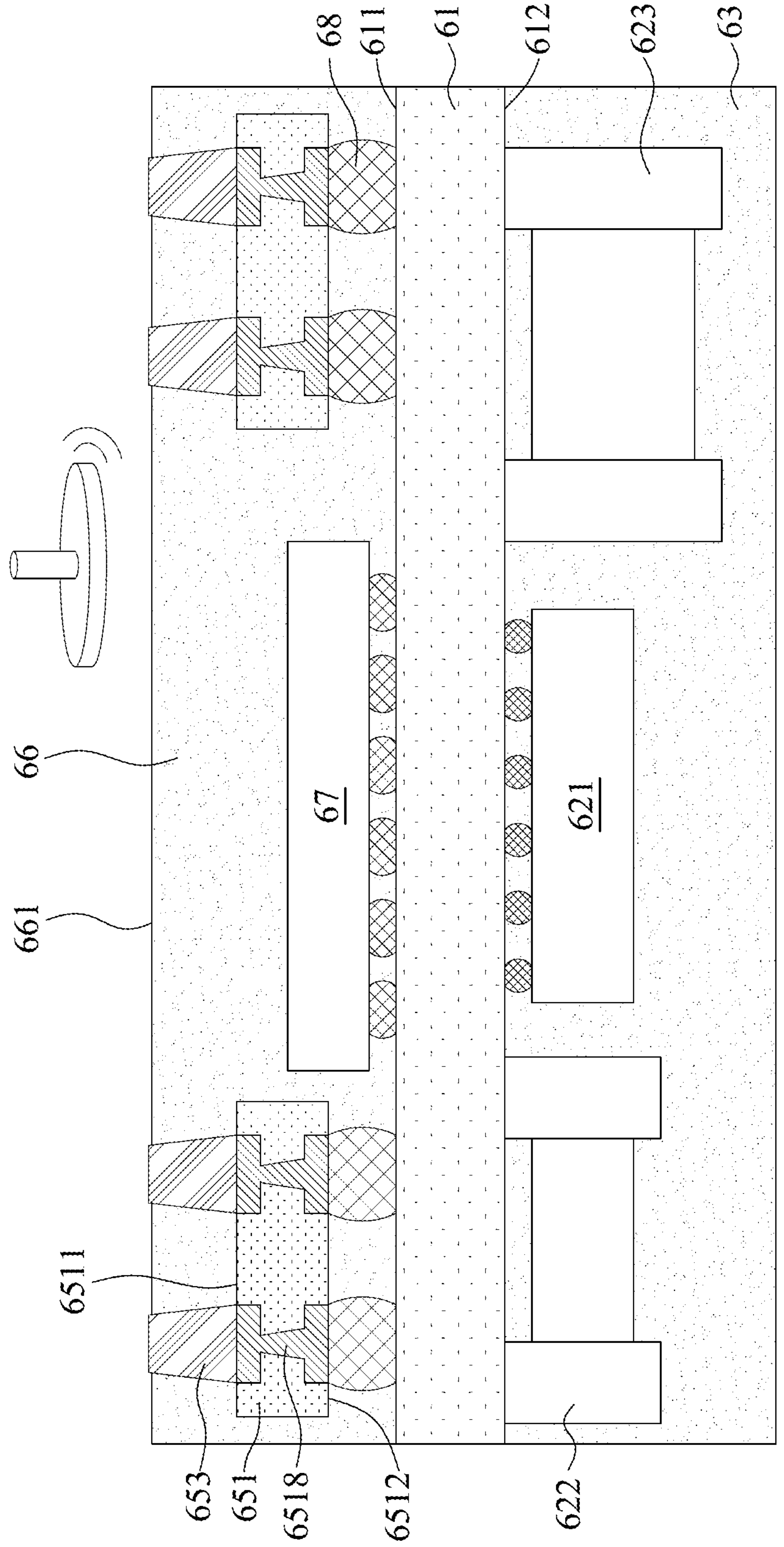

Referring to FIG. 6I, a (upper) portion of the encapsulant 66 is removed by, for example, a grinding operation, so that the encapsulant 66 has a planarized upper surface 661 and the conductive elements 653 are exposed from the upper surface 661 of the encapsulant 66. In some embodiments of the present disclosure, an upper surface of the conductive 653 is substantially coplanar with the upper surface 661 of the encapsulant 66.

Figure 6J:
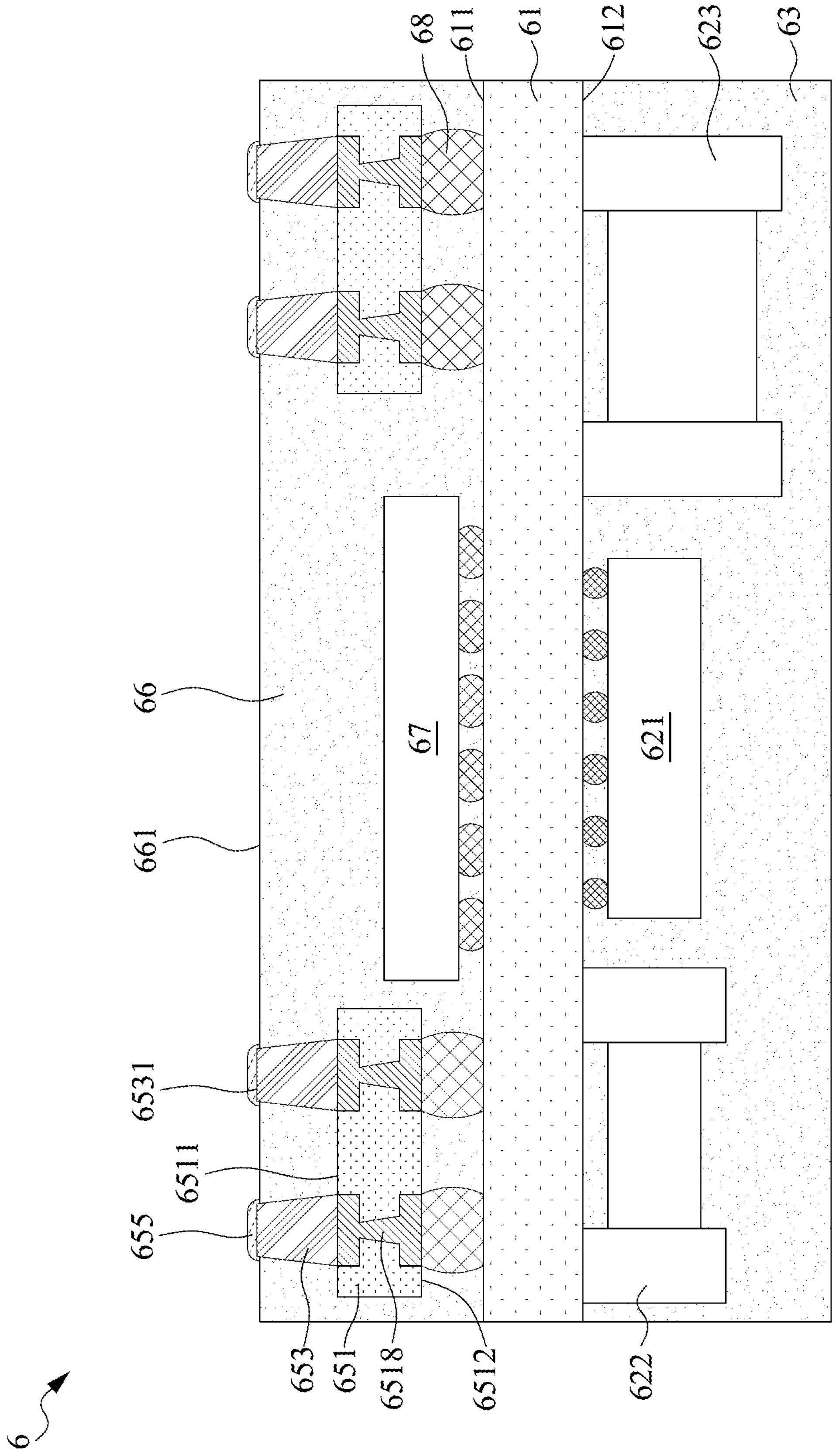

Referring to FIG. 6J, a finish layer 655 is provided on the conductive element 653. The finish layer 655 is configured to cover or encapsulate the portion of the conductive element 653 which is exposed from the encapsulant 66. In some embodiments of the present disclosure, the finish layer 655 includes electroless nickel immersion gold (ENIG). In some embodiments of the present disclosure, the finish layer 655 includes pre-solder.

After the manufacturing process as shown in FIG. 6A, FIG. 6B, FIG. 6C, FIG. 6D, FIG. 6E, FIG. 6F, FIG. 6G, FIG. 6H, FIG. 6I and FIG. 6J, the semiconductor device package 6 is formed (see FIG. 6J). In some embodiments of the present disclosure, the semiconductor device package 6 is the same as, or similar to, the semiconductor device package 2 shown in FIG. 2A.

FIG. 7A, FIG. 7B, FIG. 7C, FIG. 7D, FIG. 7E, FIG. 7F, FIG. 7G, FIG. 7H, FIG. 7I, FIG. 7J and FIG. 7K illustrate a method of manufacturing a semiconductor device package in accordance with another embodiment of the instant disclosure.

Figure 7A:
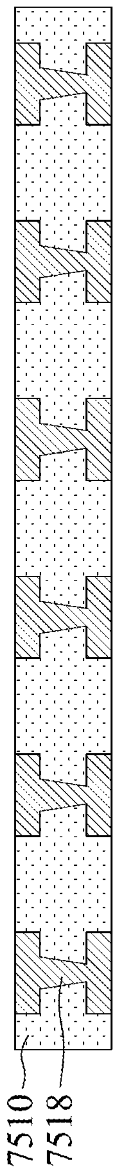
FIG. 7A, FIG. 7B, FIG. 7C, FIG. 7D, FIG. 7E, FIG. 7F, FIG. 7G, FIG. 7H, FIG. 7I, FIG. 7J and FIG. 7K illustrate a method of manufacturing a semiconductor device package in accordance with another embodiment of the instant disclosure.

Referring to FIG. 7A, a substrate 7510 is provided. The substrate 7510 may include an interconnection 7518.

Figure 7B:
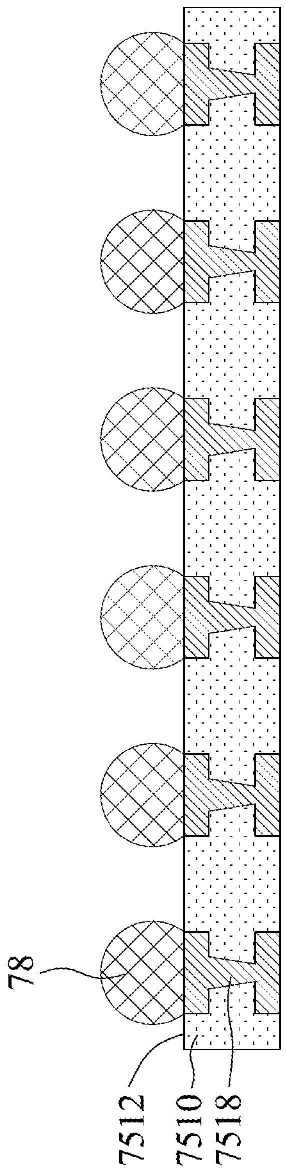

Referring to FIG. 7B, a plurality of electrical connections 78 are disposed or mounted on a surface 7512 of the substrate 7510. The electrical connections 78 may be electrically connected to the interconnection 7518 of the substrate 7510. In some embodiments of the present disclosure, the electrical connection 78 includes a solder ball.

Figure 7C:
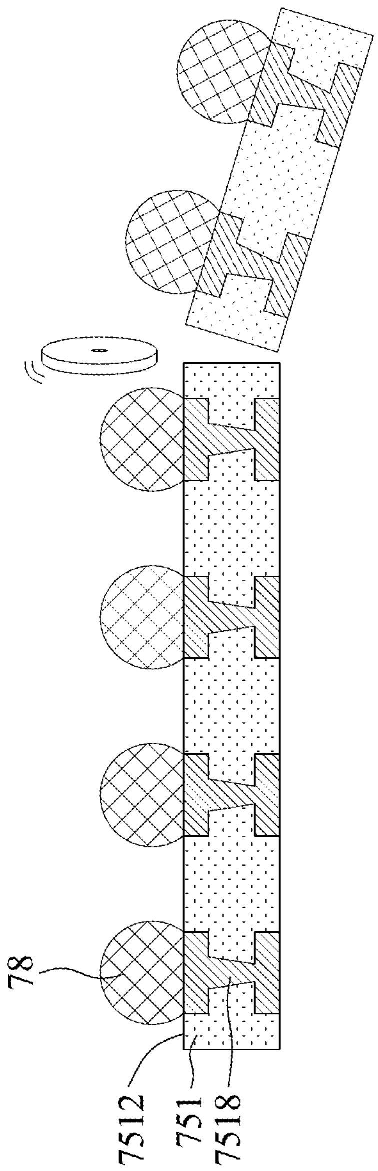

Referring to FIG. 7C, the substrate 7510 is cut, by e.g., laser or blade sawing technology to form an interposer 751 with the electrical connections 78.

Figure 7D:
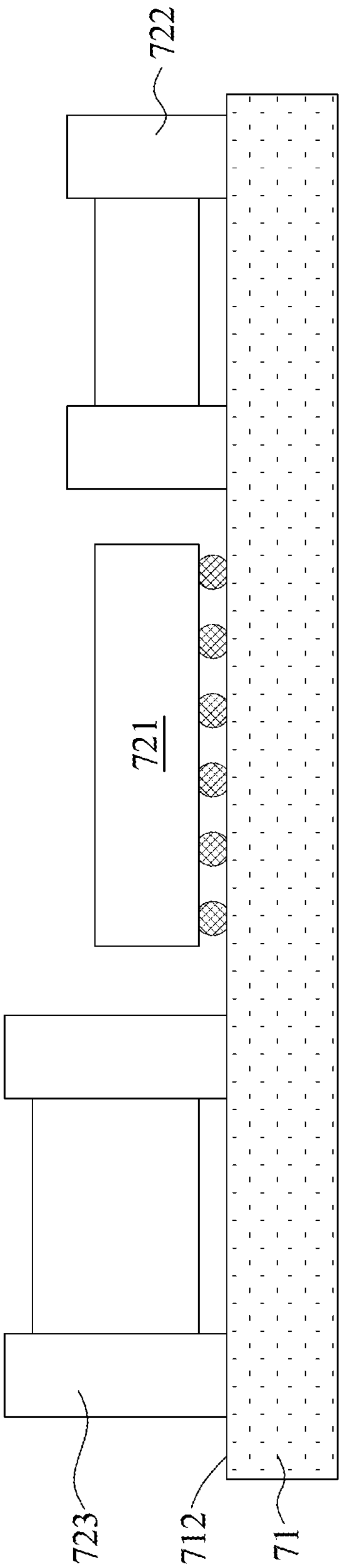

Referring to FIG. 7D, a carrier 71 and electronic components 721, 722 and 723 are provided. The electronic components 721, 722 and 723 are disposed or mounted on a surface 712 of the carrier 71. In some embodiments of the present disclosure, the carrier 71 includes a substrate. In some embodiments of the present disclosure, the electronic components 721, 722 and 723 include a die, an active device, a passive device, and/or other electronic devices. In some embodiments of the present disclosure, the electronic components 721, 722 and 723 electrically connects the carrier 71 via electrical connections.

Figure 7E:
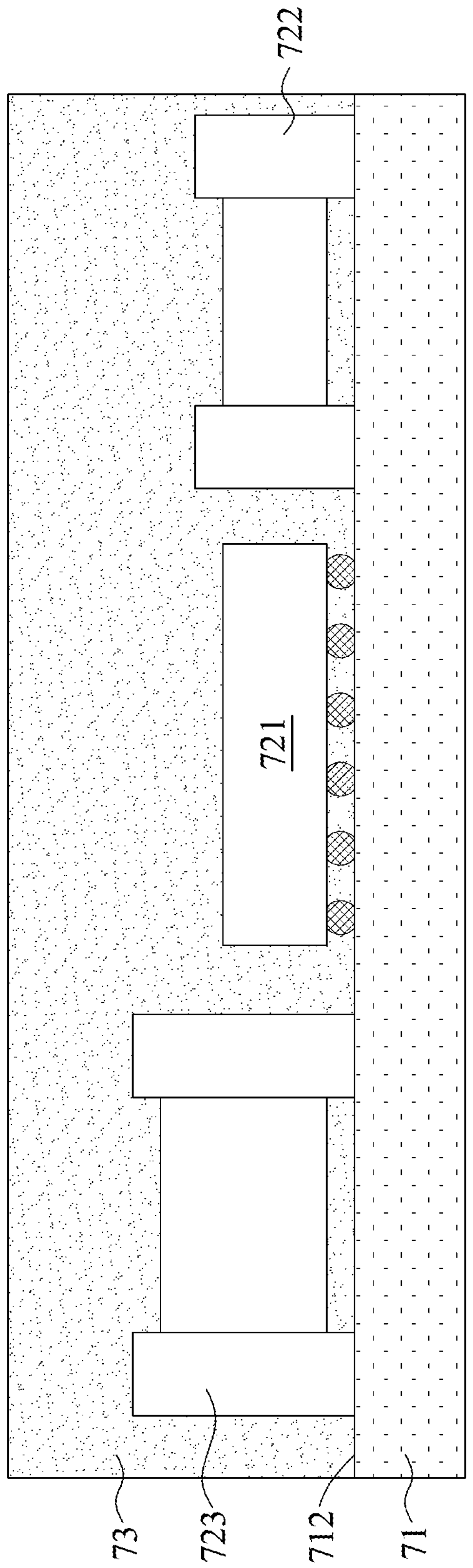

Referring to FIG. 7E, an encapsulant 73 is formed on the surface 712 of the carrier 71. The encapsulant 73 may cover the surface 712 and the electronic components 721, 722 and 723.

Figure 7F:
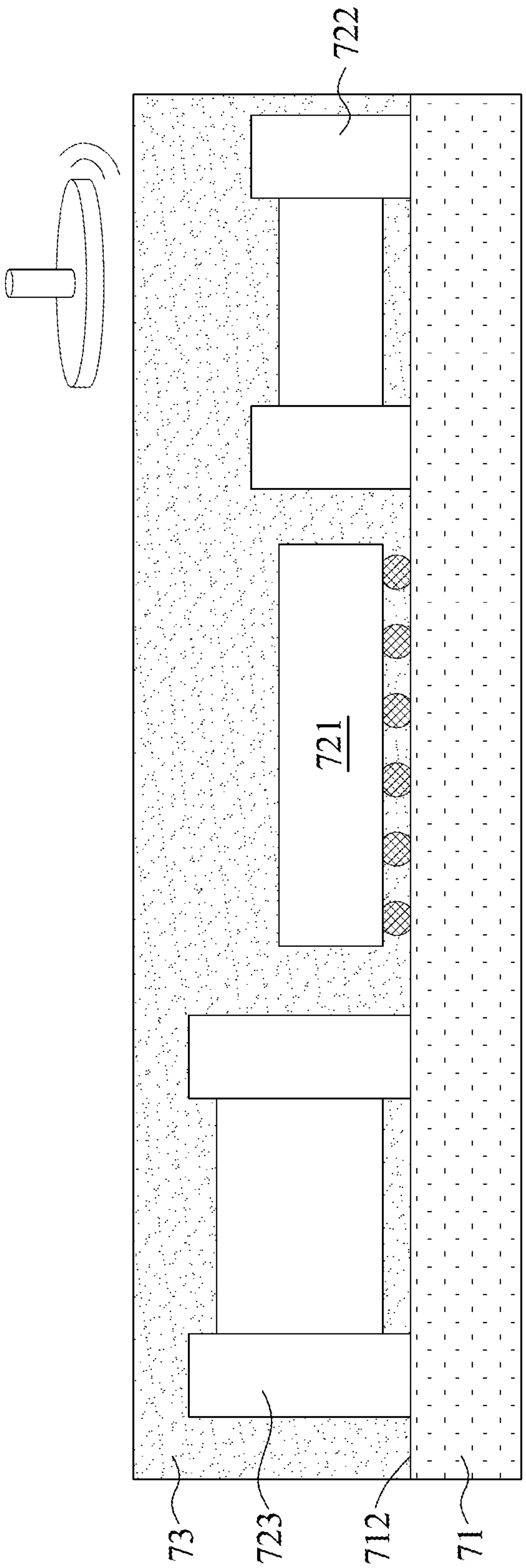

Referring to FIG. 7F, a (upper) portion of the encapsulant 73 is removed by, for example, a grinding operation, so that the upper surface of the encapsulant 73 could be planarized.

Figure 7G:
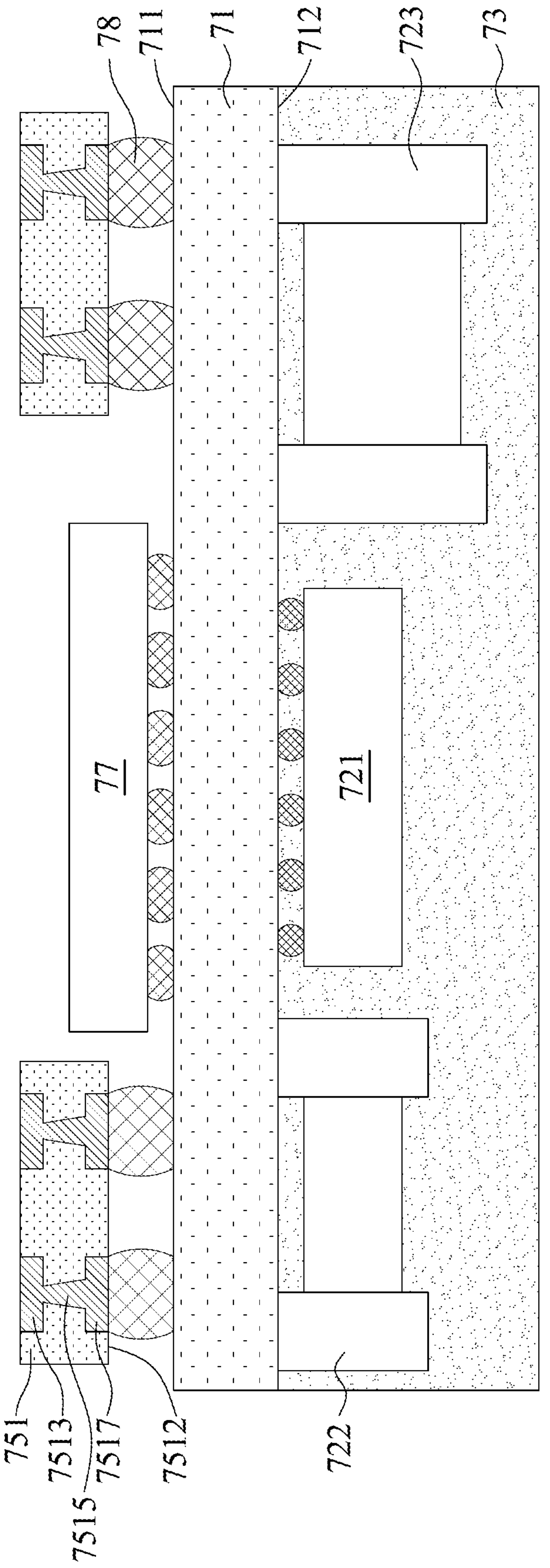

Referring to FIG. 7G, the interposers 751 and the electrical connections 78, which may be formed in the process as illustrated in FIGS. 7A, 7B and 7C, are disposed or mounted on a surface 711 of the carrier 71. The interposers 751 may be electrically connected to the carrier 71 via the electrical connections 78. Further, an electronic component 77 is disposed or mounted on a surface 711 of the carrier 71. The electronic component 77 may be an active component, such as an integrated circuit (IC) die or a chip. In some embodiments of the present disclosure, the electronic component 77 has an active side facing the surface 711 and electrically connects the main carrier 71 via electrical connections.

Figure 7H:
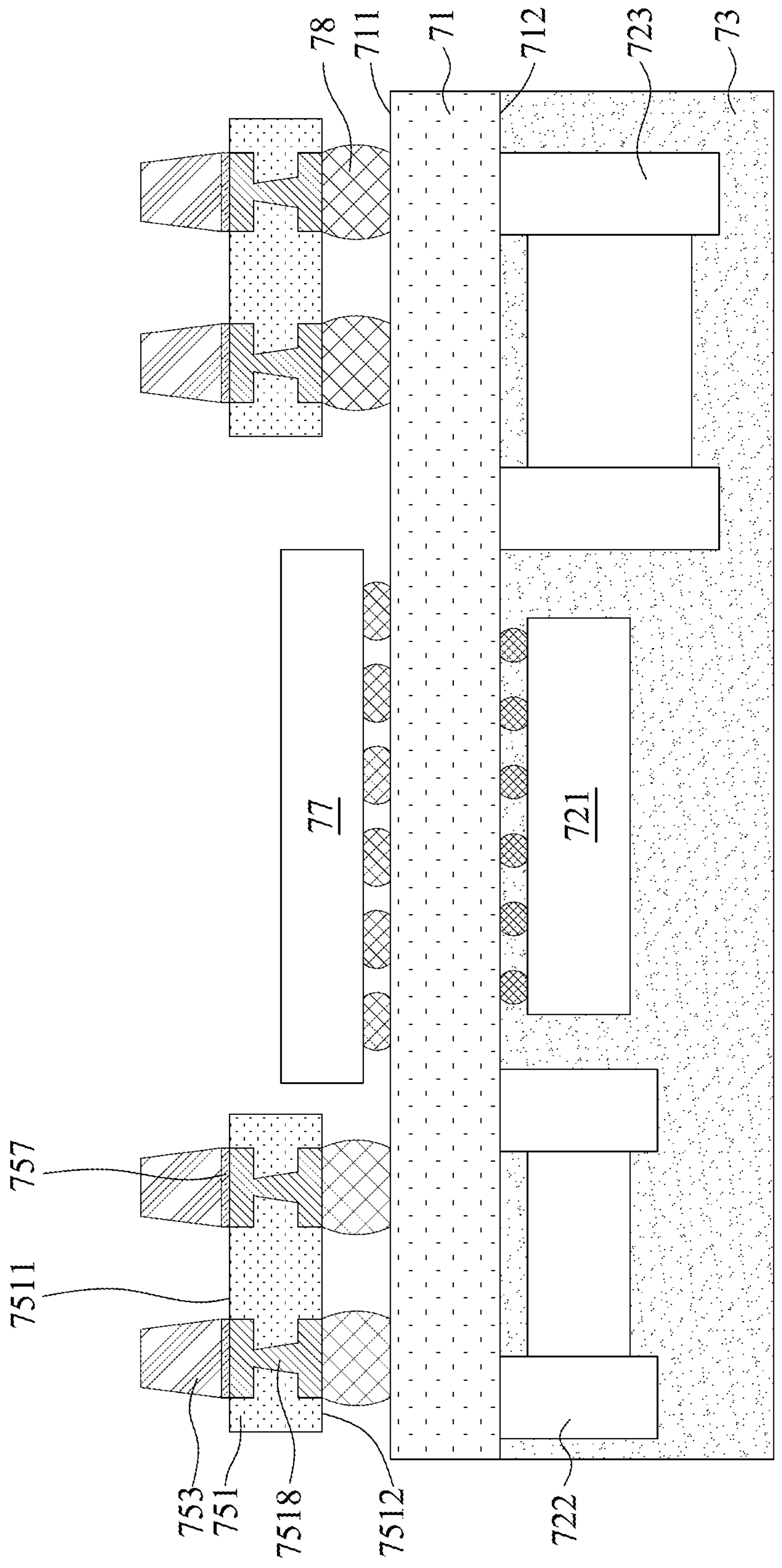

Referring to FIG. 7H, a plurality of conductive elements 753 are provided. The conductive elements 753 may be disposed or mounted on a surface 7511 of the interposer 751 and electrically connected to the interconnection 7518 of the interposer 751. In some embodiments of the present disclosure, the conductive element 753 includes a copper pillar. In some embodiments of the present disclosure, a solder material 757 is arranged between the conductive element 753 and the interconnection 7518 of the interposer 751. That is, the conductive element 753 may be mount on the interposer 751 through the solder material 751.

Figure 7I:
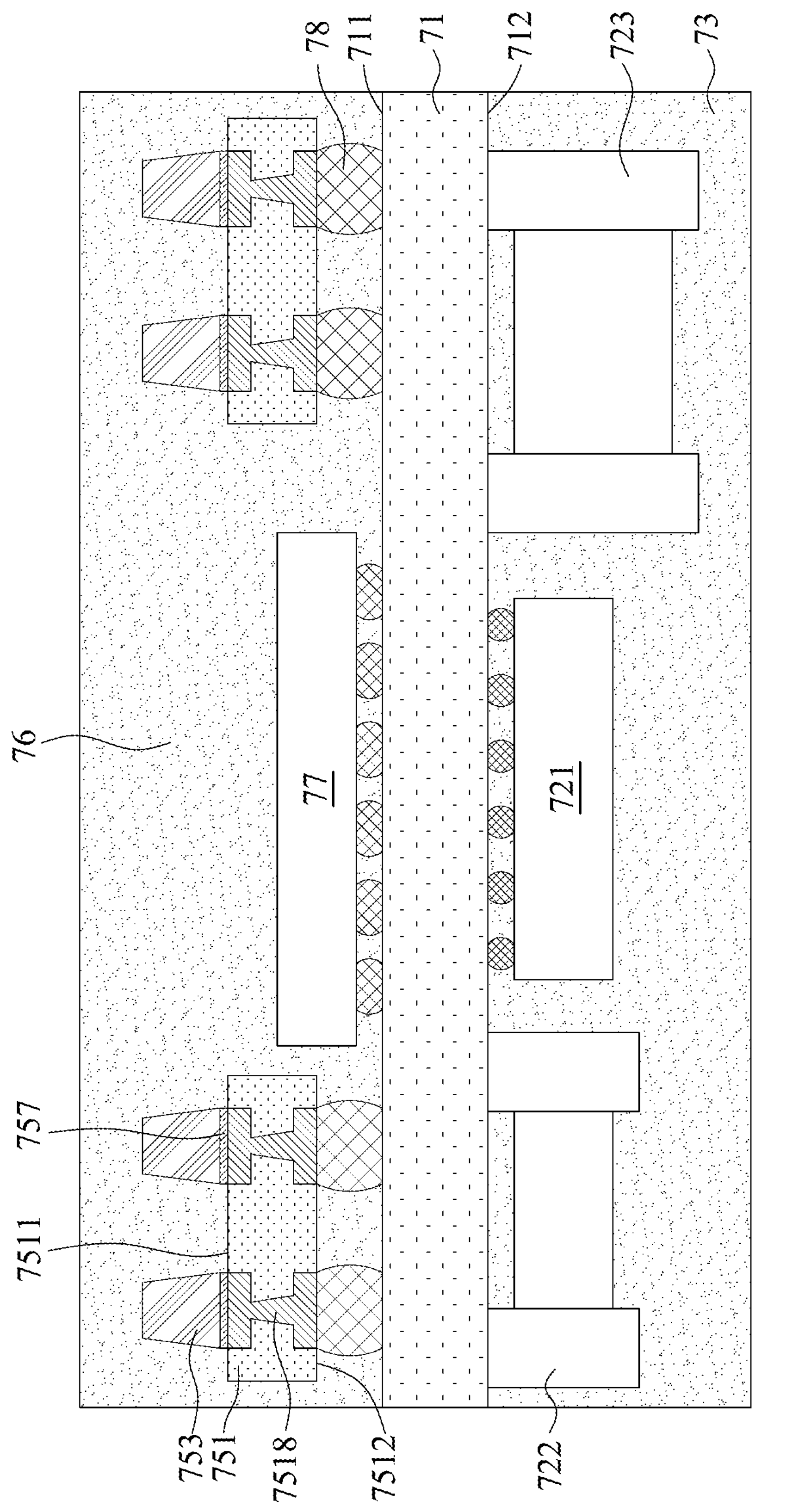

Referring to FIG. 7I, an encapsulant 76 is formed on the surface 711 of the carrier 71. The encapsulant 76 may cover the surface 711 and the interposer 751, the conductive elements 753 and 78 and the electronic component 77.

Figure 7J:
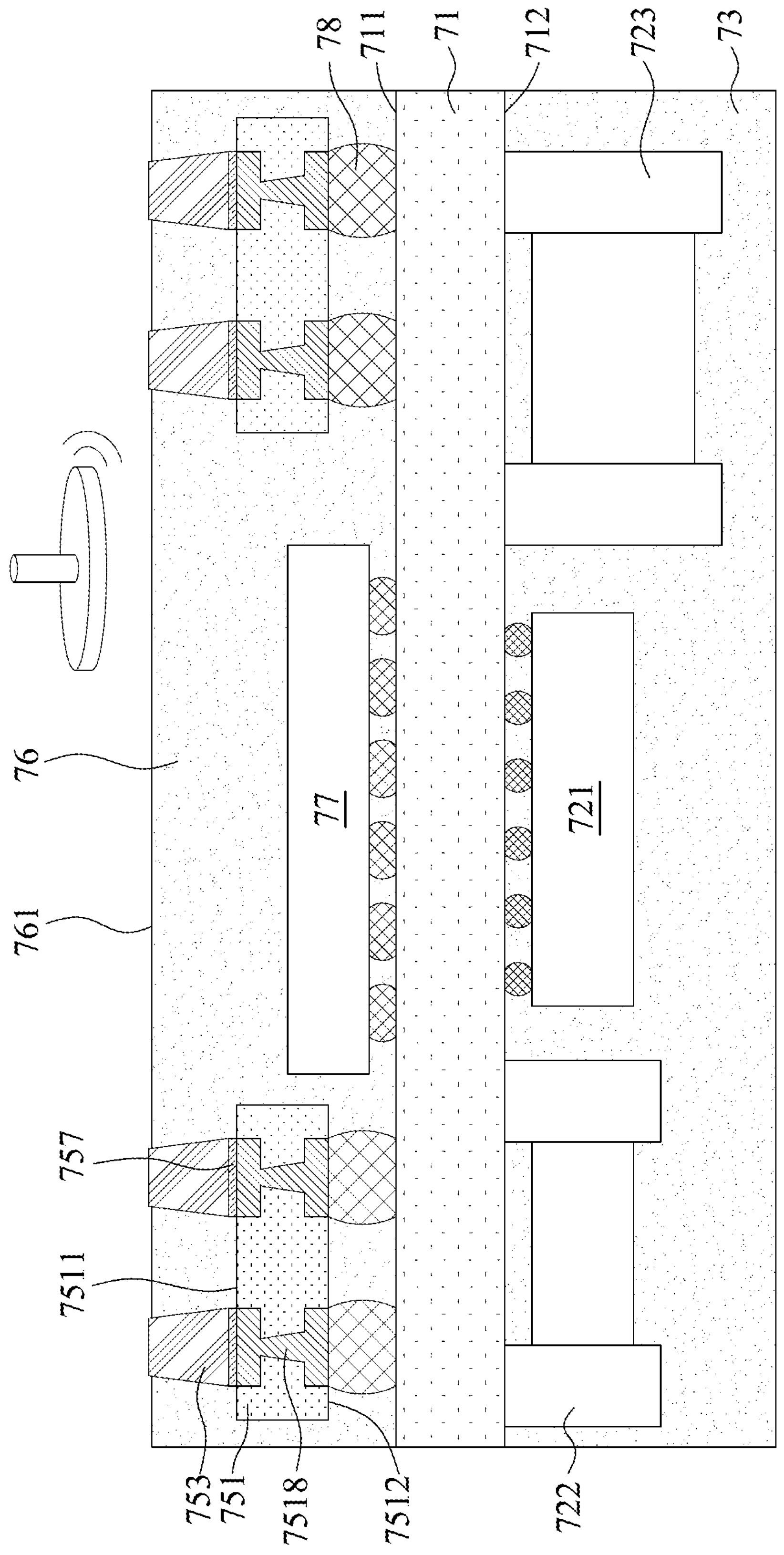

Referring to FIG. 7J, a (upper) portion of the encapsulant 76 is removed by, for example, a grinding operation, so that the encapsulant 76 has a planarized upper surface 761 and the conductive elements 753 are exposed from the upper surface 761 of the encapsulant 76.

Figure 7K:
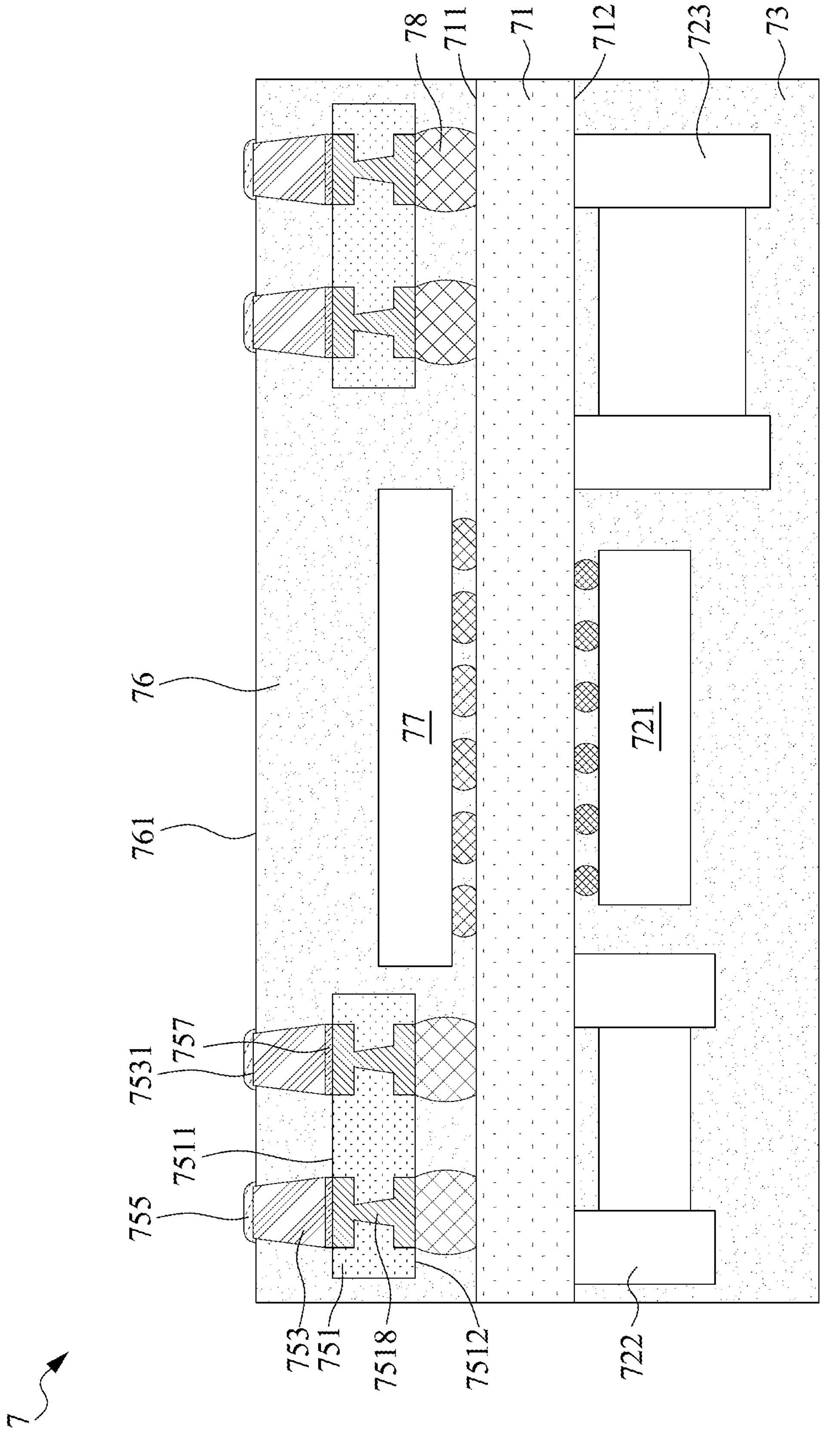

Referring to FIG. 7K, a finish layer 755 is provided on the conductive element 753. The finish layer 755 is configured to cover or encapsulate the portion of the conductive element 753 which is exposed from the encapsulant 76. In some embodiments of the present disclosure, the finish layer 755 includes electroless nickel immersion gold (ENIG). In some embodiments of the present disclosure, the finish layer 755 includes pre-solder.

After the manufacturing process as shown in FIG. 7A, FIG. 7B, FIG. 7C, FIG. 7D, FIG. 7E, FIG. 7F, FIG. 7G, FIG. 7H, FIG. 7I, FIG. 7J and FIG. 7K, the semiconductor device package 7 is formed (see FIG. 7K). In some embodiments of the present disclosure, the semiconductor device package 7 is the same as, or similar to, the semiconductor device package 3 shown in FIG. 3A.

FIG. 8A, FIG. 8B, FIG. 8C, FIG. 8D, FIG. 8E, FIG. 8F, FIG. 8G, FIG. 8H, FIG. 8I, FIG. 8J, FIG. 8K and FIG. 8L illustrate a method of manufacturing a semiconductor device package in accordance with another embodiment of the instant disclosure.

Figure 8A:
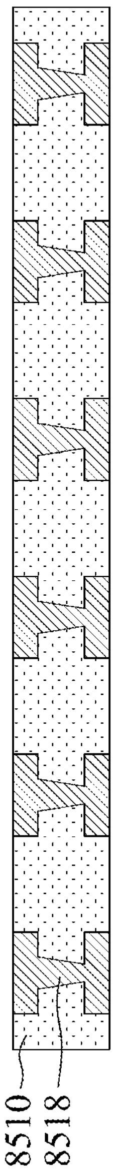
FIG. 8A, FIG. 8B, FIG. 8C, FIG. 8D, FIG. 8E, FIG. 8F, FIG. 8G, FIG. 8H, FIG. 8I, FIG. 8J, FIG. 8K and FIG. 8L illustrate a method of manufacturing a semiconductor device package in accordance with another embodiment of the instant disclosure.

Referring to FIG. 8A, a substrate 8510 is provided. The substrate 8510 may include an interconnection 8518.

Figure 8B:
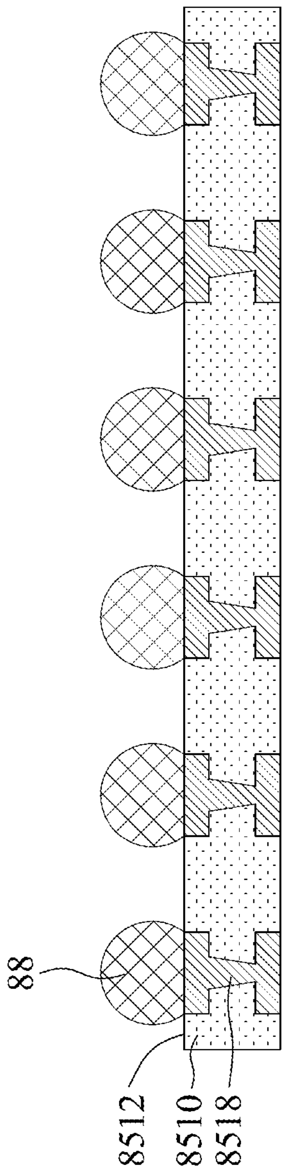

Referring to FIG. 8B, a plurality of electrical connections 88 are disposed or mounted on a surface 8512 of the substrate 8510. The electrical connections 88 may be electrically connected to the interconnection 8518 of the substrate 8510. In some embodiments of the present disclosure, the electrical connection 88 includes a solder ball.

Figure 8C:
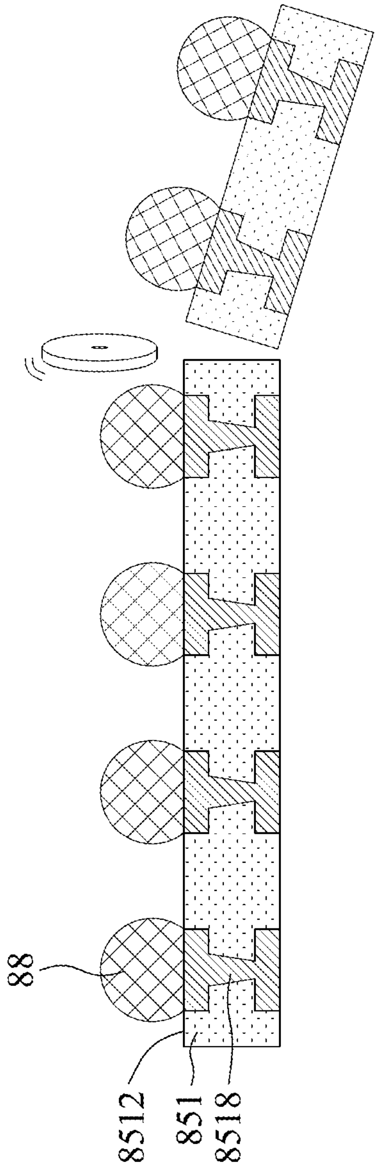

Referring to FIG. 8C, the substrate 8510 is cut, by e.g., laser or blade sawing technology to form an interposer 851 with the electrical connections 88.

Figure 8D:
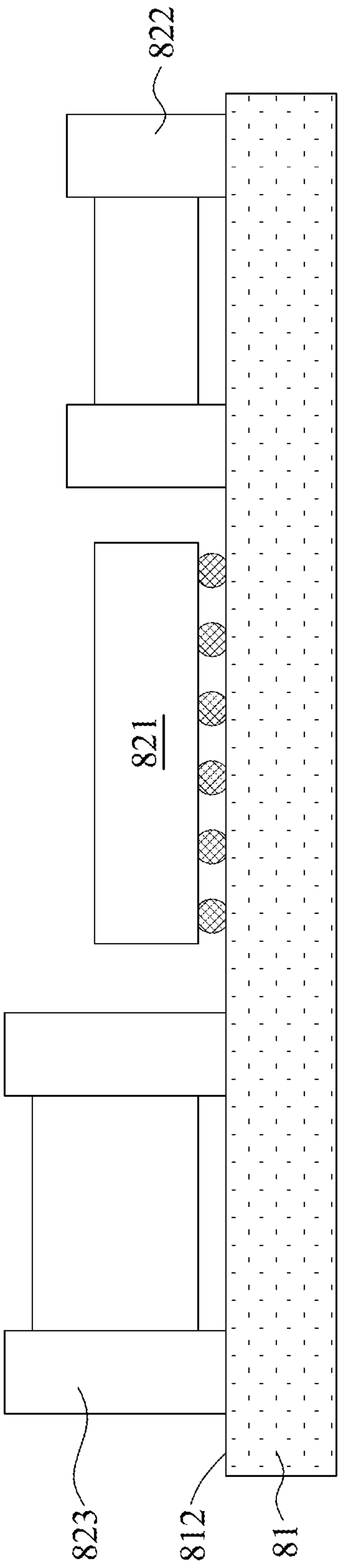

Referring to FIG. 8D, a carrier 81 and electronic components 821, 822 and 823 are provided. The electronic components 821, 822 and 823 are disposed or mounted on a surface 812 of the carrier 81. In some embodiments of the present disclosure, the carrier 81 includes a substrate. In some embodiments of the present disclosure, the electronic components 821, 822 and 823 include a die, an active device, a passive device, and/or other electronic devices. In some embodiments of the present disclosure, the electronic components 821, 822 and 823 electrically connects the carrier 81 via electrical connections.

Figure 8E:
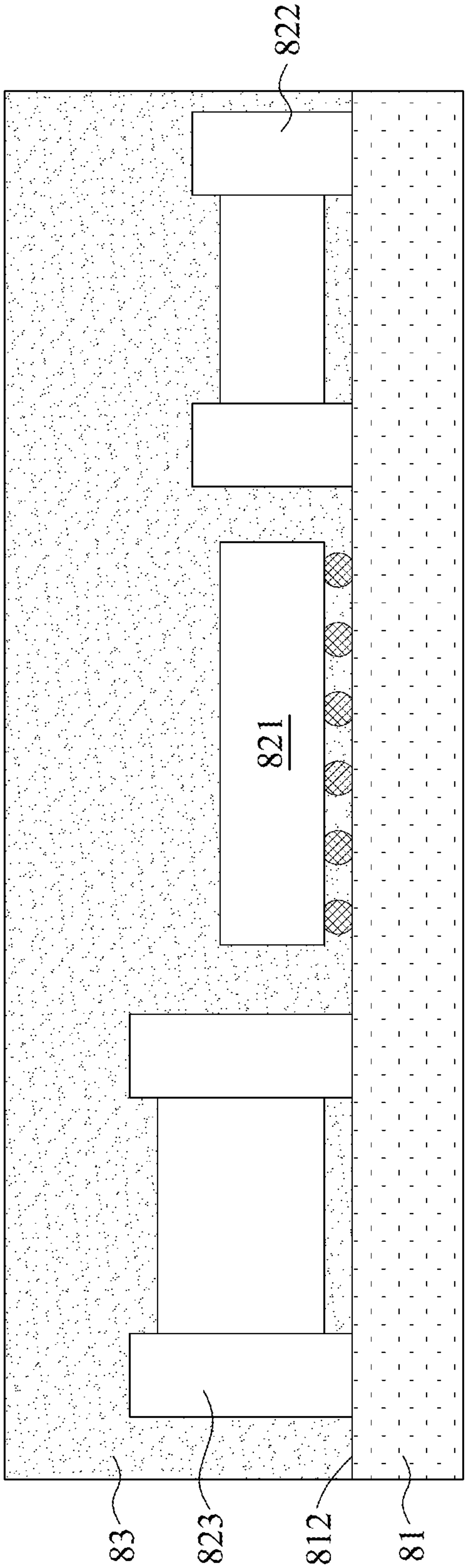

Referring to FIG. 8E, an encapsulant 83 is formed on the surface 812 of the carrier 81. The encapsulant 83 may cover the surface 812 and the electronic components 821, 822 and 823.

Figure 8F:
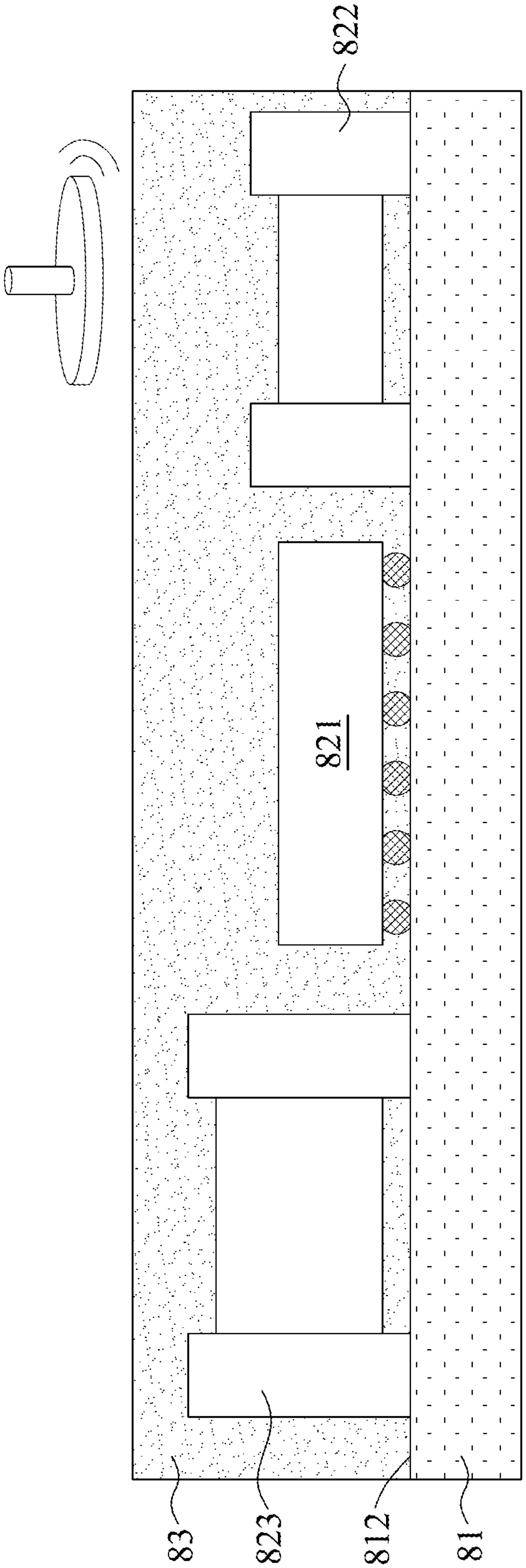

Referring to FIG. 8F, a (upper) portion of the encapsulant 83 is removed by, for example, a grinding operation, so that the upper surface of the encapsulant 83 could be planarized.

Figure 8G:
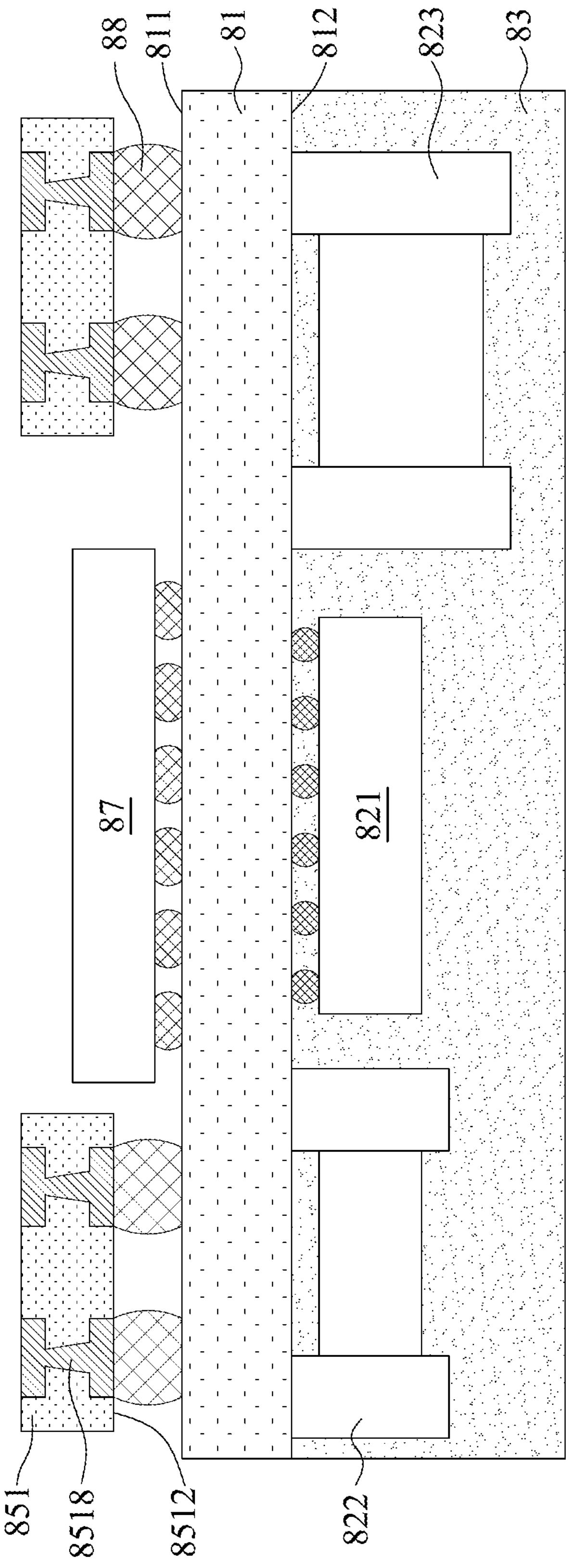

Referring to FIG. 8G, the interposers 851 and the electrical connections 88, which may be formed in the process as illustrated in FIGS. 8A, 8B and 8C, are disposed or mounted on a surface 811 of the carrier 81. The interposers 851 may be electrically connected to the carrier 81 via the electrical connections 88. Further, an electronic component 87 is disposed or mounted on a surface 811 of the carrier 81. The electronic component 87 may be an active component, such as an integrated circuit (IC) die or a chip. In some embodiments of the present disclosure, the electronic component 87 has an active side facing the surface 811 and electrically connects the main carrier 81 via electrical connections.

Figure 8H:
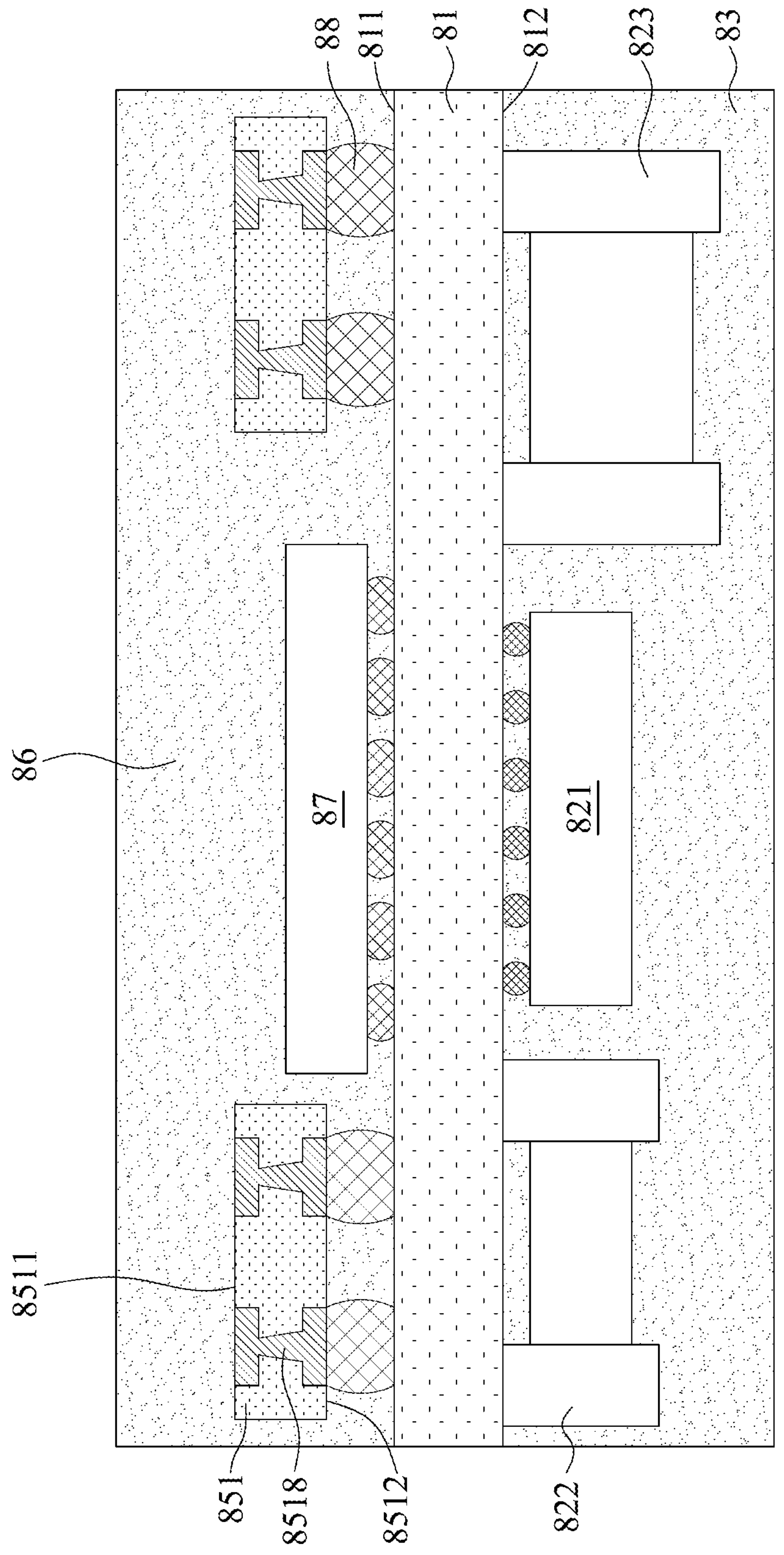

Referring to FIG. 8H, an encapsulant 86 is formed on the surface 811 of the carrier 81. The encapsulant 86 may cover the surface 811 and the interposer 851, the electrical connections 88 and the electronic component 87.

Figure 8I:
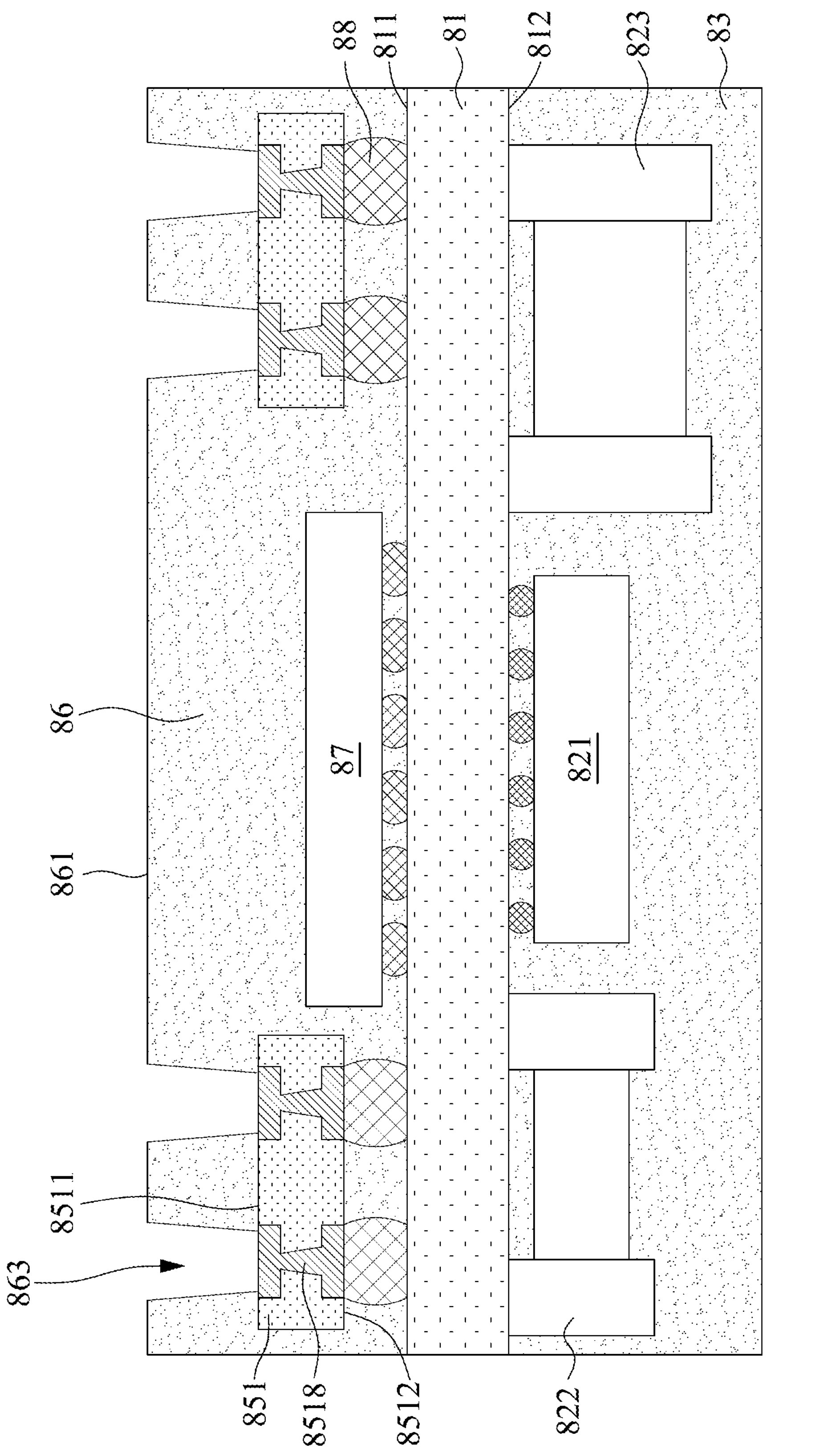

Referring to FIG. 8I, a plurality of openings 863 are formed in the encapsulant 86 by a laser process. The opening 863 extends from an upper surface 861 of the encapsulant 86 to the surface 8511 of the interposer 851.

Figure 8J:
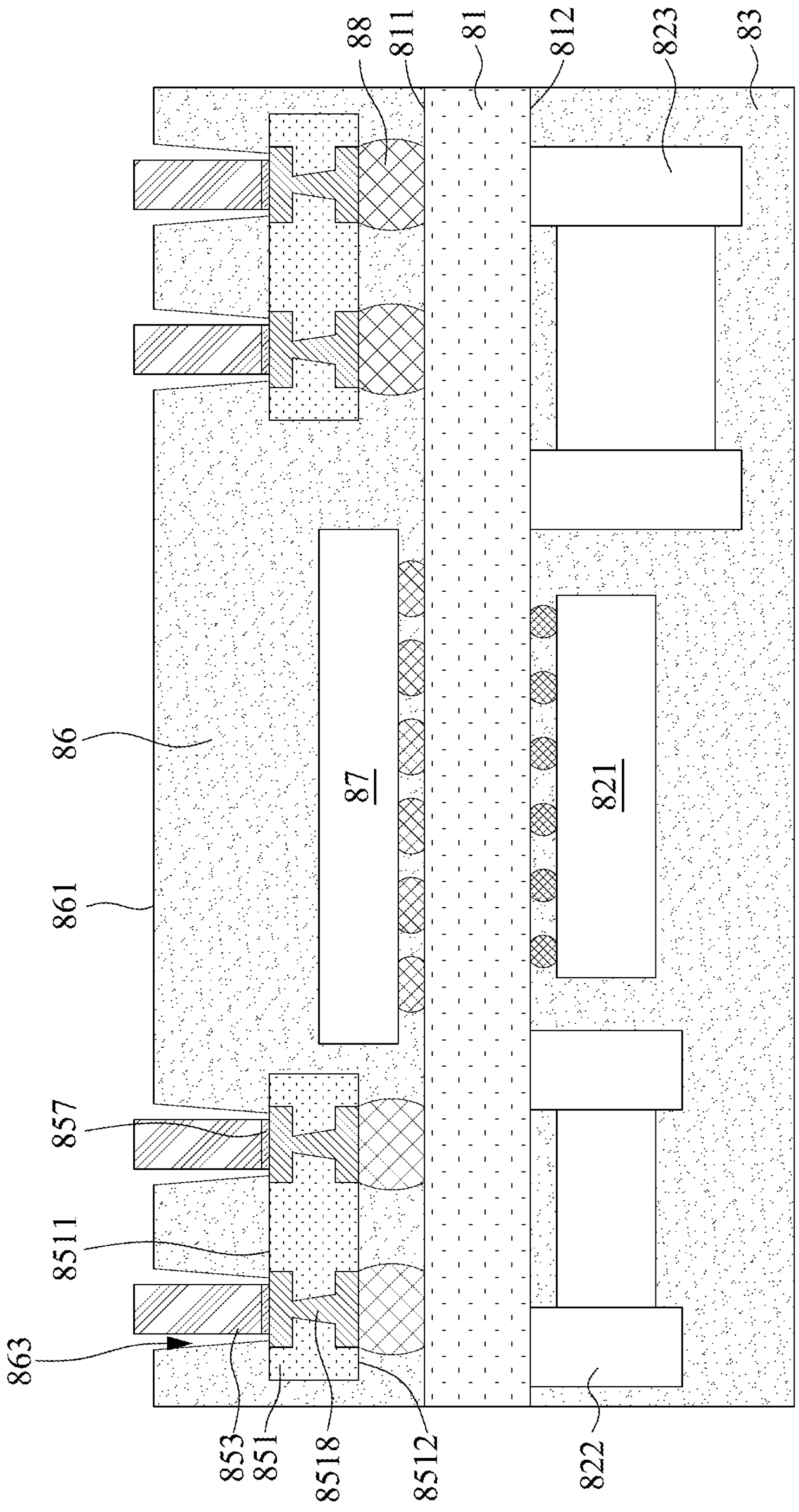

Referring to FIG. 8J, a plurality of conductive elements 853 are provided. The conductive elements 853 may be arranged within the opening 863 and disposed or mounted on a surface 8511 of the interposer 851 and electrically connected to the interconnection 8518 of the interposer 851. In some embodiments of the present disclosure, the conductive element 853 includes a copper pillar. In some embodiments of the present disclosure, a solder material 857 is arranged between the conductive element 853 and the interconnection 8518 of the interposer 851.

Figure 8K:
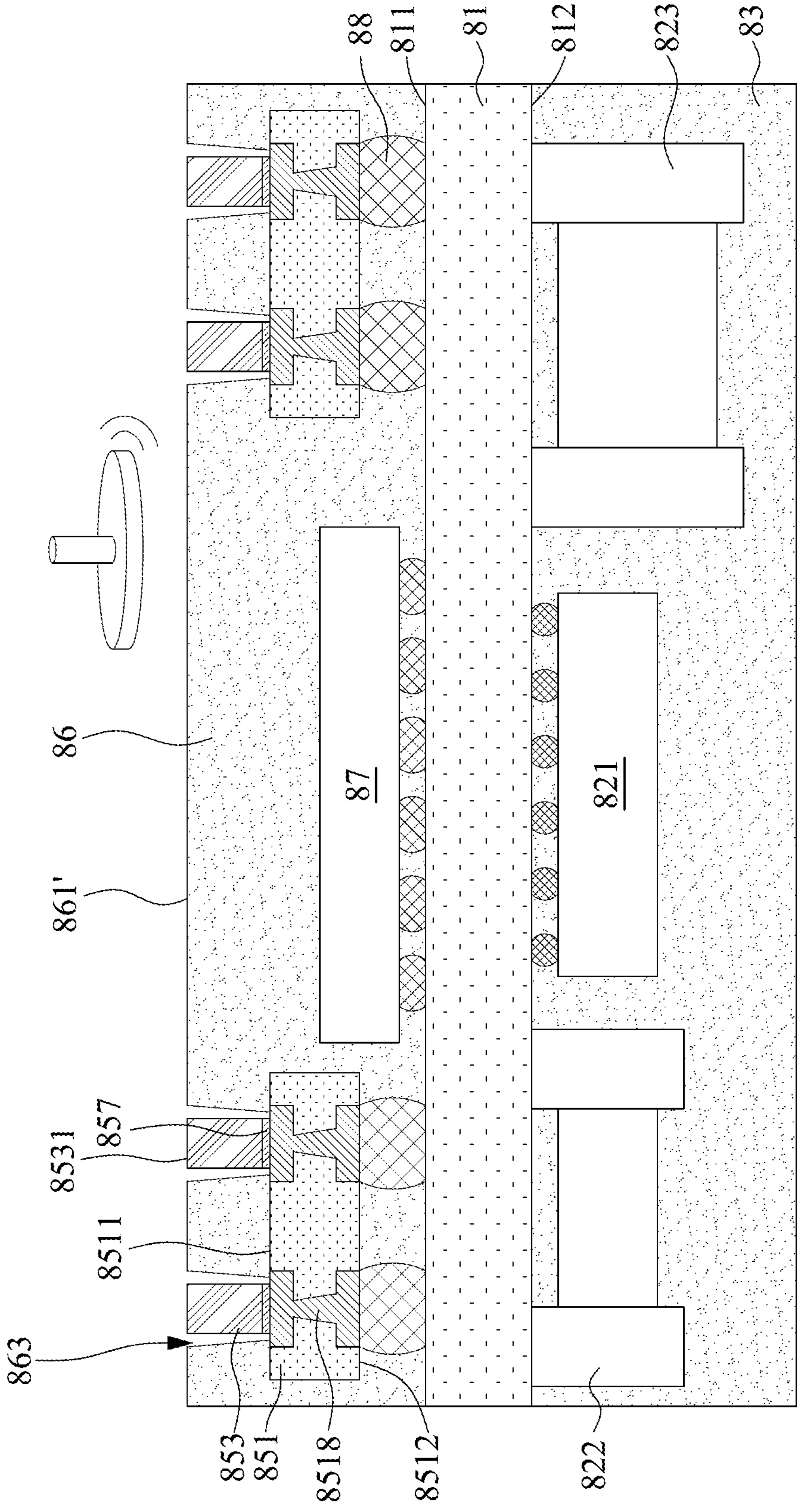

Referring to FIG. 8K, a (upper) portion of the encapsulant 86 and upper portions of the conductive elements 853 are removed by, for example, a grinding operation, so that the upper surface 861' of the encapsulant 86 and upper surfaces 8531 of the conductive elements 853 may be substantially level with each other.

Figure 8L:
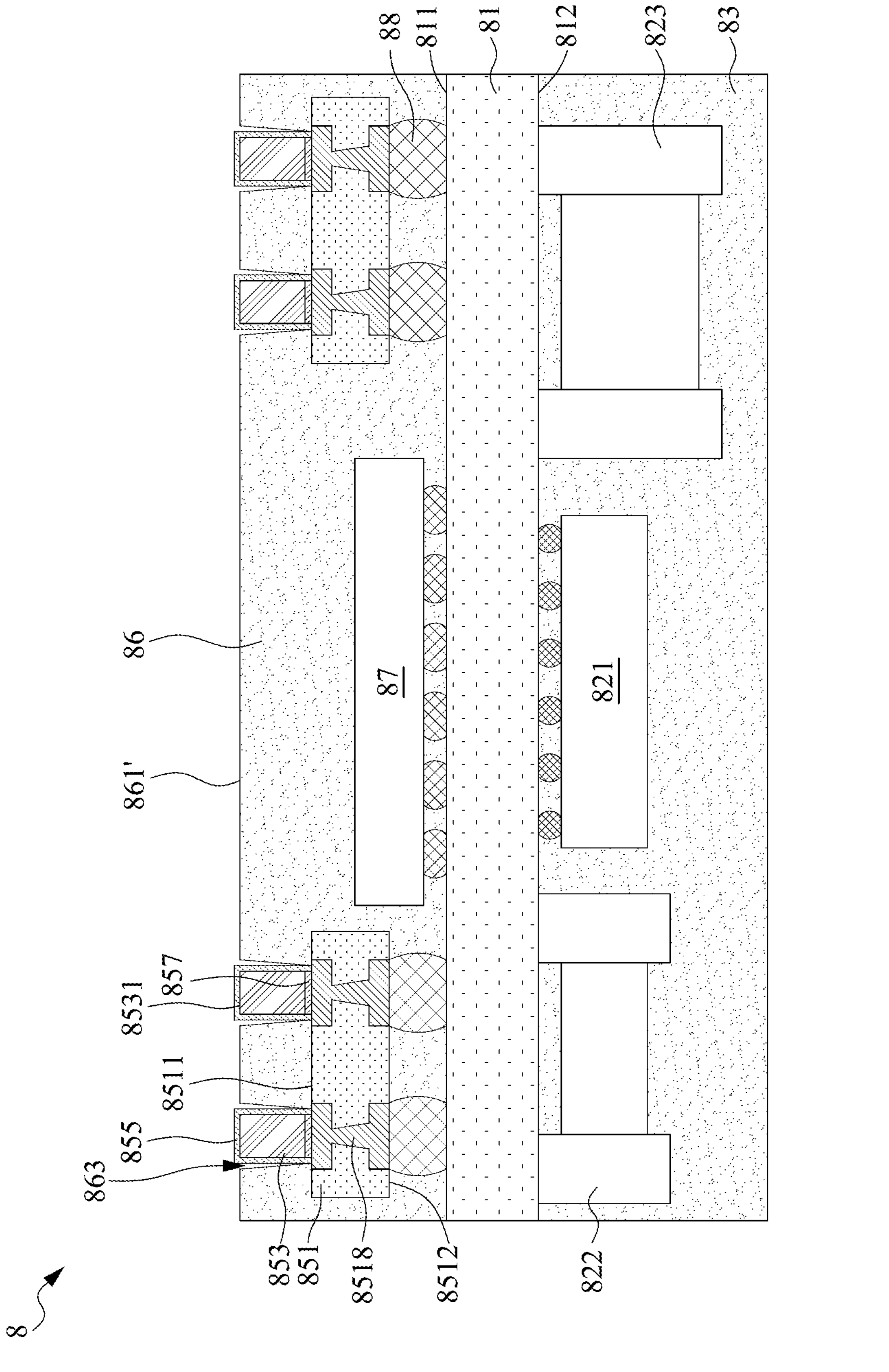

Referring to FIG. 8L, a finish layer 855 is provided on the conductive element 853. The finish layer 855 is configured to cover or encapsulate the portion of the conductive element 853. In some embodiments of the present disclosure, the finish layer 855 includes electroless nickel immersion gold (ENIG). In some embodiments of the present disclosure, the finish layer 855 includes pre-solder.

After the manufacturing process as shown in FIG. 8A, FIG. 8B, FIG. 8C, FIG. 8D, FIG. 8E, FIG. 8F, FIG. 8G, FIG. 8H, FIG. 8I, FIG. 8J, FIG. 8K and FIG. 8L, the semiconductor device package 8 is formed (see FIG. 8L). In some embodiments of the present disclosure, the semiconductor device package 8 is the same as, or similar to, the semiconductor device package 4 shown in FIG. 4A.

FIG. 9A, FIG. 9B, FIG. 9C, FIG. 9D, FIG. 9E, FIG. 9F, FIG. 9G, FIG. 9H, FIG. 9I, FIG. 9J, FIG. 9K and FIG. 9L illustrate a method of manufacturing a semiconductor device package in accordance with another embodiment of the instant disclosure.

Figure 9A:
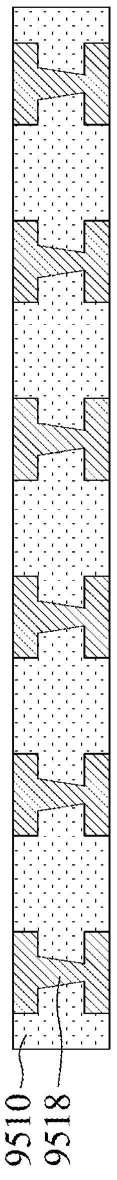
FIG. 9A, FIG. 9B, FIG. 9C, FIG. 9D, FIG. 9E, FIG. 9F, FIG. 9G, FIG. 9H, FIG. 9I, FIG. 9J, FIG. 9K and FIG. 9L illustrate a method of manufacturing a semiconductor device package in accordance with another embodiment of the instant disclosure.

Referring to FIG. 9A, a substrate 9510 is provided. The substrate 9510 may include an interconnection 9518.

Figure 9B:
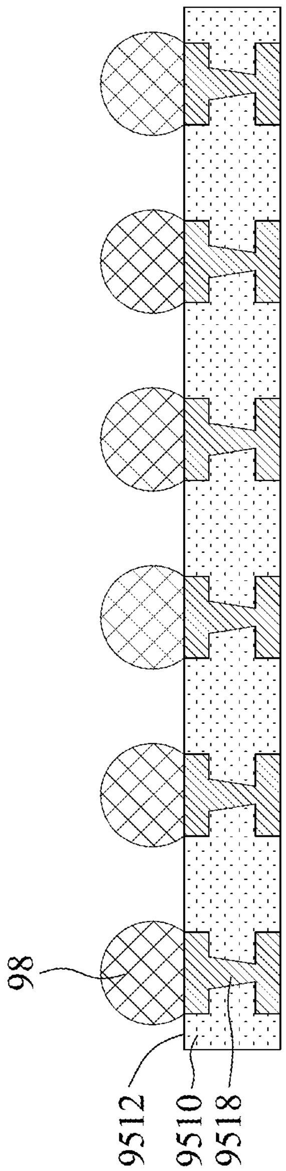

Referring to FIG. 9B, a plurality of electrical connections 98 are disposed or mounted on a surface 9512 of the substrate 9510. The electrical connections 98 may be electrically connected to the interconnection 9518 of the substrate 9510. In some embodiments of the present disclosure, the electrical connection 98 includes a solder ball.

Figure 9C:
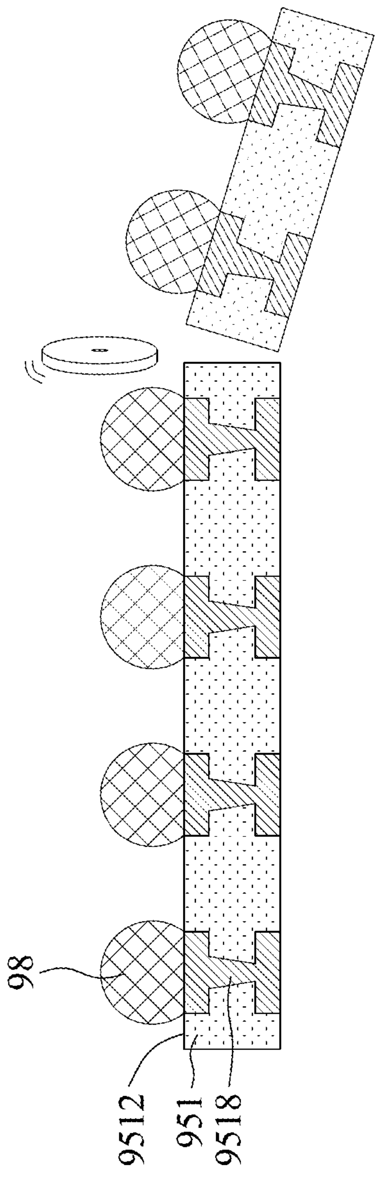

Referring to FIG. 9C, the substrate 9510 is cut, by e.g., laser or blade sawing technology to form an interposer 951 with the electrical connections 88.

Figure 9D:
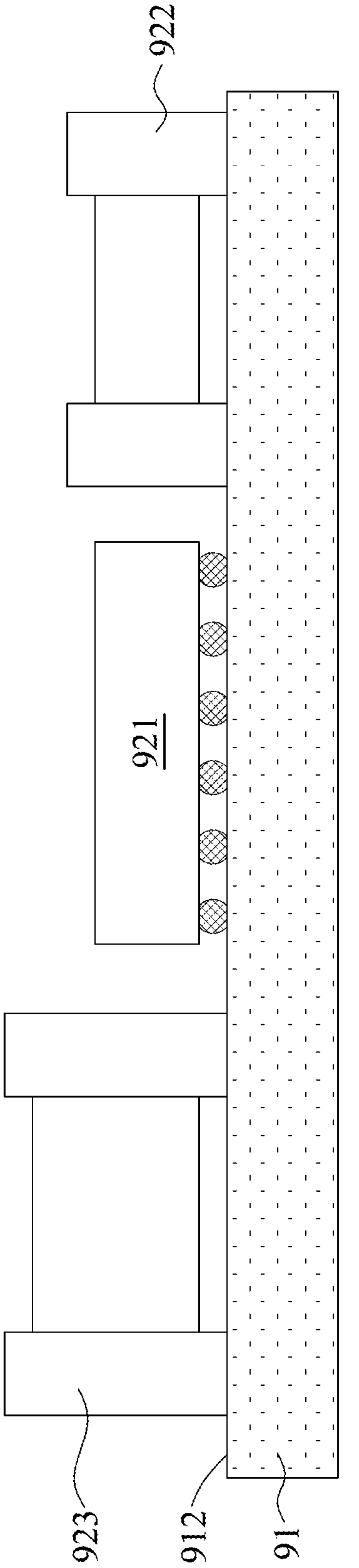

Referring to FIG. 9D, a carrier 81 and electronic components 921, 922 and 923 are provided. The electronic components 921, 922 and 923 are disposed or mounted on a surface 912 of the carrier 91. In some embodiments of the present disclosure, the carrier 91 includes a substrate. In some embodiments of the present disclosure, the electronic components 921, 922 and 923 include a die, an active device, a passive device, and/or other electronic devices. In some embodiments of the present disclosure, the electronic components 921, 922 and 923 electrically connects the carrier 91 via electrical connections.

Figure 9E:
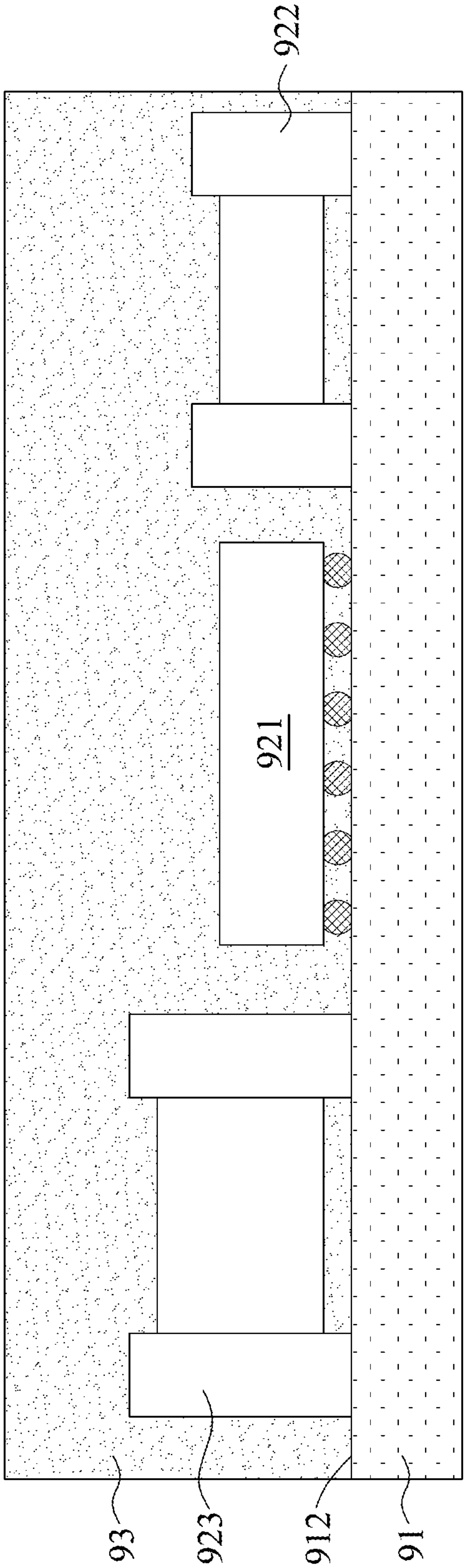

Referring to FIG. 9E, an encapsulant 93 is formed on the surface 912 of the carrier 91. The encapsulant 93 may cover the surface 912 and the electronic components 921, 922 and 923.

Figure 9F:
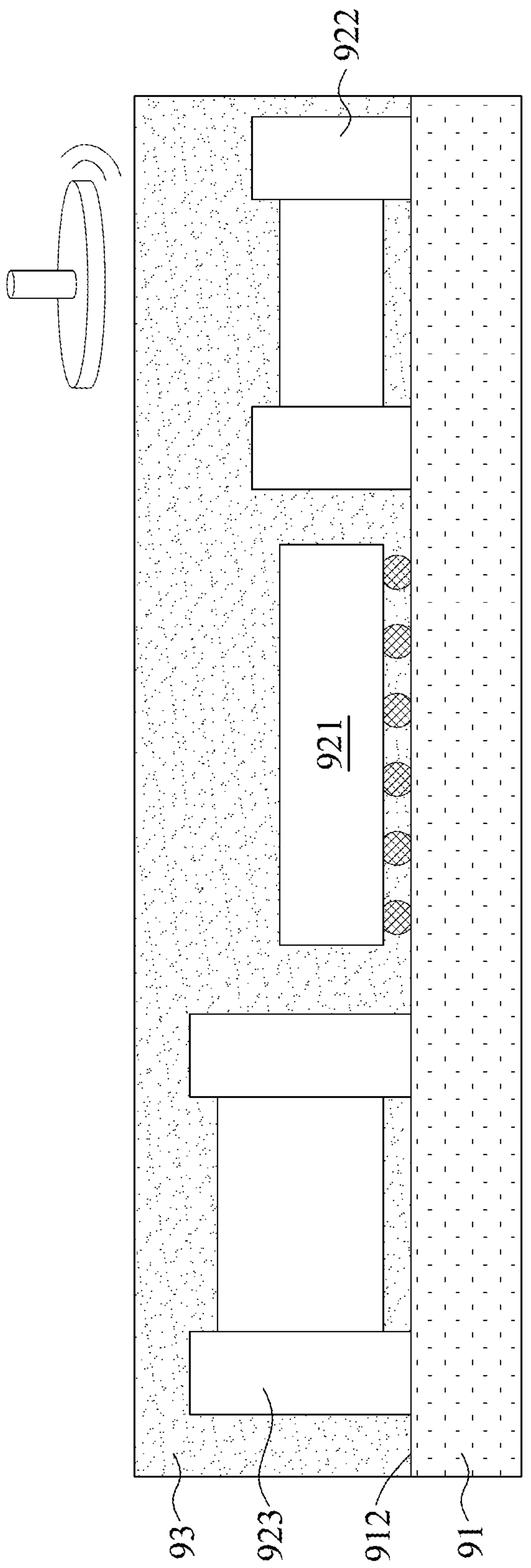

Referring to FIG. 9F, a (upper) portion of the encapsulant 93 is removed by, for example, a grinding operation, so that the upper surface of the encapsulant 93 could be planarized.

Figure 9G:
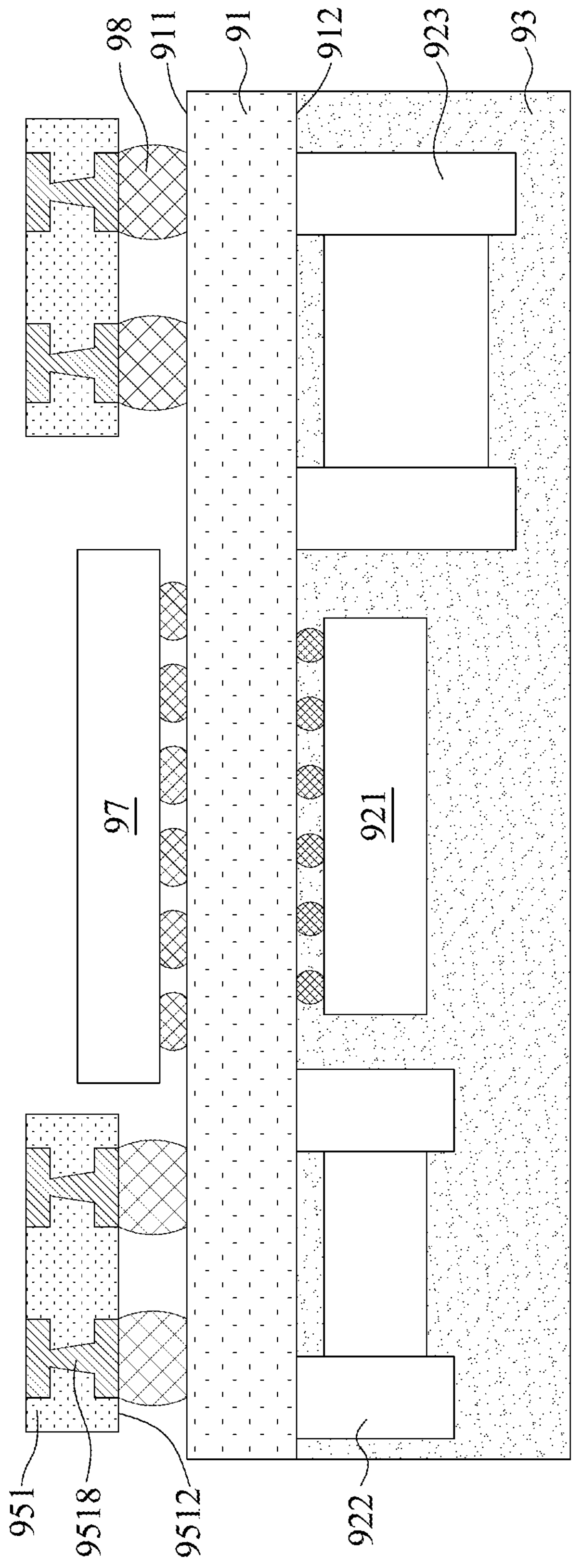

Referring to FIG. 9G, the interposers 951 and the electrical connections 98, which may be formed in the process as illustrated in FIGS. 9A, 9B and 9C, are disposed or mounted on a surface 911 of the carrier 91. The interposers 951 may be electrically connected to the carrier 91 via the electrical connections 98. Further, an electronic component 97 is disposed or mounted on a surface 911 of the carrier 91. The electronic component 97 may be an active component, such as an integrated circuit (IC) die or a chip. In some embodiments of the present disclosure, the electronic component 97 has an active side facing the surface 911 and electrically connects the main carrier 91 via electrical connections.

Figure 9H:
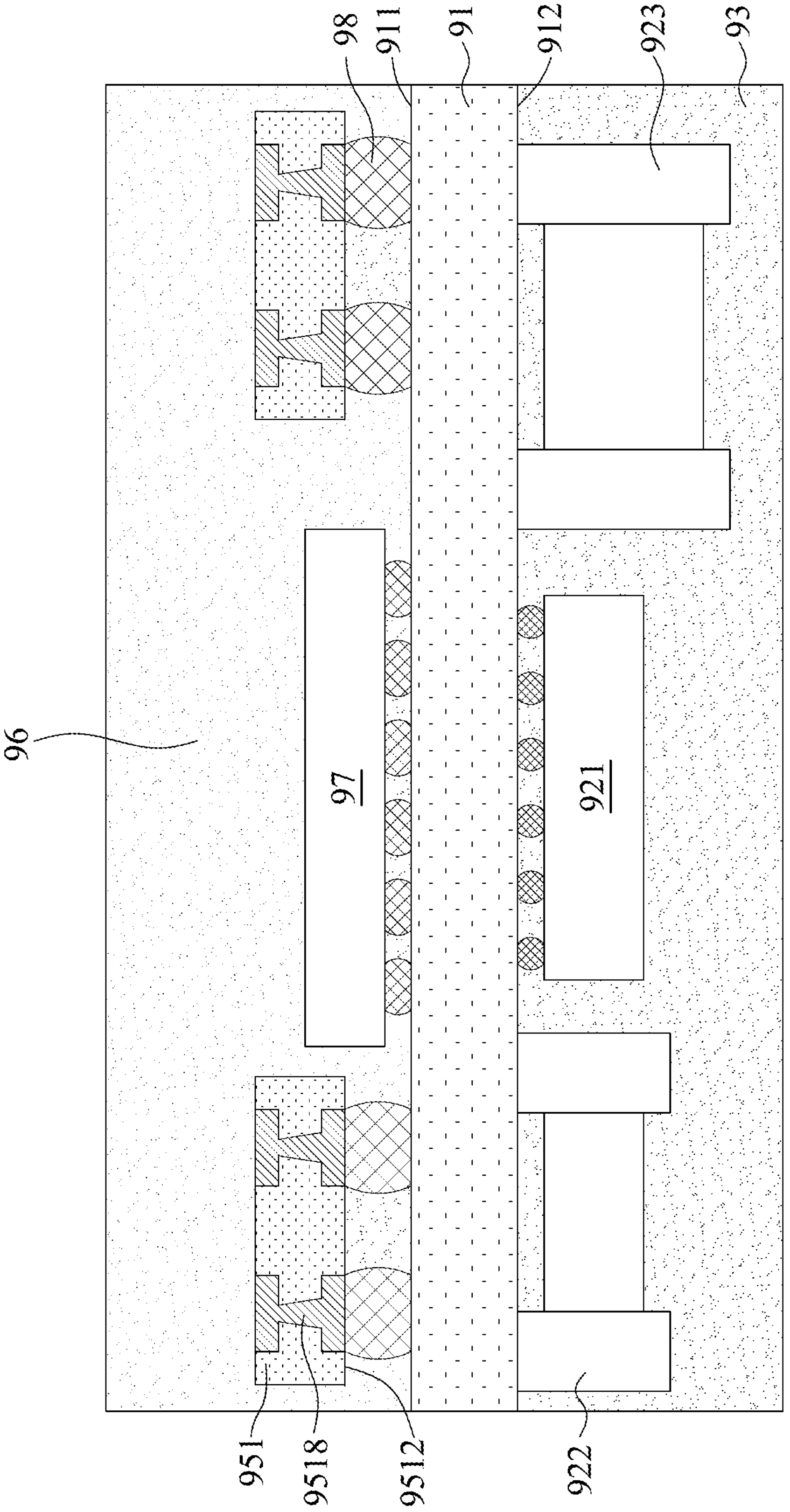

Referring to FIG. 9H, an encapsulant 96 is formed on the surface 911 of the carrier 91. The encapsulant 96 may cover the surface 911 and the interposer 951, the electrical connections 98 and the electronic component 97.

Figure 9I:
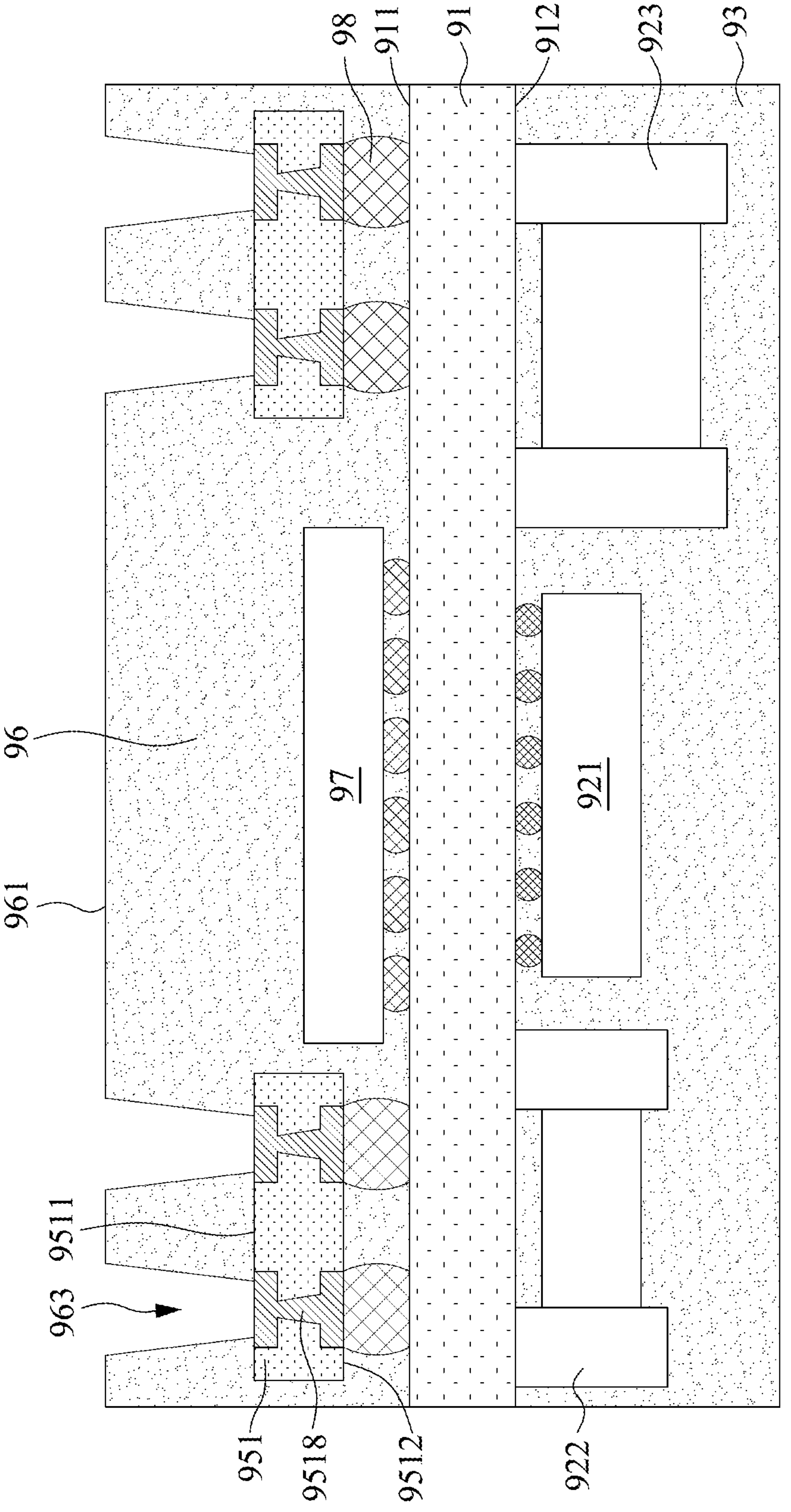

Referring to FIG. 9I, a plurality of openings 963 are formed in the encapsulant 96 by a laser process. The opening 963 extends from an upper surface 961 of the encapsulant 96 to the surface 9511 of the interposer 951.

Figure 9J:
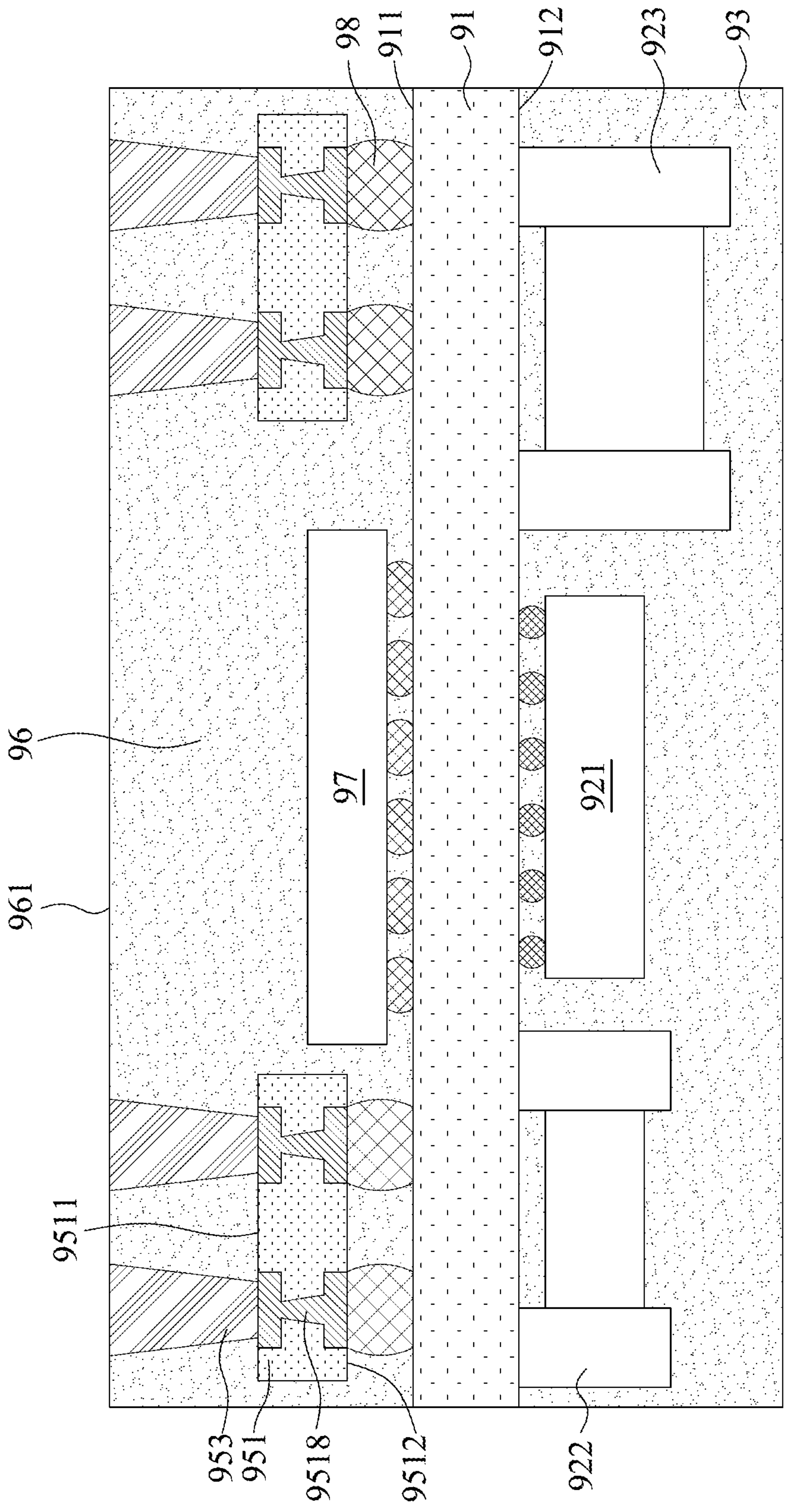

Referring to FIG. 9J, a plurality of conductive elements 953 are formed within the openings 963 and the surface 9511 of the interposer 951 by, for example, plating. The conductive element 953 may be electrically connected to the interconnection 9518 of the interposer 951. In some embodiments of the present disclosure, the conductive element 953 includes a copper pillar. In some embodiments of the present disclosure, a seed layer is provided between the conductive element 953 and the encapsulant 96 and between the conductive element 953 and the interposer 951.

Figure 9K:
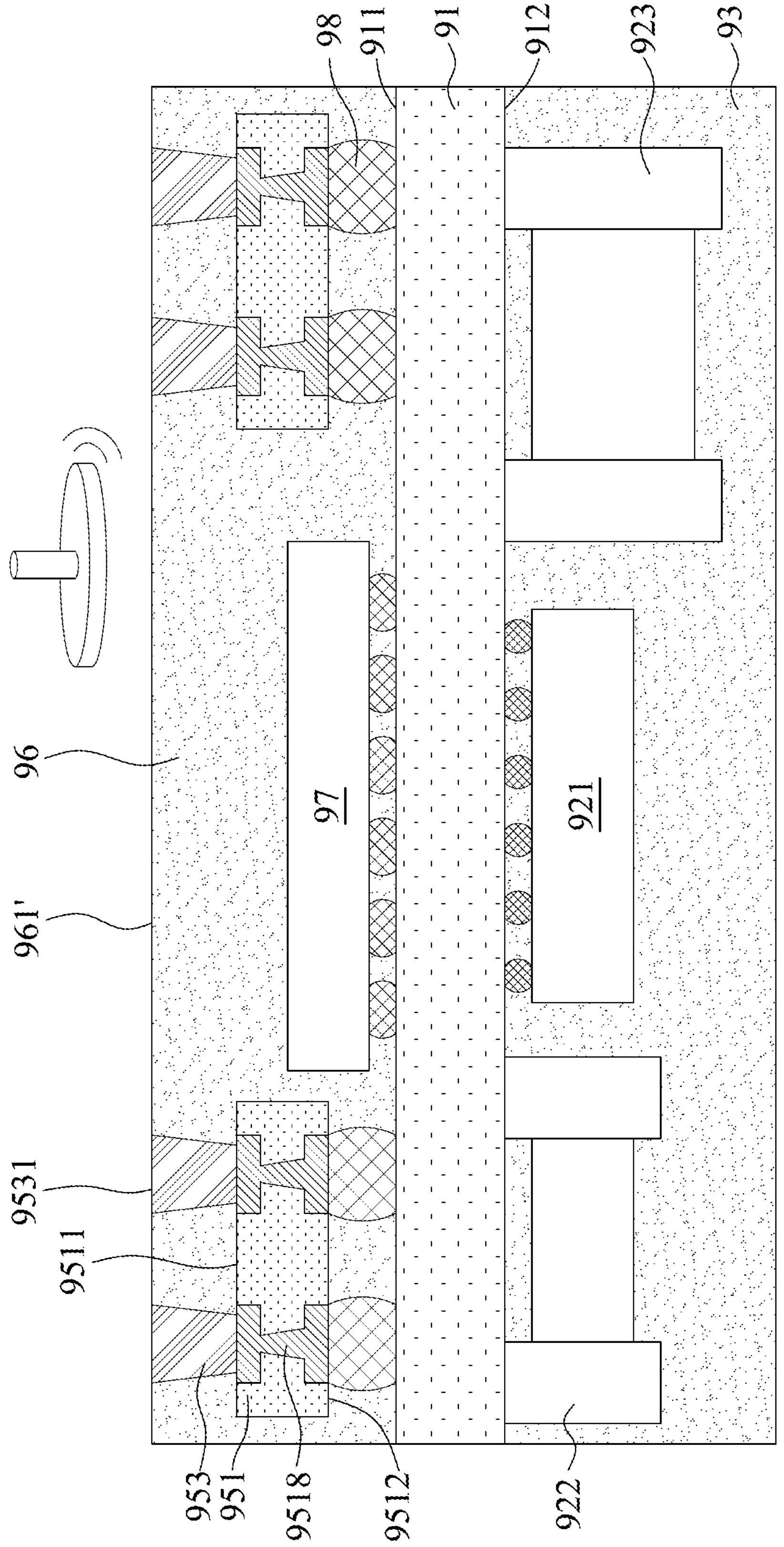

Referring to FIG. 9K, a (upper) portion of the encapsulant 96 and upper portions of the conductive elements 953 are removed by, for example, a grinding operation, so that the upper surface 961' of the encapsulant 96 and upper surfaces 9531 of the conductive elements 953 may be substantially level with each other.

Figure 9L:
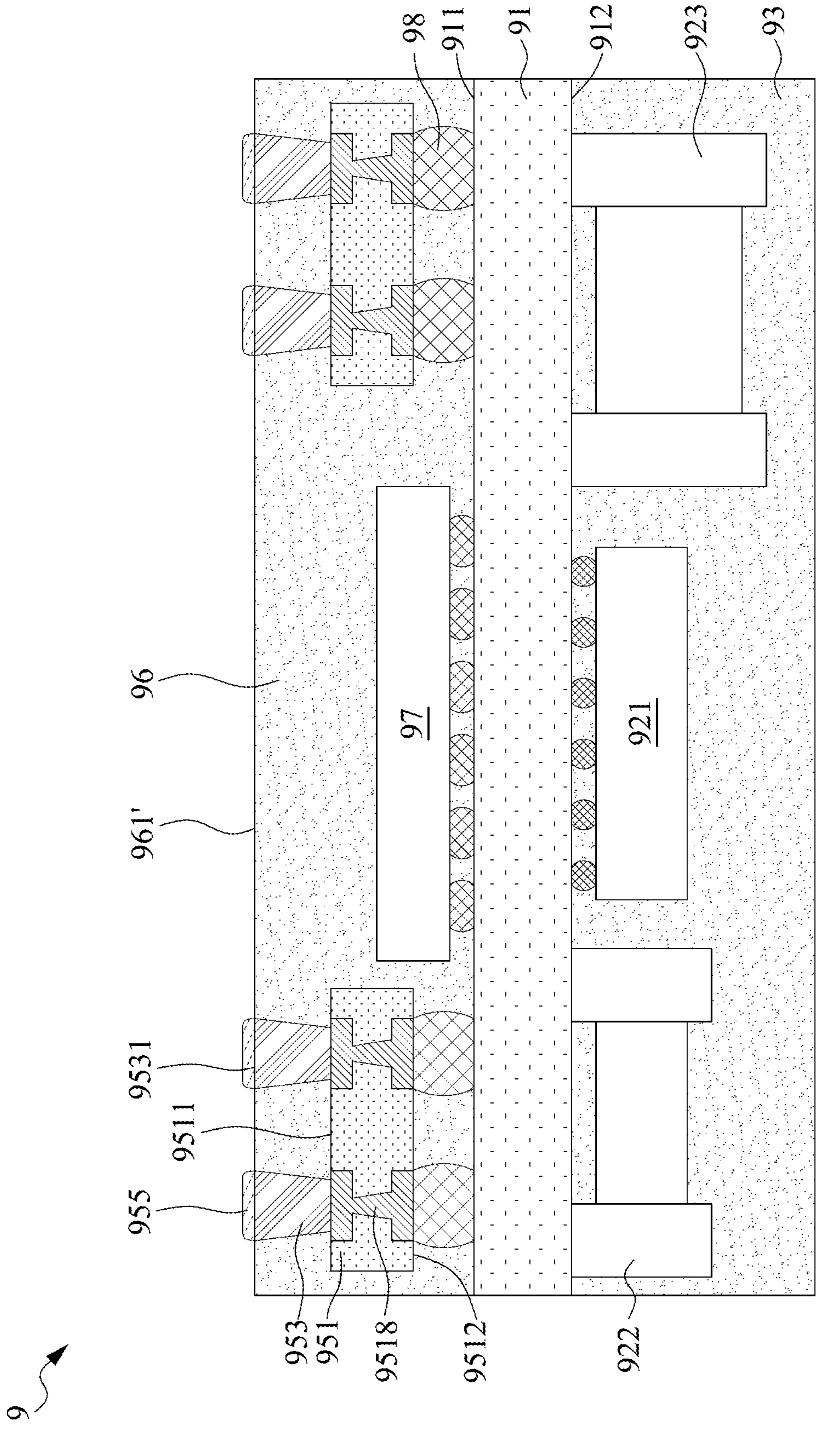

Referring to FIG. 9L, a finish layer 955 is provided on the upper surface 9531 the conductive element 953. The finish layer 955 is configured to cover or encapsulate the portion of the conductive element 953 which is exposed from the encapsulant 96. In some embodiments of the present disclosure, the finish layer 955 includes electroless nickel immersion gold (ENIG). In some embodiments of the present disclosure, the finish layer 955 includes pre-solder.

After the manufacturing process as shown in FIG. 9A, FIG. 9B, FIG. 9C, FIG. 9D, FIG. 9E, FIG. 9F, FIG. 9G, FIG. 9H, FIG. 9I, FIG. 9J, FIG. 9K and FIG. 9L, the semiconductor device package 9 is formed (see FIG. 9L). In some embodiments of the present disclosure, the semiconductor device package 9 is the same as, or similar to, the semiconductor device package 5 shown in FIG. 5A.

Figure 10:
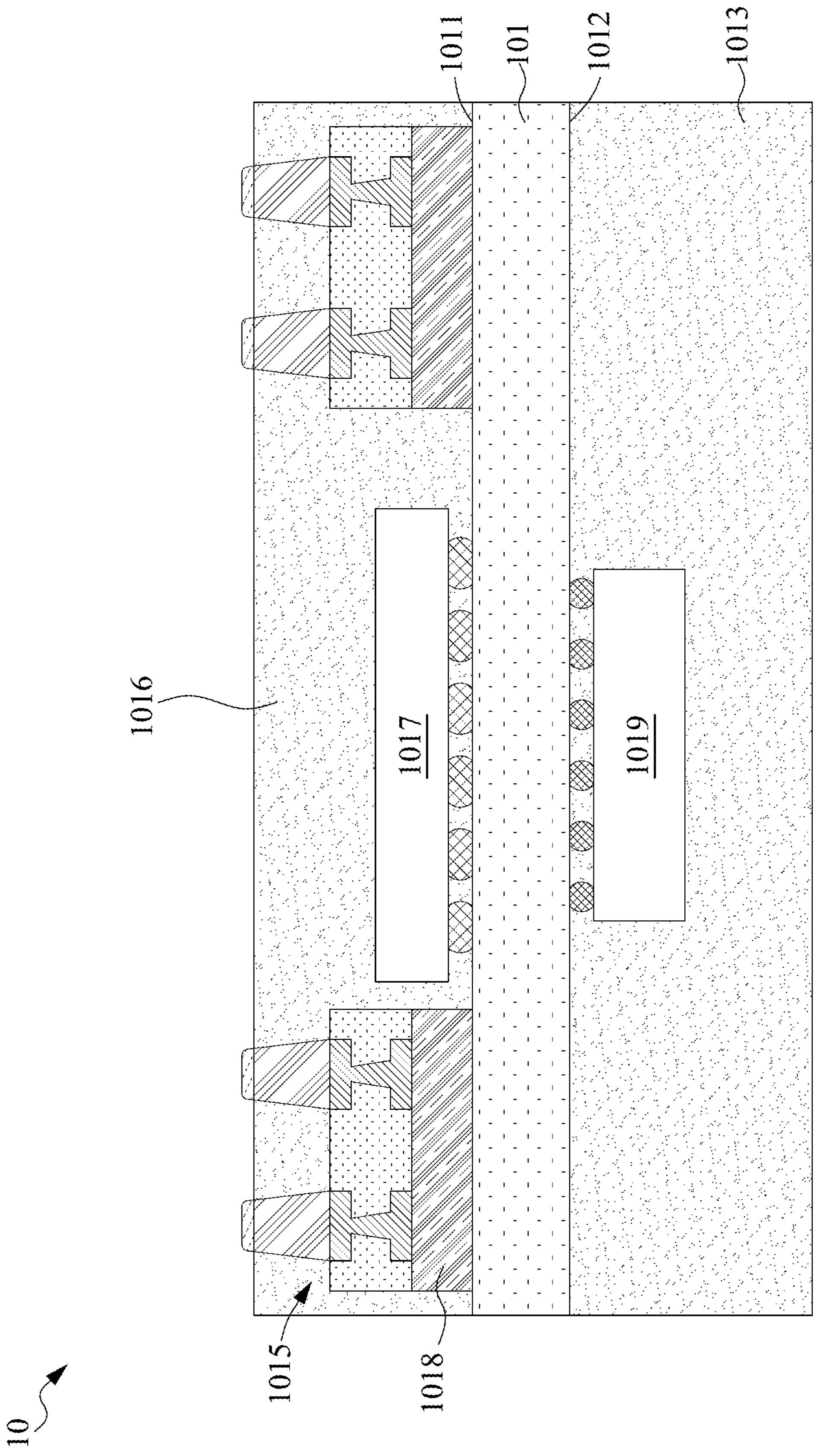
FIG. 10 is a cross-sectional view of a semiconductor device package in accordance with an embodiment of the instant disclosure.

FIG. 10 is a cross-sectional view of a semiconductor device package 10 in accordance with some embodiments of the present disclosure. As shown in FIG. 10, the semiconductor device 10 includes a double side module (DSM). The semiconductor device 10 includes a carrier 101, electronic components 1017, 1019, intermediate structures 1015 and encapsulants 1013 and 1016. The electronic device 1017 may be disposed or mounted on the surface 1011 of the carrier 101. Moreover, the electronic component 1017 may be an active component, such as an integrated circuit (IC) die or a chip. The electronic component 1019 may be disposed or mounted on the surface 1012 of the carrier 101.

The electronic component 1019 may be a die, an active device, a passive device, and/or other electronic devices. The intermediate structure 1015 is disposed over the surface 1011 of the carrier 101. In some embodiments of the present disclosure, the intermediate structure 1015 is the same as, or similar to, the intermediate structure 25 shown in FIGS. 2A, 2B and 2C, the intermediate structure 35 shown in FIGS. 3A, 3B and 3C, the intermediate structure 45 shown in FIGS. 4A, 4B and 4C or the intermediate structure 55 shown in FIGS. 5A, 5B and 5C. The intermediate structure 1015 may be mounted on the surface 1011 of the carrier and electrically connected to the carrier through a conductive adhesion 1018. In some embodiments of the present disclosure, the conductive adhesion 1018 may include an Ajinomoto Buildup Film (ABF).

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0°) that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An electronic device, comprising:

a substrate having an upper surface;

an electronic component disposed over the upper surface of the substrate;

an intermediate structure disposed over the upper surface of the substrate and comprising an interposer and a first conductive element over the interposer;

a protective layer disposed over the upper surface of the substrate and encapsulating the electronic component and having an upper surface substantially level with an upper surface of the first conductive element;

wherein the upper surface of the first conductive element comprises a first portion adjacent to the protective layer, wherein the first portion is substantially level with the upper surface of the protective layer, and wherein the first portion extends laterally beyond a lateral side of the first conductive element and vertically covers the protective layer to produce a mold lock;

wherein the upper surface of the first conductive element further comprises a second portion; and wherein the second portion of the upper surface of the first conductive element is recessed below the upper surface of the protective layer with respect to the first portion of the upper surface of the first conductive element; and a finish layer disposed over the upper surface of the first conductive element, wherein the finish layer entirely covers the first portion and the second portion of the upper surface of the first conductive element and fills a recess defined by the second portion of the upper surface of the first conductive element.

2. The electronic device of claim 1, wherein the lateral side of the first conductive element is tapered such that the lateral side slopes inward from a lower surface of the first conductive element adjacent to the interposer toward the upper surface of the first conductive element, and wherein the first portion of the upper surface of the first conductive element extends laterally beyond the inwardly-sloped lateral side from a top view perspective.

3. The electronic device of claim 1, wherein the first conductive element comprises a copper pillar of a non-reflowable material, and the intermediate structure further comprises a plurality of reflowable solder balls disposed between a lower surface of the interposer and the upper surface of the substrate, the interposer being mounted to the upper surface of the substrate via the reflowable solder balls.

4. The electronic device of claim 3, wherein a height of the copper pillar is greater than a height of each of the reflowable solder balls, and wherein an electrical conductivity of the copper pillar is greater than an electrical conductivity of each of the reflowable solder balls.

5. The electronic device of claim 1, wherein the interposer comprises:

a first conductive pad adjacent to an upper surface of the interposer and in direct contact with a lower surface of the first conductive element;

a second conductive pad adjacent to a lower surface of the interposer; and a conductive via extending through the interposer between the first conductive pad and the second conductive pad and electrically connecting the first conductive pad to the second conductive pad.

6. The electronic device of claim 1, wherein an upper surface of the interposer is positioned at a level higher than an upper surface of the electronic component, and wherein a lower surface of the first conductive element is positioned at a level higher than the upper surface of the electronic component.

7. The electronic device of claim 1, wherein the intermediate structure comprises a plurality of first conductive elements arranged in a spaced manner over the interposer, and wherein a distance between adjacent first conductive elements increases from an upper surface of the interposer toward the upper surface of the protective layer.

8. The electronic device of claim 1, further comprising:

a second protective layer disposed below a lower surface of the substrate; and at least one additional electronic component disposed on the lower surface of the substrate and encapsulated by the second protective layer, wherein the at least one additional electronic component comprises a capacitor.

9. The electronic device of claim 1, wherein the finish layer comprises a two-layer electroless nickel immersion gold (ENIG) metal stack comprising: a nickel layer that directly abuts and is in contact with the upper surface of the first conductive element; and a gold layer disposed on and covering the nickel layer.

10. The electronic device of claim 9, wherein the finish layer further comprises a lateral extension that extends laterally beyond the lateral side of the first conductive element and covers the upper surface of the protective layer.

11. An electronic device, comprising:

a substrate having an upper surface;

an electronic component disposed over the upper surface of the substrate;

an intermediate structure disposed over the upper surface of the substrate and comprising an interposer and a first conductive element over the interposer;

a protective layer disposed over the upper surface of the substrate and encapsulating the electronic component and having an upper surface substantially level with an upper surface of the first conductive element; and a solder ball with a height less than a height of the first conductive element, wherein the first conductive element has a higher electrical conductivity than the solder ball;

wherein the upper surface of the first conductive element comprises a first portion adjacent to the protective layer, wherein the first portion is substantially level with the upper surface of the protective layer, and wherein the first portion vertically covers the protective layer to produce a mold lock.

12. The electronic device of claim 11, wherein the first conductive element comprises a non-reflowable copper pillar, and the solder ball comprises a reflowable solder material.

13. The electronic device of claim 11, wherein the solder ball is disposed between a lower surface of the interposer and the upper surface of the substrate, and the interposer is mounted to the substrate via the solder ball.

14. The electronic device of claim 11, wherein the interposer comprises:

a first conductive pad adjacent to an upper surface of the interposer and in direct contact with a lower surface of the first conductive element;

a second conductive pad adjacent to a lower surface of the interposer and in direct contact with the solder ball; and a conductive via extending through the interposer between the first conductive pad and the second conductive pad and electrically connecting the first conductive pad to the second conductive pad.

15. The electronic device of claim 11, wherein a lateral side of the first conductive element is tapered such that the lateral side slopes inward from a lower surface of the first conductive element adjacent to the interposer toward the upper surface of the first conductive element, and wherein the first portion of the upper surface of the first conductive element extends laterally beyond the inwardly-sloped lateral side of the first conductive element from a top view perspective.

16. The electronic device of claim 11, wherein the upper surface of the first conductive element further comprises a second portion, and wherein the second portion of the upper surface of the first conductive element is recessed below the upper surface of the protective layer with respect to the first portion of the upper surface of the first conductive element.

17. The electronic device of claim 12, further comprising a finish layer disposed on the upper surface of the first conductive element, wherein the finish layer comprises a two-layer electroless nickel immersion gold (ENIG) metal stack comprising: a nickel layer that directly abuts and is in contact with the upper surface of the first conductive element; and a gold layer disposed on and covering the nickel layer.

18. The electronic device of claim 17, wherein the finish layer further comprises a lateral extension that extends laterally beyond an outer edge of the first conductive element and partially covers the upper surface of the protective layer.

19. The electronic device of claim 11, wherein an upper surface of the interposer is positioned at a level higher than an upper surface of the electronic component, and wherein a lower surface of the first conductive element is positioned at a level higher than the upper surface of the electronic component.

20. The electronic device of claim 11, further comprising:

a second protective layer disposed below a lower surface of the substrate; and at least one additional electronic component disposed on the lower surface of the substrate and encapsulated by the second protective layer, wherein the at least one additional electronic component comprises a capacitor.

* * * * *